(12) United States Patent
Hidaka

(10) Patent No.: US 6,972,991 B2
(45) Date of Patent: Dec. 6, 2005

(54) THIN FILM MAGNETIC MEMORY DEVICE SUPPRESSING INTERNAL MAGNETIC NOISES

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/959,423

(22) Filed: Oct. 7, 2004

(65) Prior Publication Data

US 2005/0052929 A1 Mar. 10, 2005

Related U.S. Application Data

(63) Continuation of application No. 10/327,888, filed on Dec. 26, 2002, now Pat. No. 6,856,538.

(30) Foreign Application Priority Data

Jun. 27, 2002 (JP) .............................. 2002-187946

(51) Int. Cl.$^7$ .............................................. G11C 11/14
(52) U.S. Cl. ..................................... 365/171; 365/158
(58) Field of Search .................................. 365/171, 158

(56) References Cited

U.S. PATENT DOCUMENTS

| | | | |
|---|---|---|---|
| 5,504,699 A | | 4/1996 | Goller et al. |
| 6,349,054 B1 * | | 2/2002 | Hidaka ........................ 365/173 |
| 6,479,848 B2 * | | 11/2002 | Park et al. ................... 257/295 |
| 6,501,679 B2 * | | 12/2002 | Hidaka ........................ 365/173 |
| 6,545,900 B2 * | | 4/2003 | Bohm et al. .................. 365/97 |
| 6,795,335 B2 * | | 9/2004 | Hidaka ........................ 365/158 |
| 6,873,561 B2 * | | 3/2005 | Ooishi ......................... 365/226 |
| 2002/0172068 A1 | | 11/2002 | Hidaka |
| 2003/0174536 A1 | | 9/2003 | Hidaka |

FOREIGN PATENT DOCUMENTS

EP        1202284        5/2002

OTHER PUBLICATIONS

Scheuerlein et al., "A 10ns Read and Write Non-Volatile Memory Array Using a Magnetic Tunnel Junction and FET Switch in Each Cell", ISSCC Digest of Technical Papers, TA7.2, Feb. 2000, pp. 94-95, 128-129, 409-410.
Durlam et al., "Nonvolatile RAM Based on Magnetic Tunnel Junction Elements", ISSCC Digest of Technical Papers, TA7.3, Feb. 2000, pp. 96-97, 130-131, 410-411.
Naji et al., "A 256kb 3.0V 1T 1MTJ Nonvolatile Magneforesistive RAM", ISCCC Digest of Technical Papers, TA7.6, Feb. 2001, pp. 94-95, 122-123, 404-405, 438.

* cited by examiner

*Primary Examiner*—M. Tran
(74) *Attorney, Agent, or Firm*—Buchanan Ingersoll PC

(57) ABSTRACT

A write drive circuit provided for every write word line supplies a data write current to a write word line of a selected row, and supplies a magnetic-field canceling current to a write word line of an adjacent row in the opposite direction to that of the data write current. In each write drive circuit, the data write current is supplied in response to turning-ON of first and second driver transistors, and the magnetic-field canceling current is supplied in response to turning-ON of the second driver transistor.

20 Claims, 31 Drawing Sheets

THIN FILM MAGNETIC MEMORY DEVICE SUPPRESSING INTERNAL MAGNETIC NOISES

This application is a continuation of application Ser. No. 10/327,888 filed Dec. 26, 2002 now U.S. Pat. No. 6,856,538, the entire contents of which are incorporated herein by reference.

BACKGROUND OF THE INVENTION

1. Field of the Invention

The present invention generally relates to a thin film magnetic memory device. More particularly, the present invention relates to a thin film magnetic memory device including magnetic memory cells having a magnetic tunnel junction (MTJ).

2. Description of the Background Art

An MRAM Magnetic Random Access Memory) device has attracted attention as a memory device capable of non-volatile data storage with low power consumption. The MRAM device is a memory device capable of non-volatile data storage using a plurality of thin film magnetic elements formed in a semiconductor integrated circuit and also capable of random access to each thin film magnetic element.

In particular, recent announcement shows that the use of thin film magnetic elements having a magnetic tunnel junction (MTJ) as memory cells significantly improves performance of the MRAM device. The MRAM device including memory cells having a magnetic tunnel junction is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 34 schematically shows the structure of a memory cell having a; magnetic tunnel junction (hereinafter, simply referred to as "MTJ memory cell").

Referring to FIG. 34, the MTJ memory cell includes a tunneling magneto-resistance element TMR having an electric resistance varying according to the storage data level, and an access element ATR for forming a path of a data read current Is which flows through tunneling magneto-resistance element TMR in data read operation. Since a field effect transistor is typically used as access element ATR, access element ATR is hereinafter sometimes referred to as access transistor ATR. Access transistor ATR is coupled between tunneling magneto-resistance element TMR and a fixed voltage $V_{SS}$ (e.g., ground voltage GND).

A write word line WWL for write operation, a read word line RWL for read operation, and a bit line BL are provided for the MTJ memory cell. Bit line BL serves as a data line for transmitting an electric signal corresponding to the storage data level in read and write operations.

FIG. 35 is a conceptual diagram illustrating read operation from the MTJ memory cell.

Referring to FIG. 35, tunneling magneto-resistance element TMR has a ferromagnetic material layer FL having a fixed magnetization direction (hereinafter, sometimes simply referred to as "fixed magnetic layer"), a ferromagnetic material layer VL that is magnetized in the direction corresponding to an external magnetic field (hereinafter, sometimes simply referred to as "free magnetic layer"), and an antiferromagnetic material layer AFL for fixing the magnetization direction of fixed magnetic layer FL. A tunneling barrier (tunneling film) TB is interposed between fixed magnetic layer FL and free magnetic layer VL. Tunneling barrier TB is formed from an insulator film. Free magnetic layer VL is magnetized either in the same direction as, or in the opposite direction to, that of fixed magnetic layer FL according to the write data level. Fixed magnetic layer FL, tunneling barrier TB and free magnetic layer VL form a magnetic tunnel junction.

In read operation, access transistor ATR is turned ON in response to activation of read word line RWL. This allows a data read current Is to flow through a current path formed by bit line BL, tunneling magneto-resistance element TMR, access transistor ATR and fixed voltage $V_{SS}$ (ground voltage GND).

The electric resistance of tunneling magneto-resistance element TMR varies according to the relation between the magnetization directions of fixed magnetic layer FL and free magnetic layer VL. More specifically, when fixed magnetic layer FL and free magnetic layer VL have the same (parallel) magnetization direction, tunneling magneto-resistance element TMR has a smaller electric resistance than that of the case where they have opposite (antiparallel) magnetization directions.

Accordingly, when free magnetic layer VL is magnetized in the direction corresponding to the storage data level, a voltage change produced in tunneling magneto-resistance element TMR by data read current Is varies depending on the storage data level. Therefore, by precharging bit lines BL to a prescribed voltage and then applying data write current Is to tunneling magneto-resistance element TMR, the storage data of the MTJ memory cell can be read by detecting the voltage of bit line BL.

FIG. 36 is a conceptual diagram illustrating write operation to the MTJ memory cell.

Referring to FIG. 36, in write operation, read word line RWL is inactivated and access transistor ATR is turned OFF. In this state, a data write current is applied to write word line WWL and bit line BL in order to magnetize free magnetic layer VL in the direction corresponding to the write data level. The magnetization direction of free magnetic layer VL is determined by the data write currents flowing through write word line WWL and bit line BL.

FIG. 37 is a conceptual diagram illustrating the magnetized state of tunneling magneto-resistance element TMR in write operation to the MTJ memory cell.

Referring to FIG. 37, the abscissa H(EA) indicates a magnetic field that is applied to free magnetic layer VL of tunneling magneto-resistance element TMR in the easy-axis (EA) direction. The ordinate H(HA) indicates a magnetic field that is applied to free magnetic layer VL in the hard-axis (HA) direction. Magnetic fields H(EA), H(HA) respectively correspond to two magnetic fields produced by the currents flowing through bit line BL and write word line WWL.

In the MTJ memory cell, fixed magnetic layer FL is magnetized in the fixed direction along the easy axis. Free magnetic layer VL is magnetized either in the direction parallel (same) or antiparallel (opposite) to that of fixed magnetic layer FL along the easy axis according to the storage data level ("1" and "0"). Hereinafter, R1 and R0 (where R1>R0) indicate the electric resistances of tunneling magneto-resistance element TMR corresponding to the two magnetization directions of free magnetic layer VL. The MTJ memory cell is thus capable of storing 1-bit data ("1" and "0") according to the two magnetization directions of free magnetic layer VL.

The magnetization direction of free magnetic layer VL can be rewritten only when the sum of the applied magnetic fields H(EA) and H(HA) reaches the region outside the asteroid characteristic line in FIG. 37. In other words, the magnetization direction of free magnetic layer VL will not change if an applied data write magnetic field corresponds to the region inside the asteroid characteristic line.

As shown by the asteroid characteristic line, applying a magnetic field of the hard-axis direction to free magnetic layer VL enables reduction in magnetization threshold value required to change the magnetization direction along the easy axis.

When the write operation point is designed as in the example of FIG. 37, a data write magnetic field of the easy-axis direction is designed to have intensity $H_{WR}$ in the MTJ memory cell to be written. In other words, a data write current to be applied to bit line BL or write word line WWL is designed to produce data write magnetic field $H_{WR}$. Data write magnetic field $H_{WR}$ is commonly defined by the sum of a switching magnetic field $H_{SW}$ required to switch the magnetization direction and a margin $\Delta H$. Data write magnetic field $H_{WR}$ is thus defined by $H_{WR}=H_{SW}+\Delta H$.

In order to rewrite the storage data of the MTJ memory cell, that is, the magnetization direction of tunneling magneto-resistance element TMR, a data write current of at least a prescribed level must be applied to both write word line WWL and bit line BL. Free magnetic layer VL in tunneling magneto-resistance element TMR is thus magnetized in the direction parallel (same) or antiparallel (opposite) to that of fixed magnetic layer FL according to the direction of the data write magnetic field along the easy axis (EA). The magnetization direction written to tunneling magneto-resistance element TMR, i.e., the storage data of the MTJ memory cell, is held in a non-volatile manner until another write operation is conducted.

As described above, the electric resistance of tunneling magneto-resistance element TMR varies according to the magnetization direction that is rewritable by an applied data write magnetic field. Accordingly, non-volatile data storage can be realized by using the two magnetization directions of free magnetic layer VL in tunneling magneto-resistance element TMR as storage data levels ("1" and "0"), respectively.

Accordingly, a magnetic field must be applied from both a corresponding write word line WWL and a corresponding bit line BL to an MTJ memory cell to be written (hereinafter, sometimes referred to as "selected memory cell"). However, a leakage magnetic field applied from these write word line WWL and bit line BL to MTJ memory cells other than the selected memory cell hereinafter, sometimes referred to as "non-selected memory cells") serve as magnetic noises to the non-selected memory cells. If large magnetic noises are applied to the non-selected memory cells, data may be erroneously written thereto.

Especially, a magnetic field having a prescribed intensity is applied to the non-selected memory cells of the same row or the same column as that of the selected memory cell either in the easy-axis direction or hard-axis direction. Therefore, a magnetic field applied to each of the non-selected memory cells of an adjacent row of the selected row or an adjacent column of the selected column must be prevented from reaching the region outside the asteroid characteristic line of FIG. 37 due to the influence of a leakage magnetic field from the write word line of the selected row and the bit line of the selected column.

SUMMARY OF THE INVENTION

It is an object of the present invention to provide a thin film magnetic memory device which prevents erroneous writing to non-selected memory cells caused by magnetic noises and operates with high reliability.

In summary, according to one aspect of the present invention, a thin film magnetic memory device includes a memory array, a plurality of write selection lines, a plurality of data lines, and a plurality of write drive circuits. The memory array has a plurality of magnetic memory cells arranged in a matrix. Each magnetic memory cell has a magnetic element which is magnetized in a direction corresponding storage data. The plurality of write selection lines are provided corresponding to memory cell rows. The plurality of data lines are provided corresponding to memory cell columns. A current is supplied to the data line corresponding to a selected column of the memory cell columns in a direction corresponding to write data. The plurality of write drive circuits are provided corresponding to the plurality of write selection lines, and control selective current supply to the plurality of write selection lines according to a row selection result. Each write drive circuit includes a plurality of current drive sections. The write drive circuit corresponding to a selected row of the memory cell rows supplies a data write current to corresponding one of the write selection lines by using a first number of current drive sections as at least a part of the plurality of current drive sections. The write drive circuit corresponding to an adjacent row of the selected row supplies a magnetic-field canceling current smaller than the data write current to corresponding one of the write selection lines by using a part of the first number of current drive sections in a direction opposite to the data write current supplied to the write selection line corresponding to the selected row. The data write current supplied in response to selection of corresponding one of the memory cell rows and the magnetic-field canceling current supplied in response to selection of the adjacent row have a same direction on each of the write selection lines.

Accordingly, a main advantage of the present invention is that erroneous writing to non-selected memory cells can be prevented by supplying to the write selection lines of adjacent rows a magnetic-field canceling current for canceling a leakage magnetic field generated by a data write current flowing through the write selection line of the selected row. Moreover, each write drive circuit for controlling two types of current supply operations supplies a magnetic-field canceling current by using at least one of current drive sections (driver transistors) used to supply a data write current. This enables reduction in area of the write drive circuit which need be provided for every write selection line.

According to another aspect of the present invention, a thin film magnetic memory device includes a memory array, a plurality of write selection lines, a plurality of data lines, a plurality of write drive circuits, a dummy write selection line, and a dummy write drive circuit. The memory array has a plurality of magnetic memory cells arranged in a matrix. Each magnetic memory cell has a magnetic element which is magnetized in a direction corresponding storage data. The plurality of write selection lines are provided corresponding to memory cell rows. The plurality of data lines are provided corresponding to memory cell columns. A current is supplied to the data line corresponding to a selected column of the memory cell columns in a direction corresponding to write data. The plurality of write drive circuits are provided corresponding to the plurality of write selection lines, and control selective current supply to the plurality of write selection lines according to a row selection result. The dummy write selection line is provided in a same direction as that of the plurality of write selection lines and located adjacent to an endmost write selection line of the plurality of the write selection lines in the memory array. The dummy write drive circuit controls current supply to the dummy write selection line according to the row selection result. The write drive circuit corresponding to a selected row of the memory cell rows supplies a data write current to corresponding one of the write selection lines. The write drive circuit corresponding to an adjacent row of the selected row supplies a magnetic-field canceling current smaller than the data write current to corresponding one of the write selection lines in a direction opposite to the data write current supplied to the write selection line corresponding to the selected row. The data write current supplied in response to selection of corresponding one of the memory cell rows and the magnetic-field canceling current supplied in response to selection of the adjacent row have a same direction on each of the write selection lines. If the endmost write selection line corresponds to the selected row, the dummy write drive circuit supplies the magnetic-field canceling current to the dummy write selection line.

The above thin film magnetic memory device can prevent erroneous writing to non-selected memory cells by supplying to the write selection lines of adjacent rows a magnetic-field canceling current for canceling a leakage magnetic field generated by a data write current flowing through the write selection line of the selected row. Moreover, a magnetic field generated by the magnetic-field canceling current can be applied to the endmost memory cell row of the memory array in the same manner as that of the other memory cell rows. This enables implementation of uniform write characteristics and uniform resistance to erroneous writing within the memory array.

According to still another aspect of the present invention, a thin film magnetic memory device includes a memory array, a plurality of write selection lines, a plurality of data lines, and a plurality of write drive circuits. The memory array has a plurality of magnetic memory cells arranged in a matrix. Each magnetic memory cell has a magnetic element which is magnetized in a direction corresponding storage data. The plurality of write selection lines are provided corresponding to memory cell rows. The plurality of data lines are provided corresponding to memory cell columns. A current is supplied to the data line corresponding to a selected column of the memory cell columns in a direction corresponding to write data. The plurality of write drive circuits are provided corresponding to the plurality of write selection lines, and control selective current supply to the plurality of write selection lines according to a row selection result. The write drive circuit corresponding to a selected row of the memory cell rows supplies a data write current to corresponding one of the write selection lines. The write drive circuit corresponding to an adjacent row of the selected row supplies a magnetic-field canceling current smaller than the data write current to corresponding one of the write selection lines in a direction opposite to the data write current supplied to the write selection line corresponding to the selected row. The data write current supplied in response to selection of corresponding one of the memory cell rows and the magnetic-field canceling current supplied in response to selection of the adjacent row have a same direction on each of the write selection lines. The thin film magnetic memory device further includes main power supply lines, sub power supply lines, and first and second ground lines. The main power supply lines are provided in a direction along the memory cell columns, and transmit the data write current supplied from a main current supply circuit to the plurality of write drive circuits. The sub power supply lines are provided in a direction along the memory cell columns, and transmit the magnetic-field canceling current supplied from a sub current supply circuit to the plurality of write drive circuits. The first and second ground lines are provided in a direction along the memory cell columns at both ends of the plurality of write selection lines, respectively. The first ground line is provided to guide one of the data write current and the magnetic-field canceling current which have passed through at least one of the plurality of write selection lines to a first ground node. The second ground line is provided to guide the other current to a second ground node. The main current supply circuit, the sub current supply circuit, and the first and second ground nodes are arranged so that magnetic fields which are respectively generated by the data write current and the magnetic-field canceling current in the main power supply lines, the sub power supply lines and the first and second ground lines affect each other in a canceling direction.

The above thin film magnetic memory device can prevent erroneous writing to non-selected memory cells by supplying to the write selection lines of adjacent rows a magnetic-field canceling current for canceling a leakage magnetic field generated by a data write current flowing through the write selection line of the selected row. Moreover, the magnetic fields which are respectively generated by a data write current and a magnetic-field canceling current from the current paths other than the write selection lines affect each other in a canceling direction in the memory array. This enables further reduction in magnetic disturbance to the memory array, whereby stable write operation can be realized.

According to yet another aspect of the present invention, a thin film magnetic memory device includes a memory array, a plurality of write current lines, a plurality of write drive circuits, a power supply line, and a ground line. The memory array has a plurality of magnetic memory cells arranged in a matrix. Each magnetic memory cell has a magnetic element which is magnetized in a direction corresponding storage data. The plurality of write current lines selectively receive a data write current in order to selectively apply a data write magnetic field to at least one of the plurality of memory cells. The plurality of write drive circuits are provided corresponding to the plurality of write current lines, and each supplies a data write current to corresponding one of the write current lines according to an address selection result. The power supply line is provided in a direction crossing the plurality of write current lines, and transmits the data write current supplied from a current supply circuit to the plurality of write drive circuits. The ground line is provided in a direction crossing the plurality of write current lines, and guides the data write current which has passed through the plurality of write current lines to a ground node. Each of the power supply line and the ground line has a same wiring resistance per unit length. The power supply line, the ground line, the current supply circuit, and the ground node are arranged so that the data write current on the power supply line, the write current line corresponding to a selected memory cell of the plurality of memory cells and the ground line has an approximately uniform current path length regardless of the address selection result.

The above thin film magnetic memory device can supply a uniform amount of data write current to a write current line regardless of the selection result of memory cell row. This improves uniformity of write characteristics in the memory array, whereby stable write operation can be realized.

According to a further aspect of the present invention, a thin film magnetic memory device includes a memory array, a plurality of write selection lines, a plurality of data lines, and a plurality of write drive circuits. The memory array has a plurality of magnetic memory cells arranged in a matrix. Each magnetic memory cell has a magnetic element which is magnetized in a direction corresponding storage data. The plurality of write selection lines are provided corresponding to memory cell rows. A data write current is supplied to the write selection line corresponding to a selected row of the memory cell rows. The plurality of data lines are provided corresponding to memory cell columns. A current is supplied to the data line corresponding to a selected column of the memory cell columns in a direction corresponding to write data. The plurality of write drive circuits are provided corresponding to the plurality of write selection lines, and provided alternately at one ends of the plurality of write selection lines in every row. Each write drive circuit includes a plurality of N-type field effect transistors connected between the one end of corresponding one of the write selection lines and a first voltage, and turned ON or OFF according to a row selection result. The other ends of the plurality of write selection lines are connected to a second voltage different from the first voltage. In the write drive circuit corresponding to the selected row, at least one of the plurality of N-type field effect transistors is turned ON so that a sum of current driving capabilities of the at least one N-type field effect transistor corresponds to the data write current. In the write drive circuit corresponding to an adjacent row of the selected row, at least a part of the plurality of N-type field effect transistors is turned ON so that a sum of current driving capabilities of the at least a part of N-type field effect transistor is less than the data write current.

The above thin film magnetic memory device can prevent erroneous writing to non-selected memory cells by supplying to the write selection lines of adjacent rows a magnetic-field canceling current for canceling a leakage magnetic field generated by a data write current flowing through the write selection line of the selected row. Moreover, the write drive circuits supply a data write current and a magnetic-field canceling current by using N-type field effect transistors having relatively great current driving capability per unit size. This enables reduction in area of the write drive circuit which need be provided for every write selection line.

According to a still further aspect of the present invention, a thin film magnetic memory includes a memory array, a plurality of write selection lines, a plurality of data lines, and a plurality of write drive circuits. The memory array has a plurality of magnetic memory cells arranged in a matrix. Each magnetic memory cell has a magnetic element which is magnetized in a direction corresponding storage data. The plurality of write selection lines are provided corresponding to memory cell rows. A data write current is supplied to the write selection line corresponding to a selected row of the memory cell rows. The plurality of data lines are provided corresponding to memory cell columns. A current is supplied to a data line of a selected column in a direction corresponding to write data. The plurality of write drive circuits are respectively provided at one ends of the plurality of write selection lines. The other ends of the plurality of write selection lines are alternately connected to first and second voltages in every row. Each write drive circuit whose corresponding write selection line is connected to the first voltage includes a plurality of P-type field effect transistors connected between the one end of the corresponding write selection line and the second voltage and turned ON or OFF according to a row selection result. Each write drive circuit whose corresponding write selection line is connected to the second voltage includes a plurality of N-type field effect transistors connected between the one end of the corresponding write selection line and the first voltage and turned ON or OFF according to the row selection result. In the write drive circuit corresponding to the selected row, at least a part of the plurality of N-type field effect transistors or at least one of the plurality of P-type field effect transistors is turned ON so that a sum of current driving capabilities of the at least one N-type field effect transistor or the at least one P-type field effect transistor corresponds to the data write current. In the write drive circuit corresponding to an adjacent row of the selected row, at least a part of the plurality of N-type field effect transistors or at least a part of the plurality of P-type field effect transistors is turned ON so that a sum of current driving capabilities of the at least a part of N-type field effect transistor or the at least a part of P-type field effect transistor is less than the data write current.

The above thin film magnetic memory device can prevent erroneous writing to non-selected memory cells by supplying to the write selection lines of adjacent rows a magnetic-field canceling current for canceling a leakage magnetic field generated by a data write current flowing through the write selection line of the selected row. Moreover, in the write drive circuits, the P-type and N-type field effect transistors serving as driver transistors can be provided on one side of the memory array. This enables reduction in area of circuitry for conducting row selection. The write drive circuits can be efficiently provided especially in a small memory array structure in which it is less necessary to divide the memory array into a plurality of memory blocks.

According to a yet further aspect of the present invention, a thin film magnetic memory device includes a memory array, a plurality of write current lines, and a peripheral wiring. The memory array has a plurality of magnetic memory cells arranged in a matrix. Each magnetic memory cell has a magnetic element which is magnetized in a direction corresponding storage data. The plurality of write current lines selectively receive a data write current in order to selectively apply a data write magnetic field to at least one of the plurality of memory cells. The peripheral wiring is provided outside the memory array in a same direction as that of the plurality of write current lines. A current flowing through the peripheral wiring and a current flowing through one of the plurality of write current lines which is located closest to the peripheral wiring have opposite directions.

According to a yet further aspect of the present invention, a thin film magnetic memory device includes a memory array, a plurality of write current lines, and a peripheral wiring. The memory array has a plurality of magnetic memory cells arranged in a matrix. Each magnetic memory cell has a magnetic element which is magnetized in a direction corresponding storage data. The plurality of write current lines selectively receive a data write current in order to selectively apply a data write magnetic field to at least one of the plurality of memory cells. The peripheral wiring is provided outside the memory array in a same direction as that of the plurality of write current lines. An element to which the peripheral wiring is connected is determined so that a period of supplying the data write current does not overlap a period of supplying a current to the peripheral wiring.

The above thin film magnetic memory device can suppress magnetic noises from the wiring provided outside the memory array in write operation, and thus can reduce the possibility of erroneous writing in the memory array.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
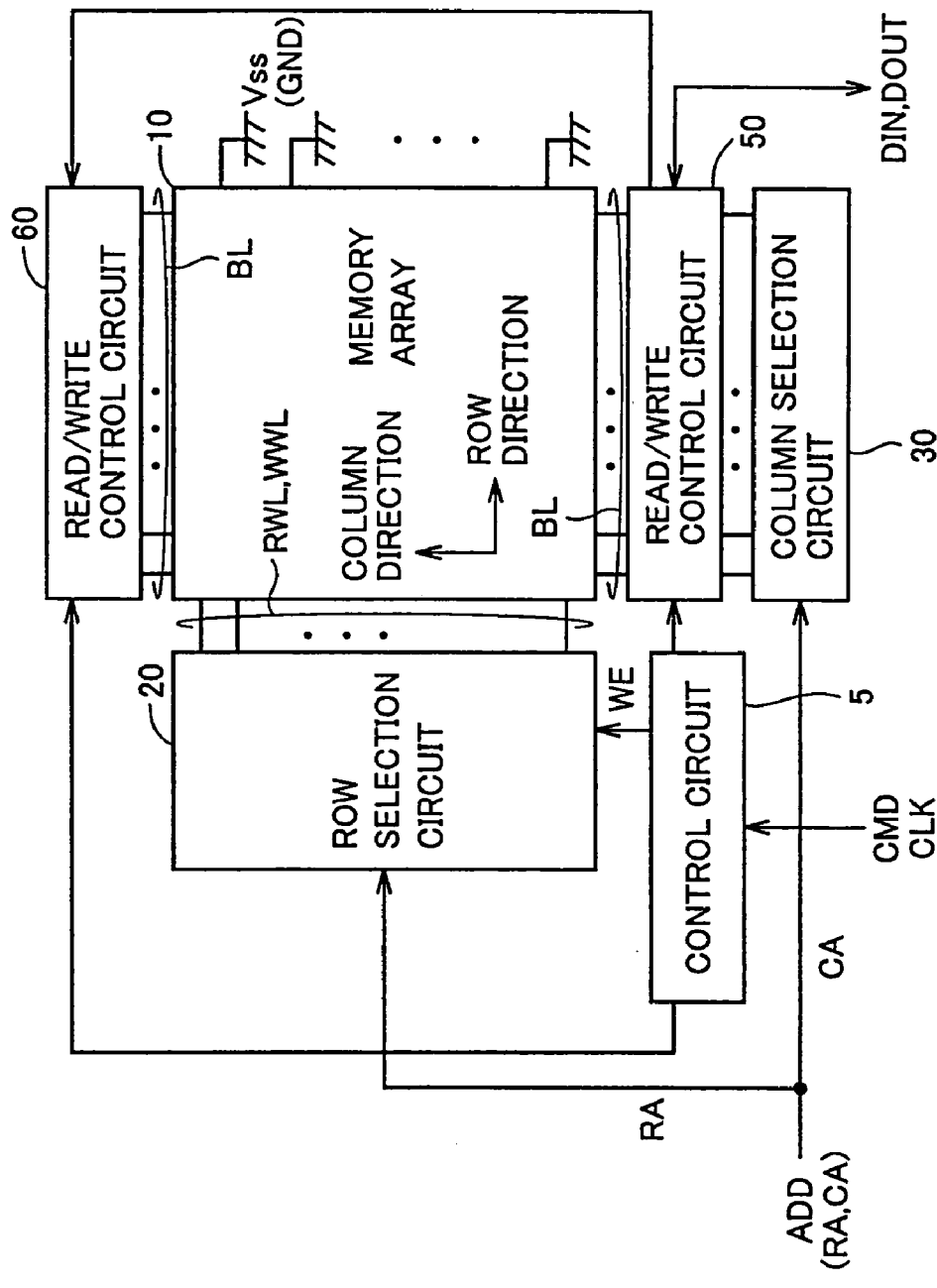
FIG. 1 is a schematic block diagram showing the overall structure of an MRAM device according to an embodiment of the present invention.

Hereinafter, embodiments of the present invention will be described in detail with reference to the accompanying drawings. Note that the same reference numerals and characters denote the same or corresponding portions throughout the figures.

First Embodiment

Referring to FIG. 1, an MRAM device 1 according to an embodiment of the present invention conducts random access in response to an external control signal CMD and an external address signal ADD in order to receive write data DIN and to output read data DOUT. For example, read operation and write operation of the MRAM device 1 are conducted in synchronization with an external clock signal CLK. However, read operation and write operation may alternatively be conducted without receiving the external clock signal CLK. In this case, the timing of conducting the read operation and write operation is determined internally.

MRAM device 1 includes a control circuit 5 for controlling the overall operation of MRAM device 1 in response to control signal CMD, and a memory array 10 having a plurality of MTJ memory cells arranged in a matrix. A plurality of write word lines WWL and a plurality of read word lines RWL are provided corresponding to the MTJ memory cell rows (hereinafter, sometimes simply referred to as "memory cell rows"). Bit lines BL are provided corresponding to the MTJ memory cell columns (hereinafter, sometimes simply referred to as "memory cell columns").

MRAM device 1 further includes a row selection circuit 20, a column selection circuit 30, and read/write control circuits 50, 60.

Row selection circuit 20 selects a row in memory array 10 according to a row address RA indicated by address signal ADD. Column selection circuit 30 selects a column in memory array 10 according to a column address CA indicated by address signal ADD. Row address RA and column address CA indicate a memory cell selected for write and read operations.

Read/write control circuits 50, 60 collectively refers to a circuit group provided in a region adjacent to memory cell 10 in order to supply a data write current and a data read current to a bit line BL of a memory cell column corresponding to the selected memory cell (hereinafter, sometimes referred to as "selected column") in read operation and write operation.

Figure 2:
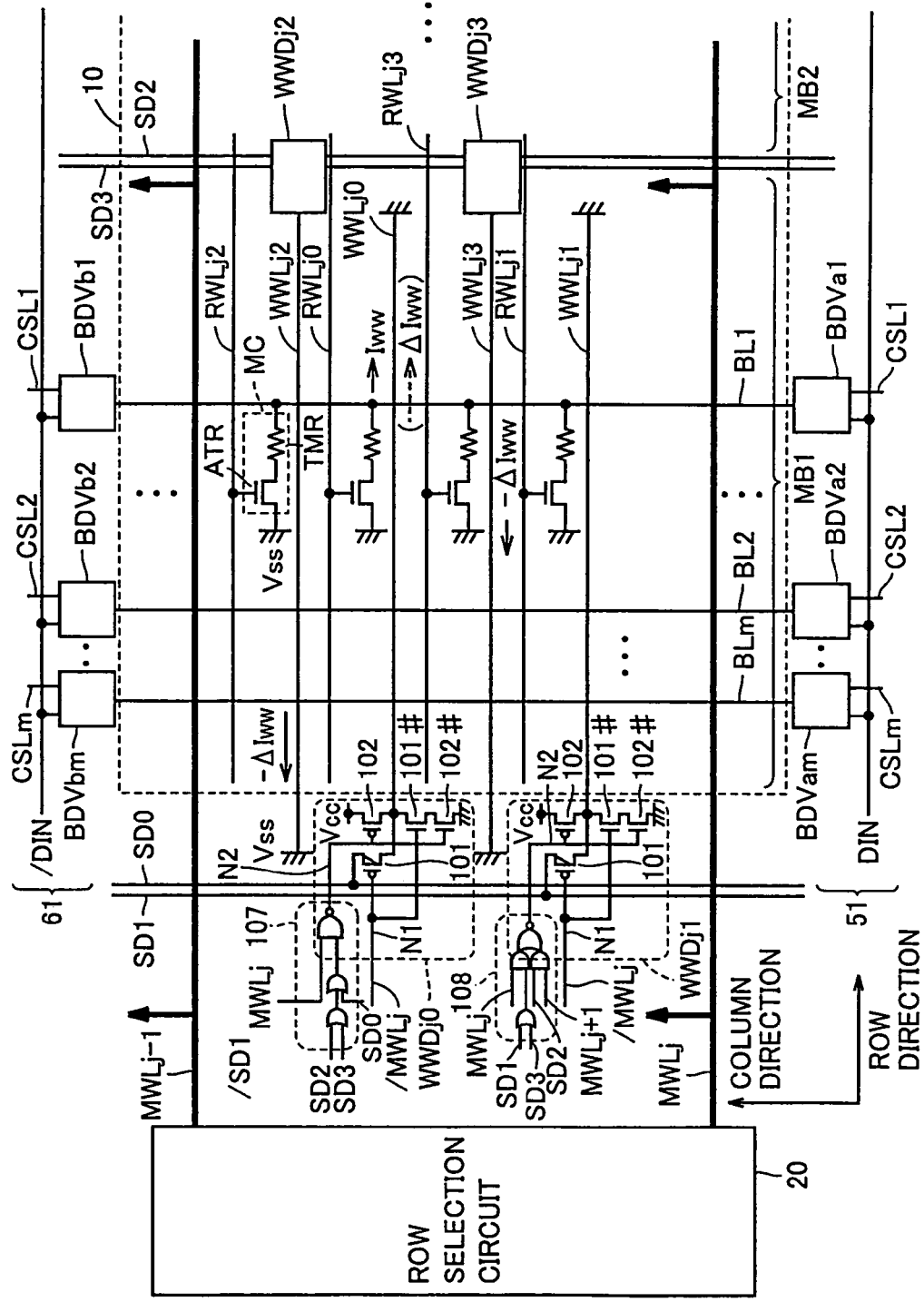
FIG. 2 is a circuit diagram illustrating operation of supplying a data write current according to a first embodiment of the present invention.

FIG. 2 is a circuit diagram illustrating operation of supplying a data write current according to the first embodiment.

FIG. 2 exemplary shows the circuit structure of a region of peripheral circuitry of memory array 10, which is associated with write operation.

Referring to FIG. 2, MTJ memory cells MC are arranged in a matrix in memory array 10. Each MTJ memory cell MC has the same structure and the same data storage principles as those shown in FIGS. 34 to 37. Each MTJ memory cell MC includes a tunneling magneto-resistance element TMR and an access transistor ATR. Tunneling magneto-resistance element TMR is formed by a magnetic element which is, magnetized in the direction corresponding to storage data. Tunneling magneto-resistance element TMR and access transistor ATR are connected in series between a corresponding bit line BL and a fixed voltage $V_{SS}$. A MOS (Metal Oxide Semiconductor) transistor, i.e., a field effect transistor formed on a semiconductor substrate, is typically used as access transistor ATR. Hereinafter, fixed voltage $V_{SS}$ is sometimes referred to as ground voltage $V_{SS}$.

Especially, the structure for selecting a row by hierarchical decode operation will be described below. The plurality of MTJ memory cells MC in memory array 10 are divided into a plurality of memory blocks MB along the column direction. FIG. 2 exemplary shows the first memory block MB1.

In each memory block MB, write word lines WWL and read word lines RWL are provided corresponding to the memory cell rows, and bit lines BL are provided corresponding to the memory cell columns.

In write operation, a data write current is supplied to a write word line WWL of the selected memory cell row (hereinafter, sometimes referred to as "selected row") in order to generate a magnetic field in the direction along the hard axis of tunneling magneto-resistance element TMR. Moreover, a data write current is supplied to a bit line BL of the selected column in order to generate a magnetic field in the direction along the easy axis of tunneling magneto-resistance element TMR. In other words, the direction of the data write current flowing through bit line BL of the selected column must be controlled according to the level of write data DIN.

A main word line MWL is provided for every K memory cell rows (where K is a natural number). Main word lines MWL are shared by the plurality of memory blocks MB. In the example of FIG. 2, K=4. More specifically, in each memory block MB, four write word lines WWL correspond to one main word line MWL. FIG. 2 exemplary shows the structure corresponding to the $j^{th}$ main word line MWLj in the first memory block MB1 (where j is a natural number). More specifically, in memory block MB1, four write word lines WLj0, WWLj1, WWLj2, WWLj3 are provided corresponding to main word line MWLj. Read word lines RWL are provided in the same manner as that of write word lines WWL. More specifically, in memory block MB1, four read word lines RWLj0 to RWLj3 are provided corresponding to main word line MWLj.

Sub decode signals SD0 to SD3 are transmitted at both ends of each memory block MB. Sub decode signals SD0 to SD3 are set independently in every memory block MB. In a memory block including the selected memory cell (hereinafter, sometimes referred to as "selected memory block"), sub decode signals SD0 to SD3 are selectively activated in order to select one of the four write word lines WWL and the four read word lines RWL corresponding to a main word line MWL. For example, in order to select write word line WWLj0, sub decode signal SD0 is activated to H level and the other sub decode signals SD0 to SD3 are set to L level. In the non-selected memory blocks MB, sub decode signals SD0 to SD3 are set to L level.

Hereinafter, signal lines for transmitting sub decode signals SD0 to SD3 are also denoted with the same reference numerals and characters as those of sub decode signals SD0 to SD3. In other words, these signal lines are referred to as sub decode signal lines SD0 to SD3.

In the specification, write word lines, read word lines, bit lines and main word lines are sometimes generally referred to as write word lines WWL, read word lines RWL, bit lines BL and main word lines MWL, and sometimes specifically referred to as write word lines WWLj0, WWLj1, . . . , read word lines RWLj0, RWLj1, . . . , bit lines BL1, BL2, . . . , and main word lines MWLj, MWLj−1, . . . . The high voltage state (e.g., power supply voltage $V_{CC}$) and low voltage state (e.g., ground voltage $V_{SS}$) of signals and signal lines are sometimes referred to as "H level" and "L level", respectively.

Operation of supplying a data write current to bit line BL will now be described.

Read/write control circuit 50 has a bit-line drive section 51 formed by bit-line drive circuits BDVa1 to BDVam. Bit line drive circuits BDVa1 to BDVam are provided at one end of bit lines BL1 to BLm, respectively. Similarly, read/write control circuit 60 has a bit-line drive section 61 formed by bit-line drive circuits BDVb1 to BDVbm. Bit line drive circuits BDVb1 to BDVbm are provided at the other end of bit lines BL1 to BLm, respectively. Hereinafter, bit-line drive circuits BDVa1 to BDVam are sometimes generally referred to as bit-line drive circuits BDVa, and bit-line drive circuits BDVb1 to BDVbm are sometimes generally referred to as bit-line drive circuits BDVb.

Column selection lines CSL1 to CSLm are provided corresponding to the memory cell columns. Hereinafter, column selection lines CSL1 to CSLm are sometimes generally referred to as column selection lines CSL. Column selection line CSL of the selected column is activated to H level, and column selection lines CSL of the non-selected columns are inactivated to L level.

Each bit-line drive circuit BDVa controls a voltage at one end of a corresponding bit line BL according to a corresponding column selection line CSL and write data DIN. Each bit-line drive circuit BDVb controls a voltage at the other end of a corresponding bit line BL according to a corresponding column selection line CSL and inverted write data /DIN. In the selected column, bit-line drive circuit BDVa sets a voltage at one end of a corresponding bit line BL to one of H level and L level and bit-line drive circuit BDVb sets a voltage at the other end of the corresponding bit line BL to the other level, according to the level of write data DIN. For example, if write data DIN is at H level ("1"), bit-line drive circuit BDVa connects one end of bit line BL of the selected column to power supply voltage $V_{CC}$, and bit-line drive circuit BDVb connects the other end of bit line BL of the selected column to ground voltage $V_{SS}$. As a result, a data write current flows through bit line BL of the selected column in the direction from bit-line drive section 51 toward bit-line drive section 61.

On the other hand, if write data DIN is at L level ("0"), bit-line drive circuit BDVa connects one end of bit line BL of the selected column to ground voltage $V_{SS}$, and bit-line drive circuit BDVb connects the other end of bit line BL of the selected column to power supply voltage $V_{CC}$. As a result, a data write current flows through bit line BL of the selected column in the direction opposite to that of the case where write data DIN is at H level ("1"). In the non-selected columns, bit-line drive circuits BDVa, BDVb connect both ends of corresponding bit lines BL to ground voltage $V_{SS}$. As a result, no data write current flows through bit lines BL of the non-selected columns.

Operation of supplying a current to write word line WWL in write operation will now be described. It is herein assumed that write word lines WWLj0, WWLj1 correspond to even rows, and write word lines WWLj2, WWLj3 correspond to odd rows.

A write drive circuit WWD is provided for each write word line WWL. Each write drive circuit WWD controls current supply to a corresponding write word line WWL according to the row selection result. In each memory block MB, write drive circuit WWD is provided alternately at one ends of write word lines WWL in every row. For example, as shown in FIG. 2, write drive circuits WWDj0, WWDj1 corresponding to even rows are provided on the opposite side to that of write drive circuits WWDj2, WWDj3 corresponding to odd rows.

The end of each write word line WWL at which write drive circuit WWD is not provided is connected to ground voltage $V_{SS}$ regardless of the row selection result. Write word lines WWL corresponding to even rows such as write word lines WWLj0, WWLj1 are directly connected to ground voltage $V_{SS}$ in a region opposite to row selection circuit 20. Write word lines WWL corresponding to odd rows such as write word lines WWLj2, WWLj3 are directly connected to ground voltage $V_{SS}$ in a region dose to row selection circuit 20.

If a corresponding write word line WWL is selected, write drive circuit WWD supplies a data write current $I_{WW}$ to the selected write word line WWL. On the other hand, if an adjacent row is selected, write drive circuit WWD supplies a current $\Delta I_{WW}$ to a corresponding write word line WWL. FIG. 2 exemplary shows the structure of write drive circuits WWDj0, WWDj1 corresponding to write word lines WWLj0, WWLj1.

Write drive circuit WWDj0 includes driver transistors 101, 102, 10 1#, 102#. Driver transistor 101 is connected between sub decode signal line SD0 and one end of write word line WWLj0. Driver transistor 102 is connected between power supply voltage $V_{CC}$ and one end of write word line WWLj0. Driver transistors 101#, 102# are connected in series between one end of write word line WWLj0 and ground voltage $V_{SS}$. P-channel MOS transistors are used as driver transistors 101, 102, and N-channel MOS transistors are used as driver transistors 101#, 102#.

Driver transistors 101, 101# have their gates connected to a node N1, and driver transistors 102, 102# have their gates connected to a node N2. In other words, driver transistors 101, 101# are turned ON/OFF in a complementary manner, and driver transistors 102, 102# are turned ON/OFF in a complementary manner.

A signal /MWLj indicating an inverted voltage level of a corresponding main word line MWLj is applied to node N1. For example, this structure is implemented by providing a not-shown inverter between main word line MWLj and node N1.

A logic circuit 107 includes first and second OR gates and a NAND gate. The first OR gate outputs the OR operation result of sub decode signals SD2, SD3. The second OR gate outputs the OR operation result of the output of the first OR gate and sub decode signal SD0. The NAND gate outputs the NAND operation result of the output of the second OR gate and the voltage level of main word line MWLj to node N1. As a result, the voltage level of node N2 is set to L level when a corresponding row (write word line WWLj0) or an adjacent row (write word line WWLj2 or WWLj3) is selected for write operation, and is set to H level when neither a corresponding row nor an adjacent row is selected for write operation.

If a corresponding main word line MWLj is activated to H level, driver transistor 101 is turned ON and driver transistor 101# is turned OFF. Accordingly, driver transistor 101 supplies a current to write word line WWLj0 when main word line MWLj is activated to H level and sub decode signal line SD0 is driven to H level.

Driver transistor 102 supplies a current to write word line WWLj0 when node N2 is set to L level, that is, when either a row corresponding to write word line WWLj0 or an adjacent row (write word line WWLj2 or WWLj3) is selected for write operation.

As a result, if the row corresponding to write word line WWLj0 is selected, a current corresponding to the sum of current driving capabilities of driver transistors 101, 102 is supplied to write word line WWLj0 as a data write current $I_{WW}$. If an adjacent row is selected, a current $\Delta I_{WW}$ corresponding to the current driving capability of driver transistor 102 is supplied to write word line WWLj0. For example, the current driving capabilities of driver transistors 101, 102 for driving a current to be supplied to write word line WWL can be adjusted by the transistor size (the ratio of gate width to gate length).

If neither the row corresponding to write word line WWLj0 nor an adjacent row is selected, write drive circuit WWDj0 does not supply any current to write word line WWLj0.

Write drive circuit WWDj1 corresponding to write word line WWLj1 has a decode structure slightly different from that of write drive circuit WWDj0 because one of adjacent rows corresponds to the following main word line MWLj+1 (not shown).

In write drive circuit WWDj1, driver transistor 101 is provided between sub decode signal line SD1 and write word line WWLj1. Since driver transistor 102, 101#, 102# are provided in the same manner as that of write drive circuit WWDj0, detailed description thereof will not be repeated.

In write drive circuit WWDj1, a logic circuit 108 sets the gate voltages of driver transistors 102; 102#, i.e., the level of node N2.

Logic circuit 108 includes an OR gate, two AND gates, and a NOR gate. The OR gate outputs the OR operation result of sub decode signals SD1, SD3. One of the AND gates outputs the AND operation result of the output of the OR gate and the voltage level of main word line MWLj. The other AND gate outputs the AND operation result of sub decode signal SD2 and the voltage level of the following main word line MWLj+1. The NOR gate outputs the NOR operation result of the outputs of the two AND gates to node N2.

As a result, the voltage level of node N2 is set to L level when either a corresponding row (write word line WWLj1) or an adjacent row (write word line WWLj3 or not-shown write word line WWL(j+1)2) is selected, and is set to H level when neither a corresponding row nor an adjacent row is selected. Logic circuits 107, 108 thus have the same functions. In each write drive circuit WWD, node N2 is set to L level when either a corresponding row or an adjacent row is selected. Otherwise, node N2 is set to H level.

It is herein assumed that, like write drive circuits WWDj1, WWDj0, sub decode signals SD2, SD3 are transmitted to write drive circuits WWDj2, WWDj3, and the other sub decode signals SD0, SD1 required to determine whether a corresponding row or an adjacent row is selected or not are also transmitted to write drive circuits WWDj2, WWDj3. Regarding write drive circuit WWDj3, a corresponding write word line WWLj3 and write word lines WWLj0, WWLj1 of adjacent rows correspond to the same main word line MWLj. Therefore, write drive circuit WWDj3 has the same structure as that of write drive circuit WWDj0 except that connection of sub decode signals is changed as appropriate. Regarding write drive circuit WWDj2, however, one of write word lines of adjacent rows corresponds to a different main word line MWLj−1. Therefore, write drive circuit WWDj2 has the same structure as that of write drive circuit WWDj1 except that connection of sub decode signals and main word lines is changed as appropriate.

In this way, each write drive circuit WWD supplies a data write current $I_{WW}$ to a corresponding write word line WWL by driver transistors 101, 102 if a corresponding row is selected. If an adjacent row is selected, however, each write drive circuit WWD supplies a current $\Delta I_{WW}$ smaller than data write current $I_{WW}$ by only driver transistor 102.

Write driver circuit WWD having the above structure is provided alternately at one ends of write word lines WWL in every row. Therefore, a current $\Delta I_{WW}$ having the opposite direction to that of a data write current $I_{WW}$ supplied to a write word line of the selected row is supplied to a write word line of an adjacent row (hereinafter, this current $\Delta I_{WW}$ is sometimes referred to as "$-\Delta I_{WW}$" in view of the flowing direction of the current). For example, if a memory cell corresponding to write word line WWLj0 is selected, a data write current $I_{WW}$ is supplied to write word line WWLj0 of the selected row in the direction away from row selection circuit 20 (in FIG. 2, from left to right). In this case, a current $-\Delta I_{WW}$ is supplied to write word lines WWLj2, WWLj3 of adjacent rows in the direction toward row selection circuit 20 (in FIG. 2, from right to left), that is, in the direction opposite to that of data write current $I_{WW}$ supplied to write word line WWLj1 of the selected row.

Accordingly, a leakage magnetic field applied to the non-selected memory cells by a data write current $I_{WW}$ of the selected row can be canceled by a magnetic field generated by a current $-\Delta I_{WW}$ of adjacent rows. As a result, erroneous writing to the non-selected memory cells such as those of adjacent rows can be prevented, whereby operation reliability of the MRAM device can be improved. Hereinafter, a current $\Delta I_{WW}$ supplied to adjacent rows is sometimes referred to as "magnetic-field canceling current", and a magnetic field generated by the magnetic-field canceling current is sometimes referred to as "canceling magnetic field".

In each write word line WWL, a data write current $I_{WW}$ supplied in response to selection of a corresponding memory cell row has the same direction as a current $\Delta I_{WW}$ supplied in response to selection of an adjacent row. In other words, each write drive circuit WWD supplies a current only in a fixed direction. This prevents the circuit structure of write drive circuit WWD from being complicated.

Since write drive circuit WWD is provided alternately in every row, such a magnetic-field canceling current $\Delta I_{WW}$ can be supplied by using two types of voltages, i.e., power supply voltage $V_{CC}$ and ground voltage $V_{SS}$. In other words, if all write drive circuits WWD having the structure of FIG. 2 are provided on one side of write word lines WWL, a negative voltage must additionally be supplied to each write drive circuit WWD. Moreover, since write drive circuit WWD is provided alternately in every row, limitations on layout of write drive circuits WWD are reduced. Therefore, such alternate arrangement of write drive circuits WWD can contribute reduction in size of the MRAM device.

Figure 37:
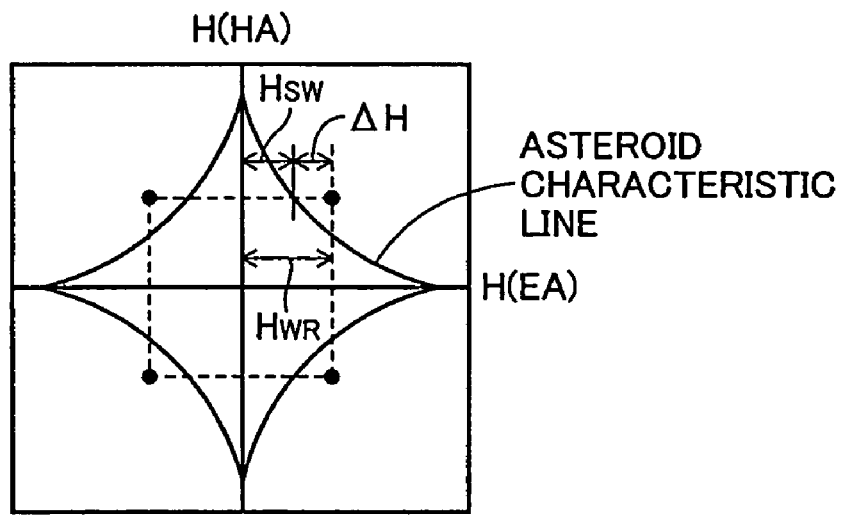
FIG. 37 is a conceptual diagram illustrating the magnetized state of a tunneling magneto-resistance element in write operation to an MTJ memory cell.

As described in FIG. 37, the magnetization direction of a tunneling magneto-resistance element TMR of the selected memory cell is determined by a magnetic field along the easy axis, that is, the direction of a data write current flowing through a corresponding bit line BL. In other words, the direction of a data write current flowing through write word line WWL does not directly affect the magnetization direction of tunneling magneto-resistance element TMR. Accordingly, although a data write current supplied to a write word line WWL of an odd row has the opposite direction to that of a data write current supplied to a write word line WWL of an even row, write operation will not be hindered.

Although not specifically shown in FIG. 2, read operation to memory array 10 will now be described briefly. In read operation, a not-shown read word line driver activates a read word line RWL of the selected row to H level based on a corresponding main word line MWL and sub decode signals SD0 to SD3. In response to this, access transistor ATR is turned ON in each MTJ memory cell MC of the selected row. As a result, each bit line BL1 to BLm is connected to ground voltage $V_{SS}$ through a corresponding tunneling magneto-resistance element TMR. Moreover, a bit line of the selected column is connected to a prescribed voltage different from ground voltage $V_{SS}$, whereby the voltage difference is produced between both ends of a corresponding tunneling magneto-resistance element TMR. As a result, a current corresponding to storage data of the selected memory cell can be generated on the bit line of the selected column. Data can be read from the selected memory cell by detecting a current passing through the bit line of the selected column.

As has been described above, according to the structure of the first embodiment, a magnetic-field canceling current for canceling a leakage magnetic field generated by a prescribed data write current can be supplied to the write word lines of adjacent rows. Moreover, each of the write drive circuits for controlling the two types of current supply operations supplies a magnetic-field canceling current by using at least one of the driver transistors which are turned ON in order to supply a data write current. This enables reduction in layout area of the driver transistor group used to supply a data write current and a magnetic-field canceling current. As described above, write drive circuit WWD is provided for every write word line WWL. Therefore, such reduction in layout area is highly effective for reduction in overall area of the MRAM device.

Modification of First Embodiment

In the structure described in the first embodiment, a magnetic-field canceling current having the opposite direction to that of a data write current is supplied in adjacent rows of the selected row. In this structure, however, a memory cell row located at the end of memory array 10 (hereinafter, sometimes referred to as "endmost memory cell row") has only one adjacent row. Therefore, a magnetic field applied to the endmost memory cell row in write operation is different from that applied to the other memory cell rows. This may possibly result in non-uniform write operation in memory array 10, thereby reducing a write operation margin.

In the modification of the first embodiment, the structure that enables a canceling magnetic field to be applied to the endmost memory cell row in the same manner as that of the other memory cell rows will be described.

Figure 3:
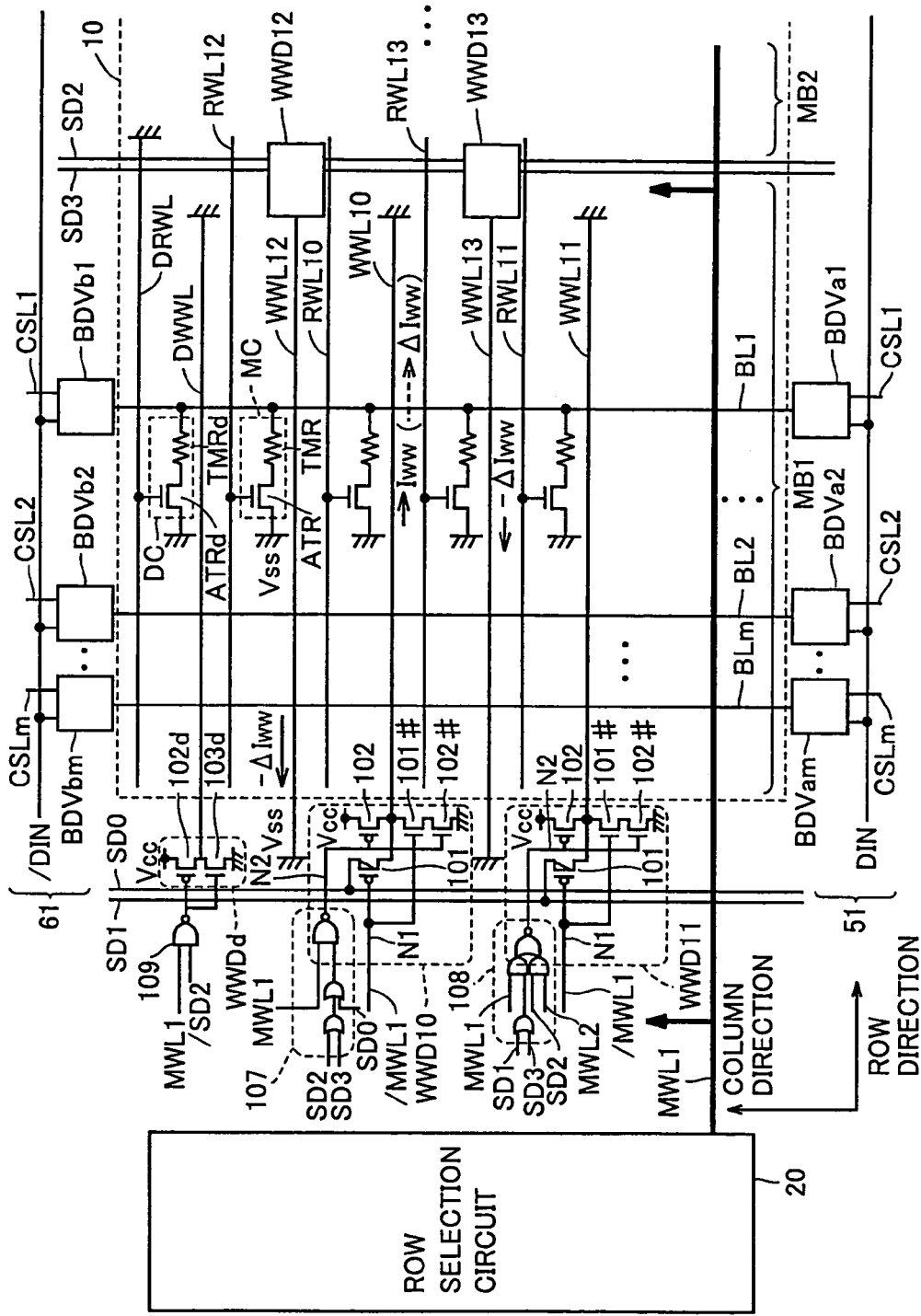
FIG. 3 is a circuit diagram illustrating operation of supplying a data write current according to a modification of the first embodiment.

FIG. 3 is a circuit diagram illustrating operation of supplying a data write current according to the modification of the first embodiment.

In order to illustrate the structure of the end region of memory array 10, FIG. 3 exemplary shows the structure of a region corresponding to the first main word line MWL1 in memory block MB1.

In this region, read word lines RWL10 to RWL13 and write word lines WWL10 to WWL13 are provided corresponding to the memory cell rows, and write drive circuits WWD10 to WWD13 are provided corresponding to write word lines WWL10 to WWL13.

Since the structure and operation of write drive circuits WWD10 to WWD13 are the same as those of write drive circuits WWDj0 to WWDj3 of FIG. 2, detailed description thereof will not be repeated.

In the modification of the first embodiment, a dummy memory cell row is additionally provided outside the endmost memory cell row corresponding to write word line WWL12.

A dummy write word line DWWL and a dummy read word line DRWL are provided corresponding to this dummy memory cell row. Moreover, a dummy write drive circuit WWDd is provided corresponding to dummy write word line DWWL.

Dummy write drive circuit WWDd has driver transistors 102d, 103d. Driver transistor 102d is connected between power supply voltage $V_{CC}$ and one end of dummy write word line DWWL. Driver transistor 103d is connected between one end of dummy write word line DWWL and ground voltage $V_{SS}$. Driver transistor 102d has the same current driving capability as that of driver transistor 102 in each write drive circuit WWD.

Driver transistors 102d, 103d are turned ON or OFF in a complementary manner according to the output of a logic gate 109. Logic gate 109 outputs the NAND operation result of the voltage level of main word line MWL1 located at the end of memory array 10 (i.e., endmost main word line MWL1) and sub decode signal SD2. Accordingly, driver transistor 102d is turned ON if main word line MWL1 is activated and the endmost memory cell row (corresponding to write word line WWL12) is selected. Otherwise, driver transistor 102d is turned OFF.

As a result, a magnetic-field canceling current $-\Delta I_{WW}$ is supplied to dummy write word line DWWL if the endmost memory cell row is selected and a data write current $I_{WW}$ is supplied to write word line WWL12. In this way, a canceling magnetic field can be applied to the endmost memory cell row in the same manner as that of the other memory cell rows.

In other words, the endmost memory cell row of memory array 10 has the same write characteristics and the same resistance to erroneous writing as those of the other memory cell rows. This enables uniform write characteristics to be realized in memory array 10.

Note that dummy write word line DWWL need only be provided in order to merely supply a magnetic-field canceling current $\Delta I_{WW}$. In other words, dummy memory cells and dummy read word line DRWL are not necessarily provided. However, if the design pattern abruptly changes at the end of the memory array, the difference in shape and dimension is likely to be produced at the boundary between the dummy memory cell row and the other memory cell rows. It is therefore desirable to provide dummy memory cells and dummy read word line DRWL so that the dummy memory cell row has the same design pattern as the other memory cell rows in memory array 10.

Second Embodiment

In the structure of the first embodiment, a data write current $I_{WW}$ is supplied by driving sub decode signal line SD0 to SD3 to H level. Moreover, a magnetic-field canceling current $\Delta I_{WW}$ is driven by power supply voltage $V_{CC}$.

In the second embodiment, desired arrangement of a voltage source and a current source for supplying the data write current and the magnetic-field canceling current will be described.

Figure 4:
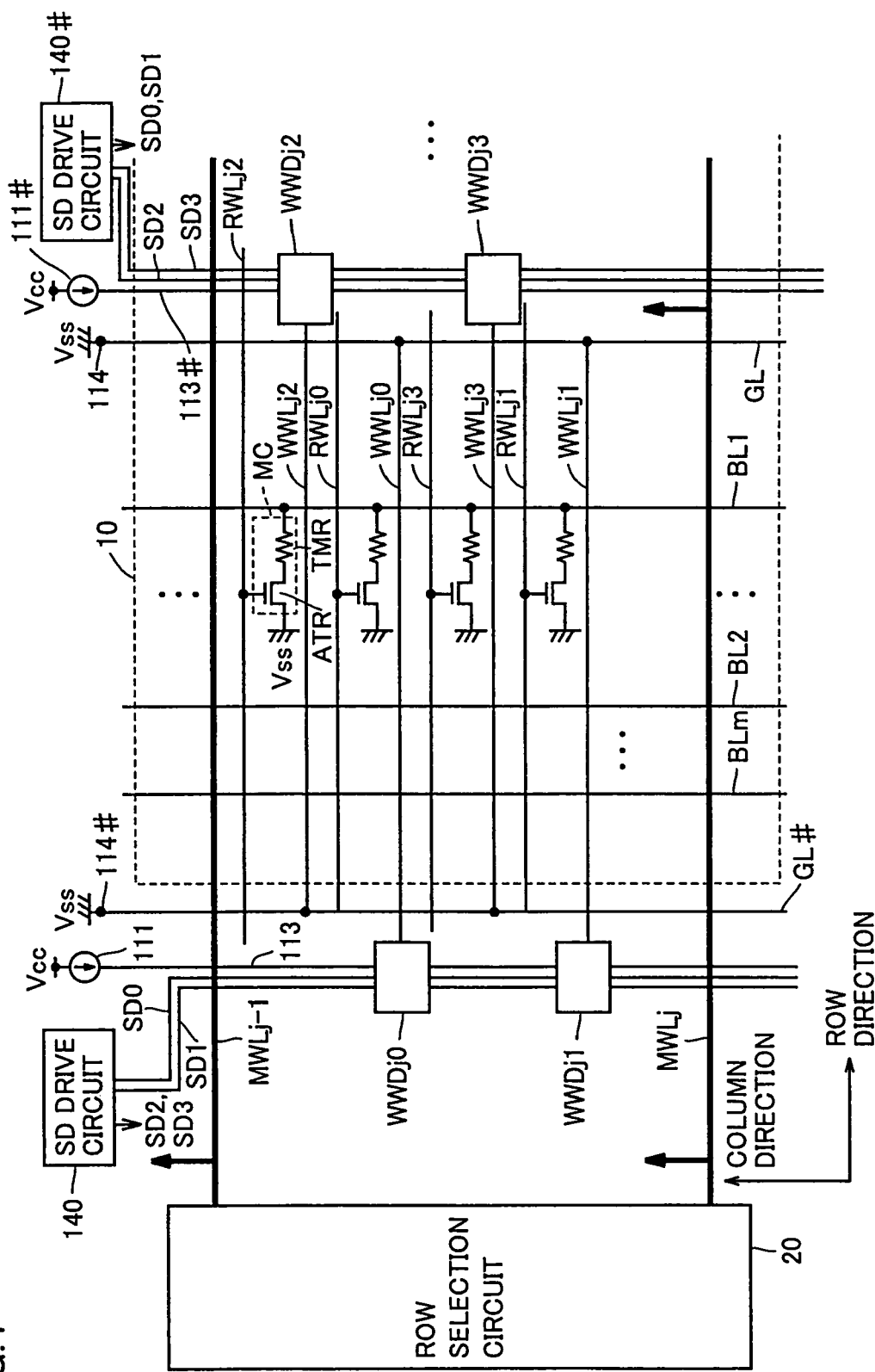
FIG. 4 is a block diagram illustrating a first example of the structure of circuitry for supplying a data write current and a magnetic-field canceling current according to a second embodiment of the present invention.

FIG. 4 is a block diagram illustrating a first example of the structure of circuitry for supplying a data write current and a magnetic-field canceling current according to the second embodiment.

Referring to FIG. 4, in the first example of the structure of the second embodiment, the structure of memory array 10 and the structure and operation of each write drive circuit WWD are the same as those described in the first embodiment. Therefore, detailed description thereof will not be repeated.

FIG. 4 shows SD drive circuits 140, 140#, current source circuits 111, 111#, current lines 113, 113#, ground lines GL, GL#, and ground nodes 114, 114#. SD drive circuits 140, 140# drive sub decode signal lines SD0 to SD3. Current source circuits 111, 111# and current lines 113, 113# generate a magnetic-field canceling current $\Delta I_{WW}$. Ground lines GL, GL# and ground nodes 114, 114# connect one end or the other end of each write word line WWL to ground voltage $V_{SS}$. Like sub decode signal lines SD0 to SD3, current lines 113, 113# and ground lines GL, GL# are provided in the column direction.

SD drive circuit 140, current source circuit 111, current line 113 and ground node 114 are provided corresponding to write word lines and write drive circuits of even rows (e.g., write word lines WWLj0, WWLj1 and write drive circuits WWDj0, WWDj1). SD drive circuit 140#, current source circuit 111#, current line 113# and ground node 114# are provided corresponding to write word lines and write drive circuits of odd rows (e.g., write word lines WWLj2, WWLj3 and write drive circuits WWDj2, WWDj3).

Sub decode signal lines SD0, SD1 transmit a data write current driven by SD drive circuit 140 to a write drive circuits of an even row. Sub decode signal lines SD2, SD3 transmit a data write current driven by SD drive circuit 140# to a write drive circuit of an odd row. Similarly, current line 113 transmits a data write current supplied from current source circuit 111 to a write drive circuit of an even row. Current line 113# transmits a data write current supplied from current source circuit 111# to a write drive circuit of an odd row.

Ground line GL is provided in order to guide a data write current and a canceling current, which have passed through a write word line of an even row, to ground node 114. Ground line GL# is provided in order to guide a data write current and a canceling current, which have passed through a write word line of an odd row, to ground node 114#.

In the first example of FIG. 4, SD drive circuits 140, 140#, current source circuits 111, 111#, current lines 113, 113# and ground nodes 114, 114# are provided on one side of a region located adjacent to memory array 10 in the column direction.

For example, if an even row (write word line WWLj0, WWLj1) is selected, a data write current flows through a path formed by SD drive circuit 140 and current source circuit 111, sub decode signal lines SD0, SD1 and current line 113, write drive circuit of the selected row, write word line of the selected row, ground line GL, and ground node 114. Moreover, a magnetic-field canceling current flows through a path formed by current source circuit 111#, current line 113#, write drive circuits of adjacent rows, write word lines of the adjacent rows, ground line GL#, and ground node 114#. In this case, the direction of the data write current flowing through sub decode signal lines SD0, SD1 and current line 113 is opposite to that of the magnetic-field canceling current flowing through ground line GL#. Moreover, the direction of the data write current flowing through ground line GL is opposite to that of the magnetic-field canceling current flowing through current line 113#.

Accordingly, regarding data write current $I_{WW}$ and magnetic-field canceling current $\Delta I_{WW}$, magnetic fields generated from the current paths other than the write word lines of the selected row and adjacent rows cancel each other in memory array 10.

If an odd row is selected, a data write current flows through sub decode signal lines SD2, SD3, current line 113# and ground line GL#, and a magnetic-field canceling current flows through current line 113 and ground line GL. On these wirings, data write current $I_{WW}$ and magnetic-field canceling current $\Delta I_{WW}$ flow in the opposite directions. Accordingly, as in the case where an even row is selected, magnetic fields generated by data write current $I_{WW}$ and magnetic-field canceling current $\Delta I_{WW}$ from the current paths other than the write word lines cancel each other in memory array 10.

As a result, in addition to the effects obtained by the first embodiment, magnetic disturbance to memory array 10 can further be reduced, whereby stable write operation can be realized.

Figure 5:
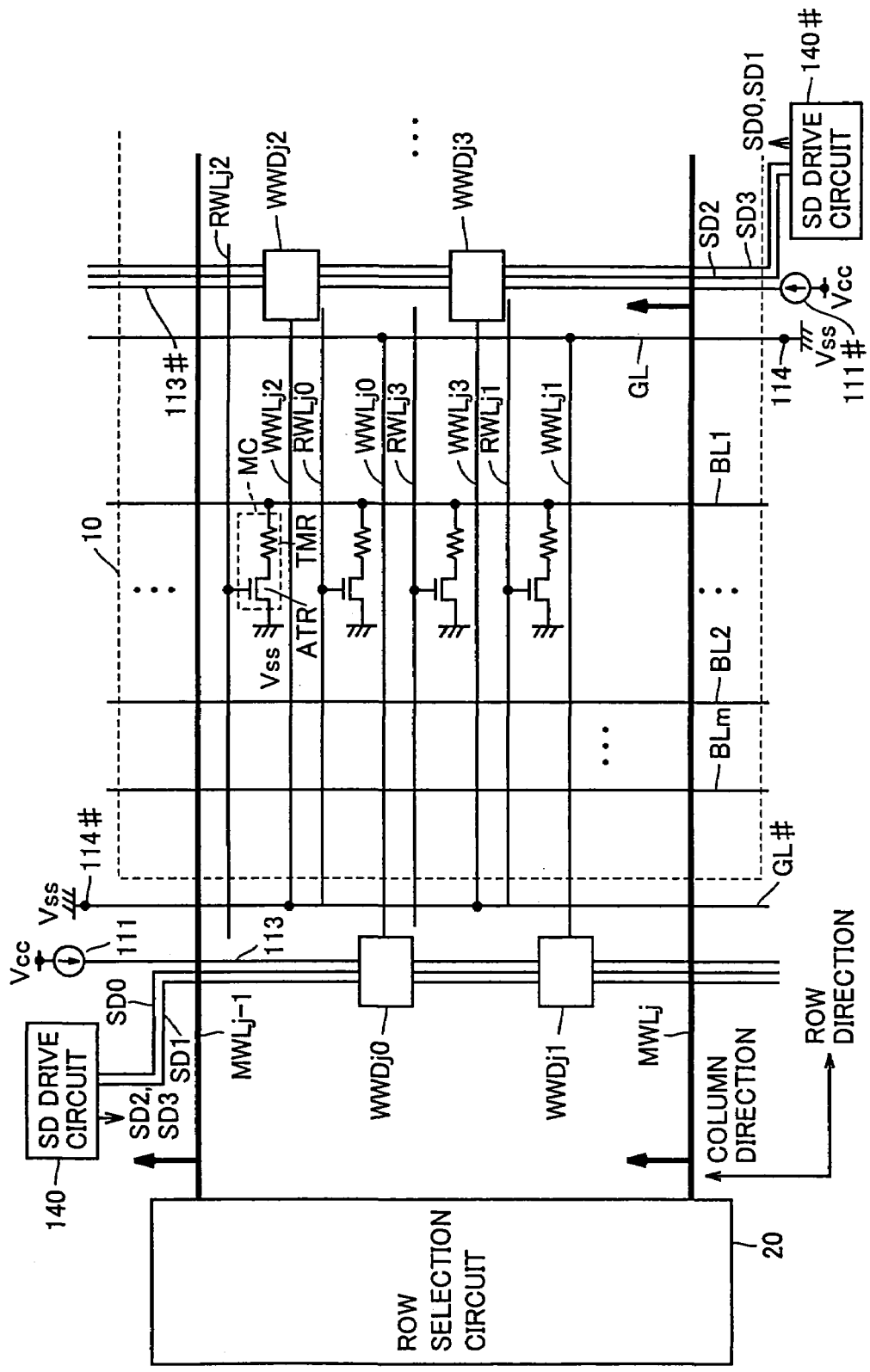
FIG. 5 is a block diagram illustrating a second example of the structure of circuitry for supplying a data write current and a magnetic-field canceling current according to the second embodiment.

FIG. 5 is a block diagram illustrating a second example of the structure of the circuitry for supplying a data write current and a magnetic-field canceling current according to the second embodiment.

Referring to FIG. 5, the second example of the second embodiment is different from the first example of FIG. 4 in that SD drive circuit 140, current source circuit 111 and ground node 114# are provided in a region opposite to that of SD drive circuit 140#, current source circuit 111# and ground node 114 with memory array 10 interposed therebetween. Since the structure of the second example is otherwise the same as that of FIG. 4, detailed description thereof will not be repeated.

In the structure of FIG. 5 as well, a data write current and a magnetic-field canceling current have opposite directions on sub decode signal lines SD0 to SD3, current lines 113, 113# and ground lines GL, GL# regardless of whether an odd row or an even row is selected. This structure enables reduction in magnetic disturbance to memory array 10 due to magnetic fields which are generated by data write current $I_{WW}$ and magnetic-field canceling current $\Delta I_{WW}$ from the current paths other than the write word lines. As a result, stable data write operation can be realized.

In the second example of FIG. 5, SD drive circuit 140 and current source circuit 111 are provided in a region opposite to that of ground node 114 with memory array 10 interposed therebetween. Moreover, SD drive circuit 140# and current source circuit 111# are provided in a region opposite to that of ground node 114# with memory array 10 interposed therebetween. This structure enables each of data write current $I_{WW}$ and magnetic-field canceling current $\Delta I_{WW}$ to have approximately the same current path length regardless of the position of the selected memory cell row.

Moreover, sub decode signal lines SD0 to SD3, current lines 113, 113# and ground lines GL, GL# are each designed to have the same electric resistance value per unit length. This enables each of data write current $I_{WW}$ and magnetic-field canceling current $\Delta I_{WW}$ to be supplied in a uniform amount regardless of the row selection result. This suppresses magnetic noises generated by data write current $I_{WW}$ and magnetic-field canceling current $\Delta I_{WW}$ from the current paths other than write word lines WWL, and enables further improvement in uniformity of write characteristics in memory array 10. As a result, more stable write operation can be realized.

Figure 6:
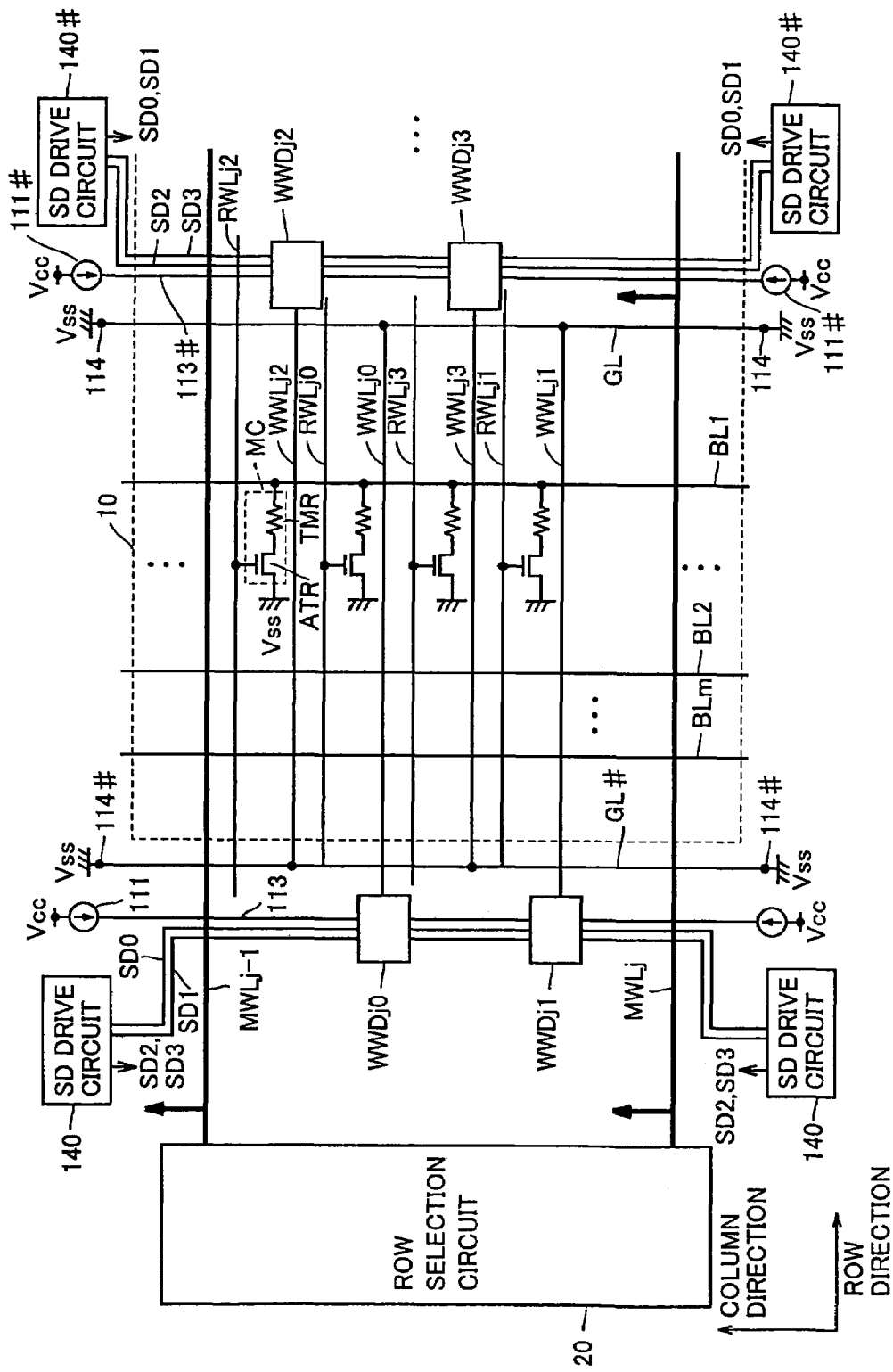
FIG. 6 is a block diagram illustrating a third example of the structure of circuitry for supplying a data write current and a magnetic-field canceling current according to the second embodiment.

FIG. 6 is a block diagram illustrating a third example of the structure of the circuitry for supplying a data write current and a magnetic-field canceling current according to the second embodiment.

Referring to FIG. 6, the third example of the second embodiment is different from the second example of FIG. 5 in that SD drive circuits 140 corresponding to even rows are provided at both ends of sub decode signal lines SD0, SD1. Similarly, current source circuits 111 are provided at both ends of current line 113. In other words, SD drive circuits 140 and current source circuits 111 are provided in regions located adjacent to each other in the column direction of memory array 10. Ground nodes 114 are provided at both ends of ground line GL.

Similarly, SD drive circuits 140# corresponding to odd rows are provided at both ends of sub decode signal lines SD2, SD3, and current source circuits 111 corresponding to odd rows are provided at both ends of current line 113#. Ground nodes 114# are provided at both ends of ground line GL#. Since the structure of the third example is otherwise the same as that of FIG. 5, detailed description thereof will not be repeated.

Like the second example of FIG. 5, the third example of FIG. 6 suppresses magnetic noises applied from sub decode signal lines SD0 to SD3, current lines 113, 113# and ground lines GL, GL# to memory array 10. Moreover, the third example of FIG. 6 enables each of data write current $I_{WW}$ and a uniform amount magnetic-field canceling current $\Delta I_{WW}$ to be supplied in a uniform amount regardless of the selection result of memory cell row.

Since a current is supplied from both sides of each signal line or each current line, the effective current path lengths of data write current $I_{WW}$ and magnetic-field canceling current $\Delta I_{WW}$ can be reduced as compared to the second example of FIG. 5. This enables further reduction in electric resistance of the current paths, and thus enables further reduction in current consumption.

Modification of Second Embodiment

In the first and second embodiments, SD drive circuits 140, 140# for driving sub decode signal lines SD0 to SD3 drive a data write current $I_{WW}$. However, a special current source circuit for data write current $I_{WW}$ may be provided and each write drive circuit may have only a decoding function.

Figure 7:
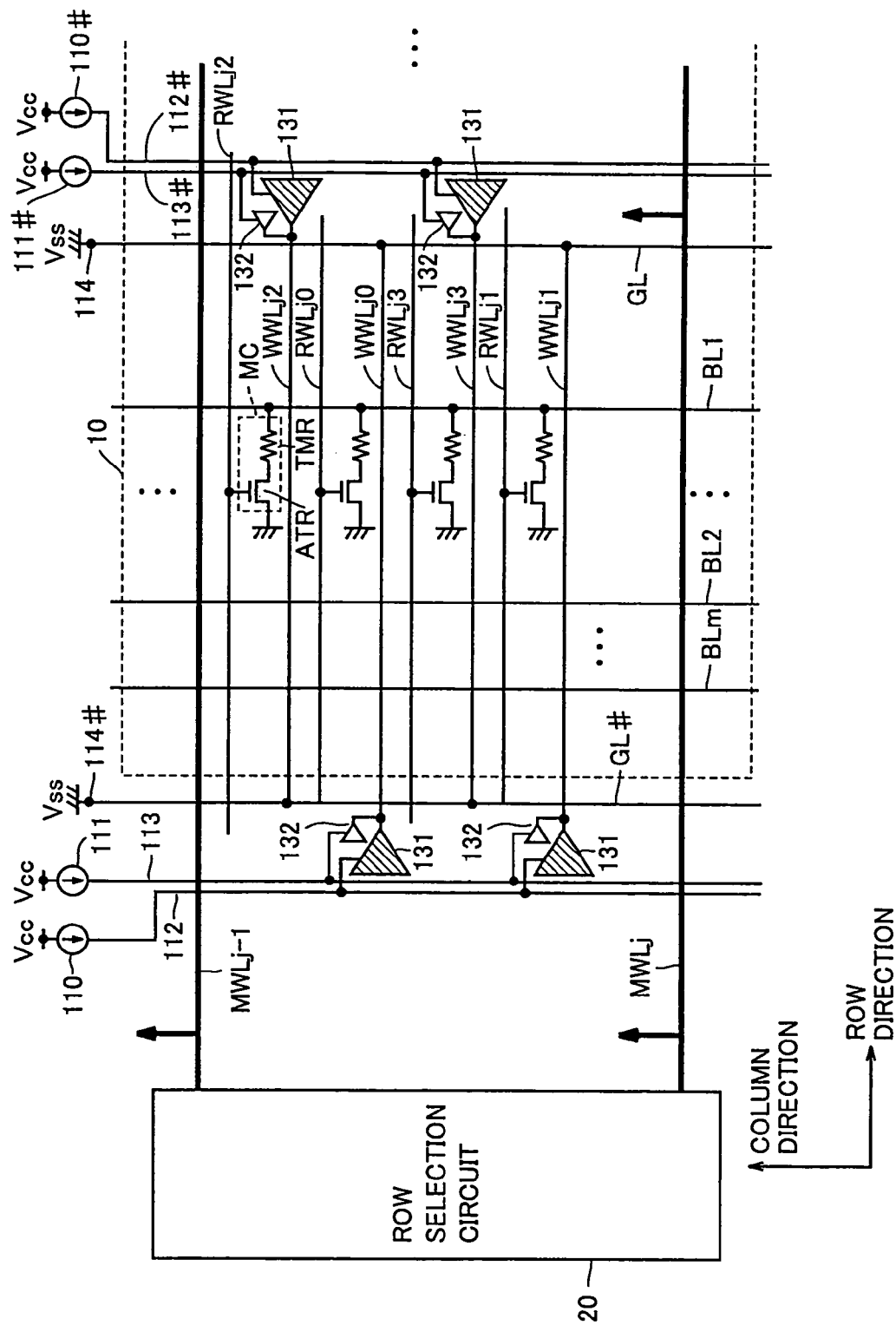
FIG. 7 is a block diagram illustrating a first example of the structure of circuitry for supplying a data write current and a magnetic-field canceling current according to a modification of the second embodiment.

FIG. 7 is a block diagram illustrating a first example of the structure of circuitry for supplying a data write current and a magnetic-field canceling current according to the modification of the second embodiment.

Referring to FIG. 7, the first example of the modification of the second embodiment is different from the example of FIG. 4 in that each write drive circuit WWD is replaced with write drive circuits 131, 132, and SD drive circuits 140, 140# are replaced with current source circuits 110, 111# for generating a data write current $I_{WW}$. In the structure of FIG. 7, a data write current $I_{WW}$ is supplied by current lines 112, 112# additionally provided in the column direction. Although sub decode signal lines SD0 to SD3 are not shown in the figure, these signal lines are provided as voltage lines for merely transmitting sub decode signals SD0 to SD3 to write drive circuits 131, 132.

Figure 8:
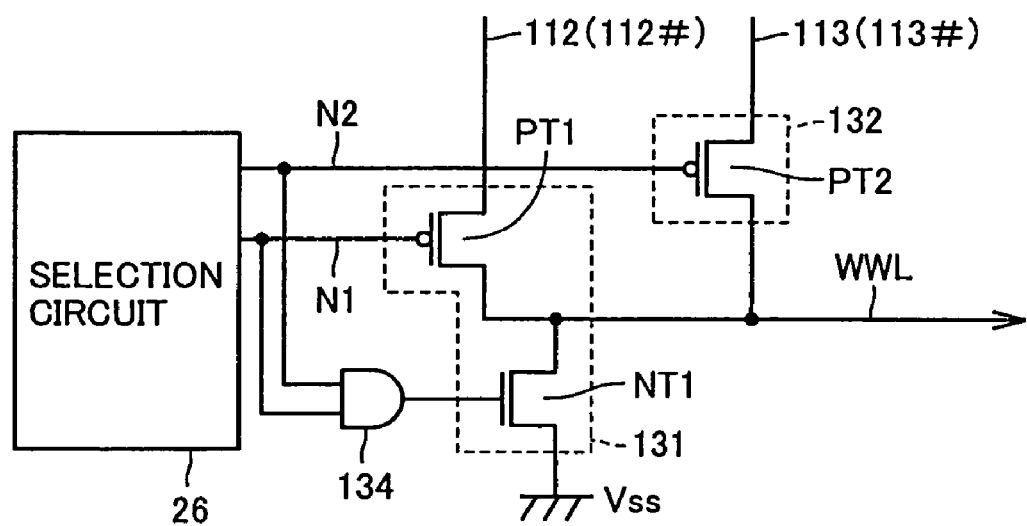
FIG. 8 is a circuit diagram showing the structure of a write drive circuit in FIG. 7.

FIG. 8 is a circuit diagram showing the structure of write drive circuits 131, 132 in FIG. 7.

Referring to FIG. 8, write drive circuit 131 includes driver transistors PT1, NT1. Driver transistor PT1 is connected between current line 112 (or 112#) and a corresponding write word line WWL. Driver transistor NT1 is connected between a corresponding write word line WWL and ground voltage $V_{SS}$. Write drive circuit 132 includes a driver transistor PT2 connected between current line 113 (or 113#) and a corresponding write word line WWL. P-channel MOS transistors are used as driver transistors PT1, PT2, and an N-channel MOS transistor is used as driver transistor NT1.

Driver transistor PT1 has its gate connected to a node N1, and driver transistor PT2 has its gate connected to a node N2. A logic gate 134 outputs the AND operation result of nodes N1, N3 to the gate of driver transistor NT1.

A selection circuit 26 sets node N1 to L level if a corresponding row is selected. Otherwise, selection circuit 26 sets node N1 to H level. Selection circuit 26 sets node N2 to L level if either a corresponding row or an adjacent row is selected. Otherwise, selection circuit 26 sets node N2 to H level. Selection circuit 26 corresponds to a part of function of row selection circuit 20.

Accordingly, if a corresponding row is selected, a data write current $I_{WW}$ is supplied to write word line WWL through driver transistors PT1, PT2. If an adjacent row is selected, a magnetic-field canceling current $\Delta I_{WW}$ is supplied only through driver transistor PT2. When both driver transistors PT1, PT2 are turned OFF, driver transistor NT1 is turned ON and fixes a corresponding write word line WWL to ground voltage $V_{SS}$.

Referring back to FIG. 7, the current amount generated by current source circuits 110, 111 is the same as that of driver transistors 101 (101#), 102 (102#) of FIG. 2, respectively.

Alternatively, node N2 may be set to L level only if an adjacent row is selected. In this case, a data write current may be supplied by driver transistor PT1 and a magnetic-field canceling current may be supplied by driver transistor PT2. In this case, current source circuits 110, 111 of FIG. 7 need only be designed to supply a current in an amount according to data write current $I_{WW}$ and magnetic-field canceling current $\Delta I_{WW}$.

In this way, a commonly used structure may be used by modifying the structure of the write drive circuit. In other words, a data write current $I_{WW}$ may be supplied by current source circuits 110, 110#. As in the case of FIG. 5, this structure enables further reduction in magnetic disturbance to memory array 10 due to magnetic fields which are generated by data write current $I_{WW}$ and magnetic-field canceling current $\Delta I_{WW}$ from the current paths other than the write word lines. As a result, stable write operation can be realized.

Figure 9:
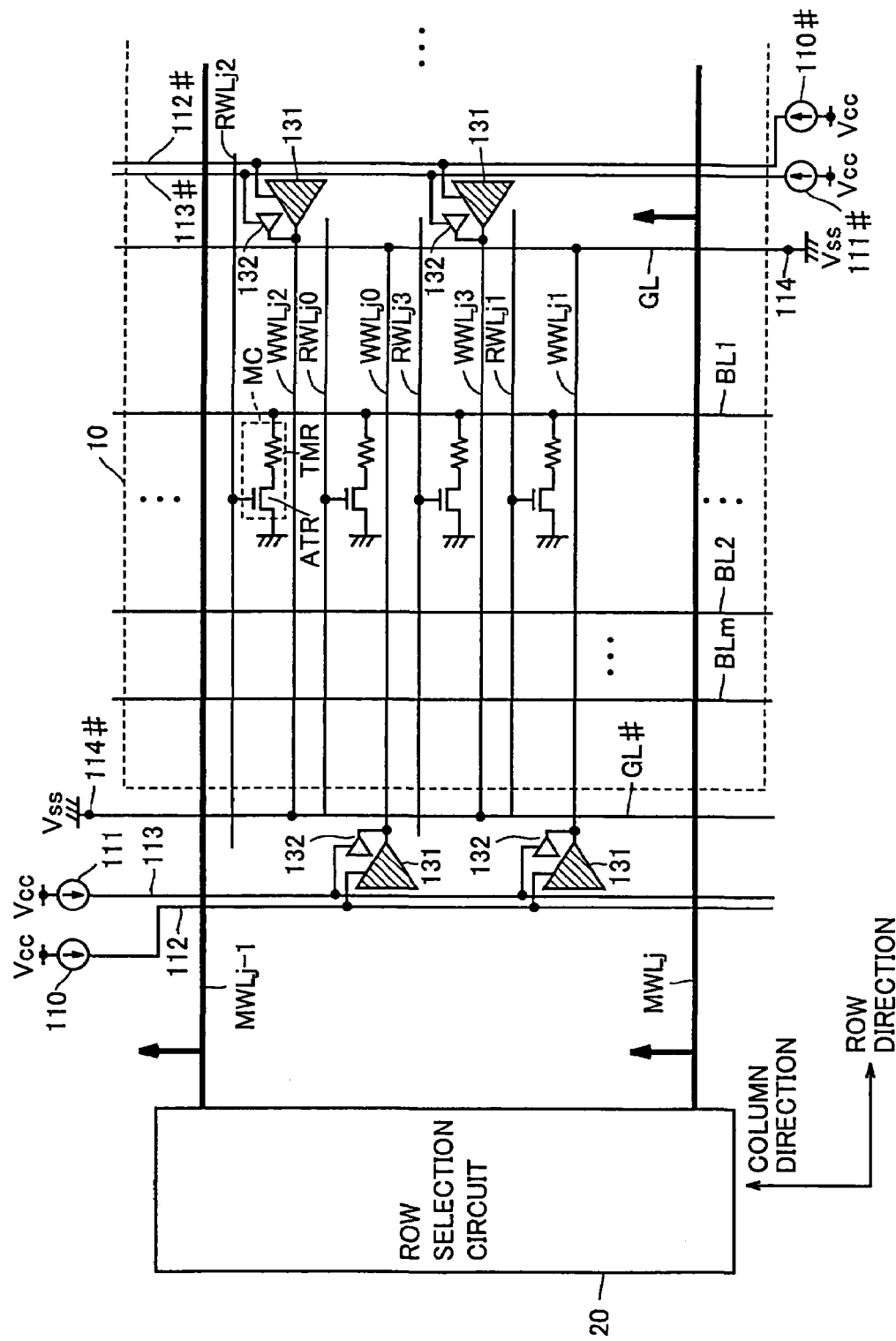
FIG. 9 is a block diagram illustrating a second example of the structure of circuitry for supplying a data write current and a magnetic-field canceling current according to the modification of the second embodiment.

FIG. 9 is a block diagram illustrating a second example of the structure of the circuitry for supplying a data write current and a magnetic-field canceling current according to the modification of the second embodiment.

Referring to FIG. 9, the second example of the modification of the second embodiment is different from the structure of FIG. 5 in that each write drive circuit WWDj0 to WWDj3 is replaced with write drive circuits 131, 132; SD drive circuits 140, 140# are replaced with current source circuits 110, 110#, and a data write current is supplied by additional current lines 112, 112#. Since the above differences are the same as those between the structures of FIGS. 4 and 7, detailed description thereof will not be repeated. Moreover, since the structure of FIG. 9 is otherwise the same as that of FIG. 5, detailed description thereof will not be repeated.

In this example, a commonly used structure is used by modifying the structure of the write drive circuit. In other words, a data write current $I_{WW}$ is supplied by current source circuits 110, 110#. As in the case of FIG. 5, this structure enables each of data write current $I_{WW}$ and magnetic-field canceling current $\Delta I_{WW}$ to have approximately the same current path length regardless of the position of the selected memory cell row.

Moreover, current lines 112, 112#, current lines 113, 113# and ground lines GL, GL# are each designed to have the same electric resistance value per unit length. This enables each of data write current $I_{WW}$ and magnetic-field canceling current $\Delta I_{WW}$ to be supplied in a uniform amount regardless of the selection result of memory cell row.

This suppresses magnetic noises generated by data write current $I_{WW}$ and magnetic-field canceling current $\Delta I_{WW}$ from the current paths other than the write word lines, and enables further improvement in uniformity of write characteristics in memory array 10.

Figure 10:
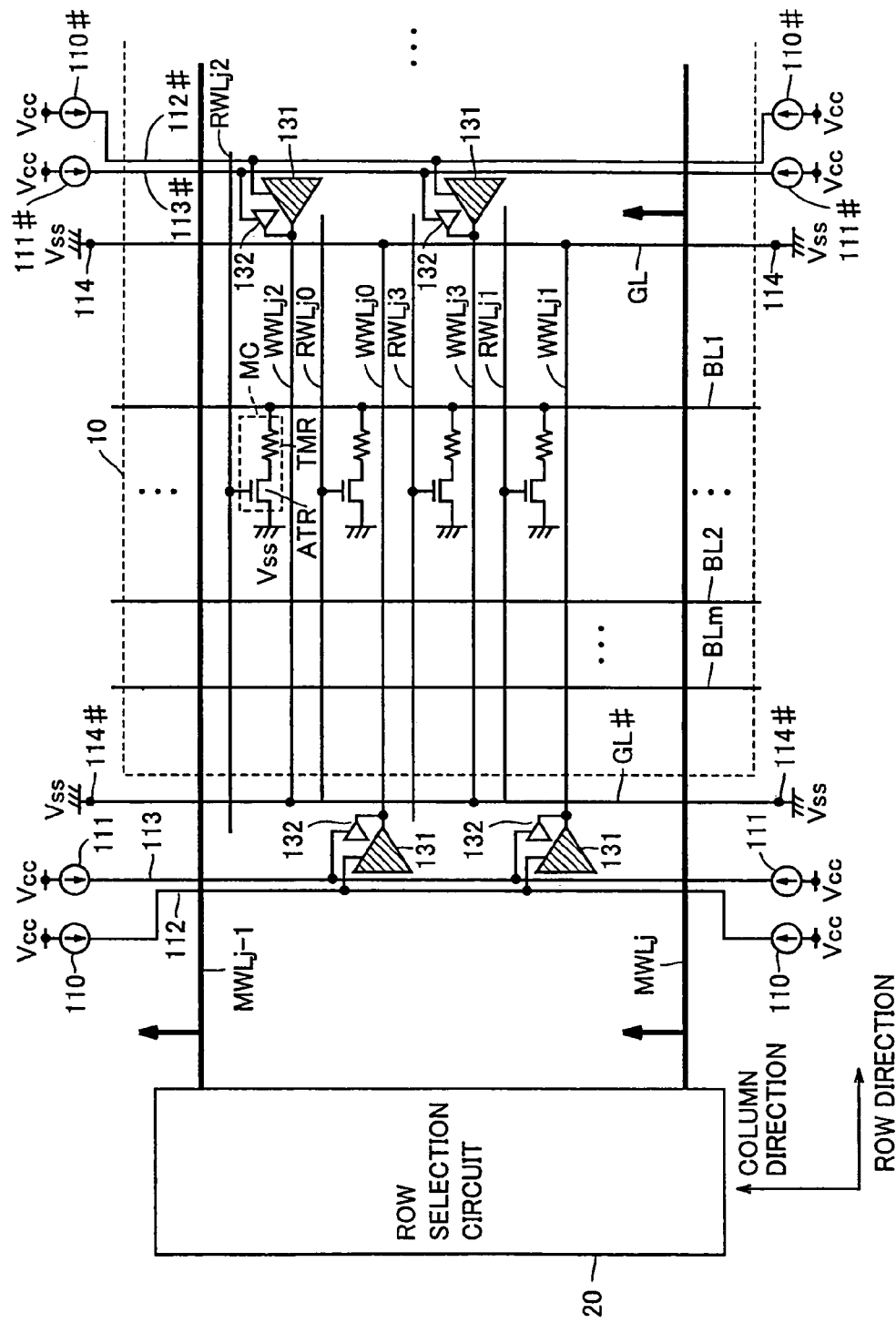
FIG. 10 is a block diagram illustrating a third example of the structure of circuitry for supplying a data write current and a magnetic-field canceling current according to the modification of the second embodiment.

FIG. 10 is a block diagram showing a third example of the structure of the circuitry for supplying a data write current and a magnetic-field canceling current according to the modification of the second embodiment.

Referring to FIG. 10, the third example of the modification of the second embodiment is different from the structure of FIG. 6 in that each write drive circuit WWDj0 to WWDj3 is replaced with write drive circuits 131, 132, SD drive circuits 140, 140# are replaced with current source circuits 110, 110#, and a data write current is supplied by additional current lines 112, 112#. Since the above differences are the same as those between the structures of FIGS. 4 and 7, detailed description thereof will not be repeated. Moreover, since the structure of FIG. 10 is otherwise the same as that of FIG. 6, detailed description thereof will not be repeated.

In this example, a commonly used structure is used by modifying the structure of the write drive circuit. In other words, a data write current $I_{WW}$ is supplied by current source circuits 110, 110#. In this structure as well, the same effects as those obtained by the structure of FIG. 6 can be obtained. More specifically, in addition to the effects obtained by the structure of FIG. 9, the effective current path lengths of data write current $I_{WW}$ and magnetic-field canceling current $\Delta I_{WW}$ can be reduced, enabling further reduction in current consumption.

Third Embodiment

In the third embodiment, memory array 10 or each memory block MB is divided into a plurality of banks in the second embodiment and the modification thereof.

Figure 11:
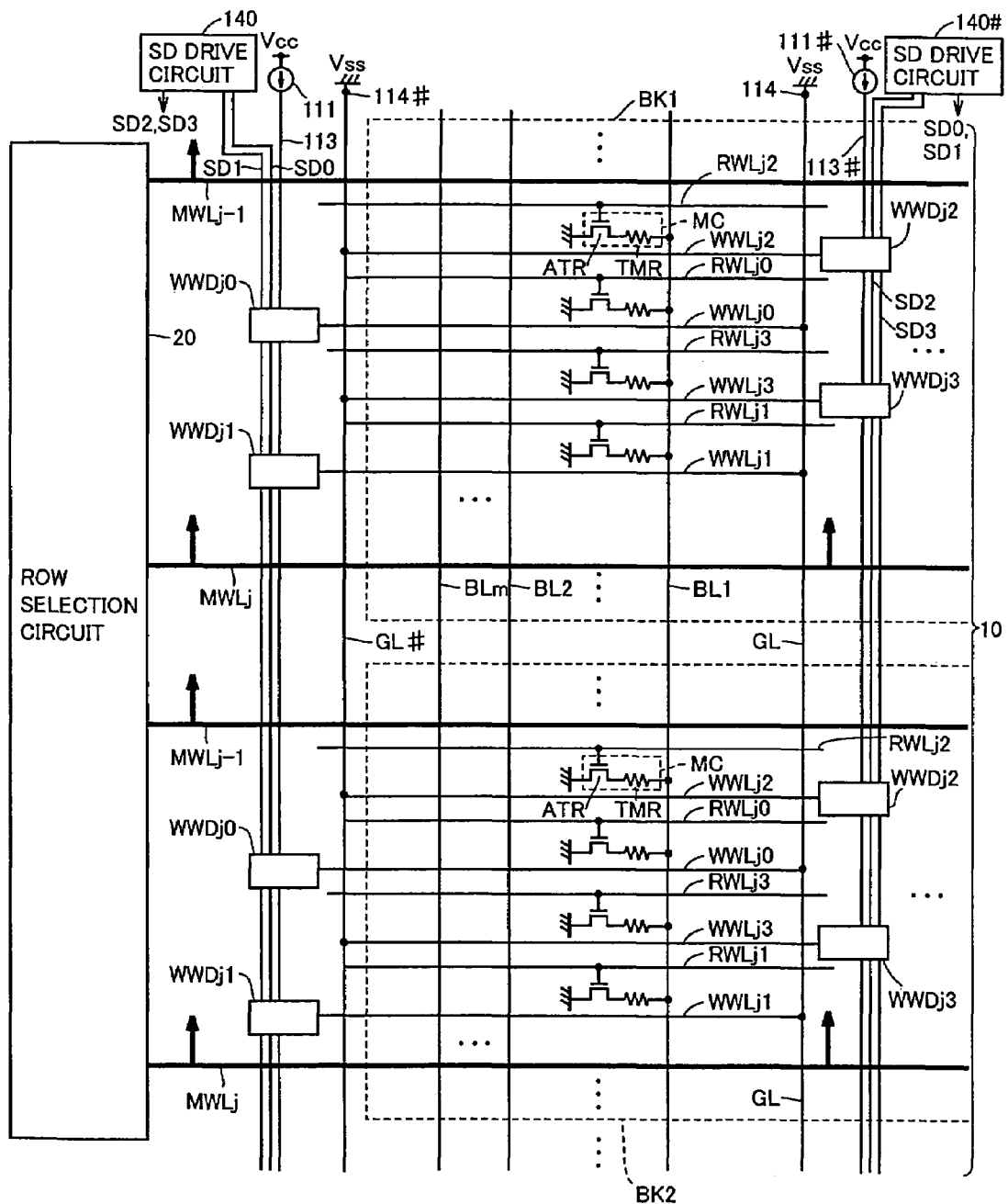
FIG. 11 is a block diagram illustrating a first example of the structure of circuitry for supplying a data write current and a magnetic-field canceling current according to a third embodiment of the present invention.

FIG. 11 is a block diagram illustrating a first example of the structure of circuitry for supplying a data write current and a magnetic-field canceling current according to the third embodiment.

Referring to FIG. 11, in the third embodiment, memory array 10 is divided into a plurality of banks BK1, BK2, ... along the row direction. Hereinafter, banks BK1, BK2, ... are sometimes generally referred to as banks BK.

Each bank BK has the same structure as that of memory block MB in the first and second embodiments. Alternatively, each of a plurality of memory blocks MB in memory array 10 may be divided into a plurality of banks BK. Data can be simultaneously written to a plurality of banks located adjacent to each other in the column direction. For example, write operation can be conducted by selecting a single memory cell row in each bank BK.

In the third embodiment, SD drive circuits 140, 140#, sub decode signal lines SD0 to SD3, current source circuits 111, 111#, current lines 113, 113#, ground lines GL, GL# and ground nodes 114, 114# are shared by a plurality of banks located adjacent to each other in the column direction. Hereinafter, these circuits and wirings for supplying a data write current and a magnetic-field canceling current to memory array 10 are sometimes collectively referred to as "write power supply circuitry". Since arrangement of the write power supply circuitry in FIG. 11 is the same as that of FIG. 4, detailed description thereof will not be repeated.

Sub decode signal lines SD0 to SD3, current lines 113, 113#, and ground lines GL, GL# are arranged so as to be shared by a plurality of banks along the column direction. SD drive circuits 140, 140#, current source circuits 111, 111# and ground nodes 114, 114# are provided in one of two regions located adjacent to memory array 10 in the column direction.

In the third embodiment, a data write current is supplied to a plurality of write word lines WWL and a magnetic-field canceling current is supplied to adjacent rows by using common write power supply circuitry. As a result, a data write current and a magnetic-field canceling current can be efficiently supplied to a plurality of banks while obtaining the same effects as those obtained by the structure of FIG. 4.

Figure 12:
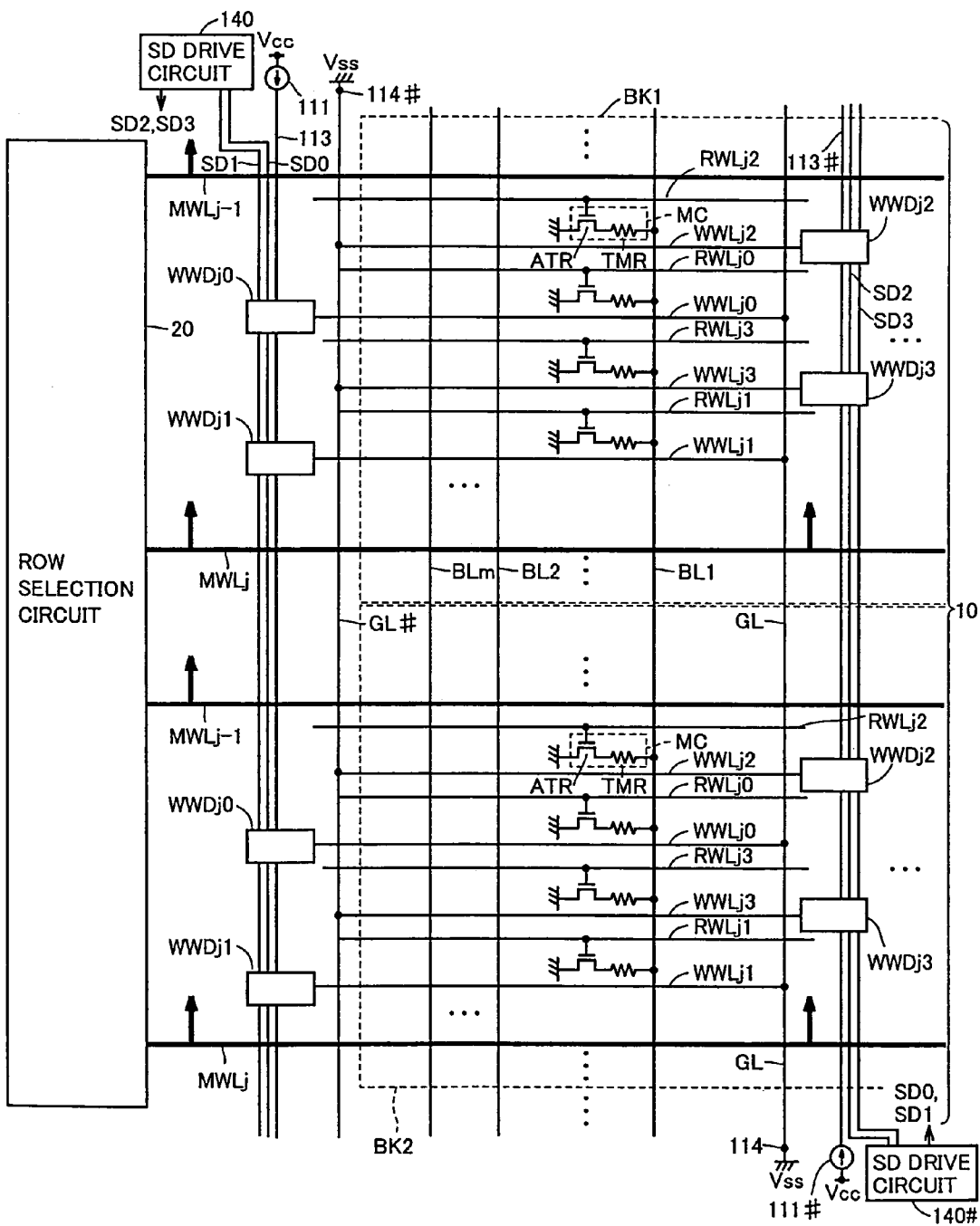
FIG. 12 is a block diagram illustrating a second example of the structure of circuitry for supplying a data write current and a magnetic-field canceling current according to the third embodiment.

FIG. 12 is a block diagram illustrating a second example of the structure of the circuitry for supplying a data write current and a magnetic-field canceling current according to the third embodiment.

Referring to FIG. 12, the second example of the third embodiment is different from the first example of FIG. 11 in arrangement of the write power supply circuitry. More specifically, the write power supply circuitry is provided in the same manner as that of FIG. 5, and is shared by a plurality of banks located adjacent to each other in the column direction. Since the structure of the second example is otherwise the same as that of FIG. 11, detailed description thereof will not be repeated.

Accordingly, in the structure of FIG. 12, a data write current and a magnetic-field canceling current can be efficiently supplied to a plurality of banks while obtaining the same effects as those obtained by the structure of FIG. 5.

Figure 13:
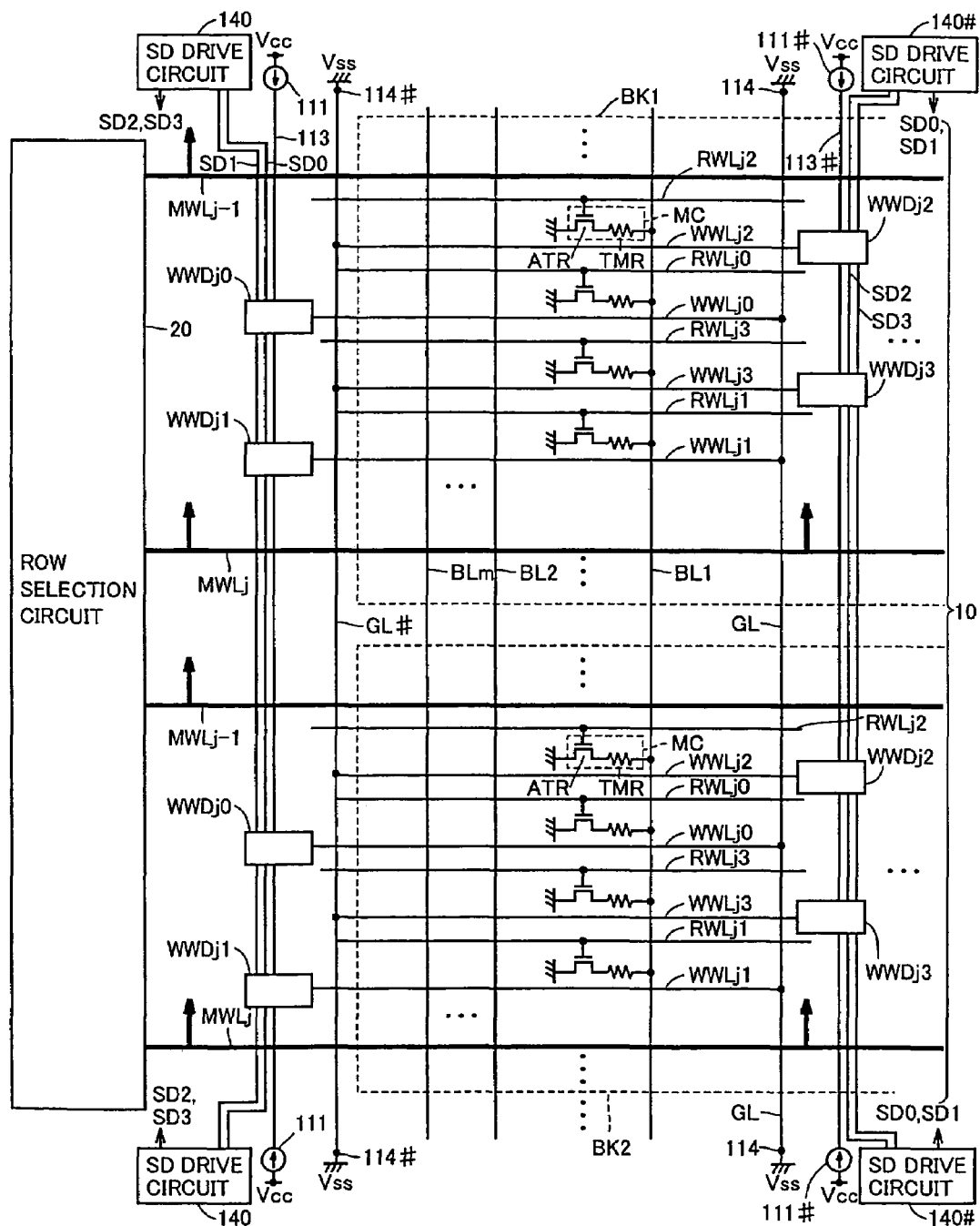
FIG. 13 is a block diagram illustrating a third example of the structure of circuitry for supplying a data write current and a magnetic-field canceling current according to the third embodiment.

FIG. 13 is a block diagram illustrating a third example of the structure of the circuitry for supplying a data write current and a magnetic-field canceling current according to the third embodiment.

Referring to FIG. 13, the third example of the third embodiment is different from the first example of FIG. 11 in arrangement of the write power supply circuitry. More specifically, the write power supply circuitry is provided in the same manner as that of FIG. 6, and is shared by a plurality of banks located adjacent to each other in the column direction. Since the structure of the third example is otherwise the same as that of FIG. 11, detailed description thereof will not be repeated.

Accordingly, in the structure of FIG. 13, a data write current and a magnetic-field canceling current can be efficiently supplied to a plurality of banks while obtaining the same effects as those obtained by the structure of FIG. 6.

Figure 14:
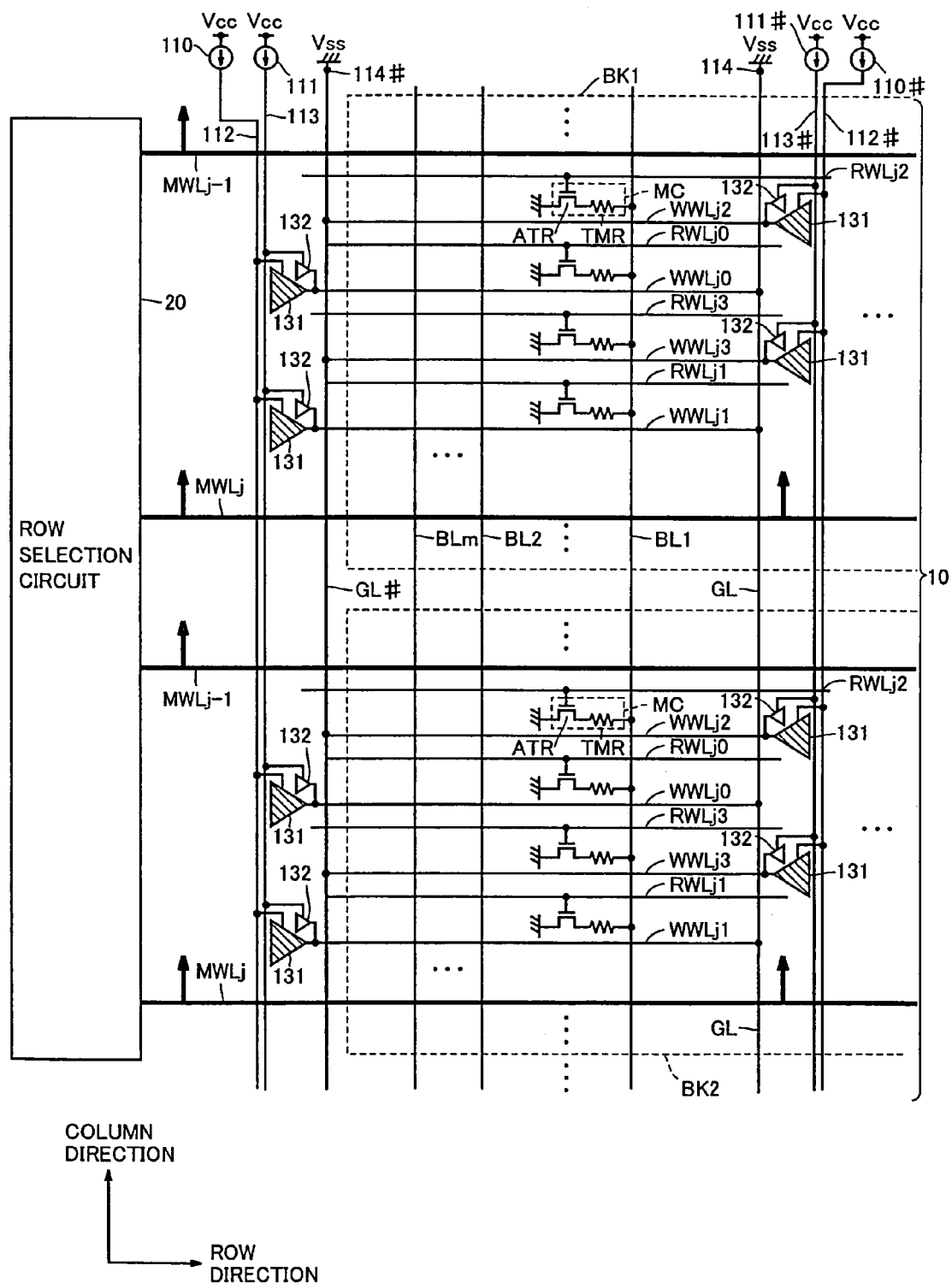
FIG. 14 is a block diagram illustrating a fourth example of the structure of circuitry for supplying a data write current and a magnetic-field canceling current according to the third embodiment.

FIG. 14 is a block diagram illustrating a fourth example of the structure of the circuitry for supplying a data write current and a magnetic-field canceling current according to the third embodiment.

Referring to FIG. 14, the fourth example of the third embodiment is different from the first example of FIG. 11 in that each write drive circuit WWDj0 to WWDj3 is replaced with write drive circuits 131, 132, SD drive circuits 140, 140# are replaced with current source circuits 110, 110#, and a data write current is supplied by additional current lines 112, 112#. Since the above differences are the same as those between the structures of FIGS. 4 and 7, detailed description thereof will not be repeated.

In the structure of FIG. 14, the write power supply circuitry includes current source circuits 110, 110#, current source circuits 111, 111#, current lines 112, 112#, current lines 113, 113#, and ground lines GL, GL#. The write power supply circuitry is provided in the same manner as that of FIG. 7, and is shared by a plurality of banks located adjacent to each other in the column direction. Since the structure of FIG. 14 is otherwise the same as that of FIG. 11, detailed description thereof will not be repeated.

Accordingly, in the structure of FIG. 14, a data write current and a magnetic-field canceling current can be efficiently supplied to a plurality of banks while obtaining the same effects as those obtained by the structure of FIG. 7.

Figure 15:
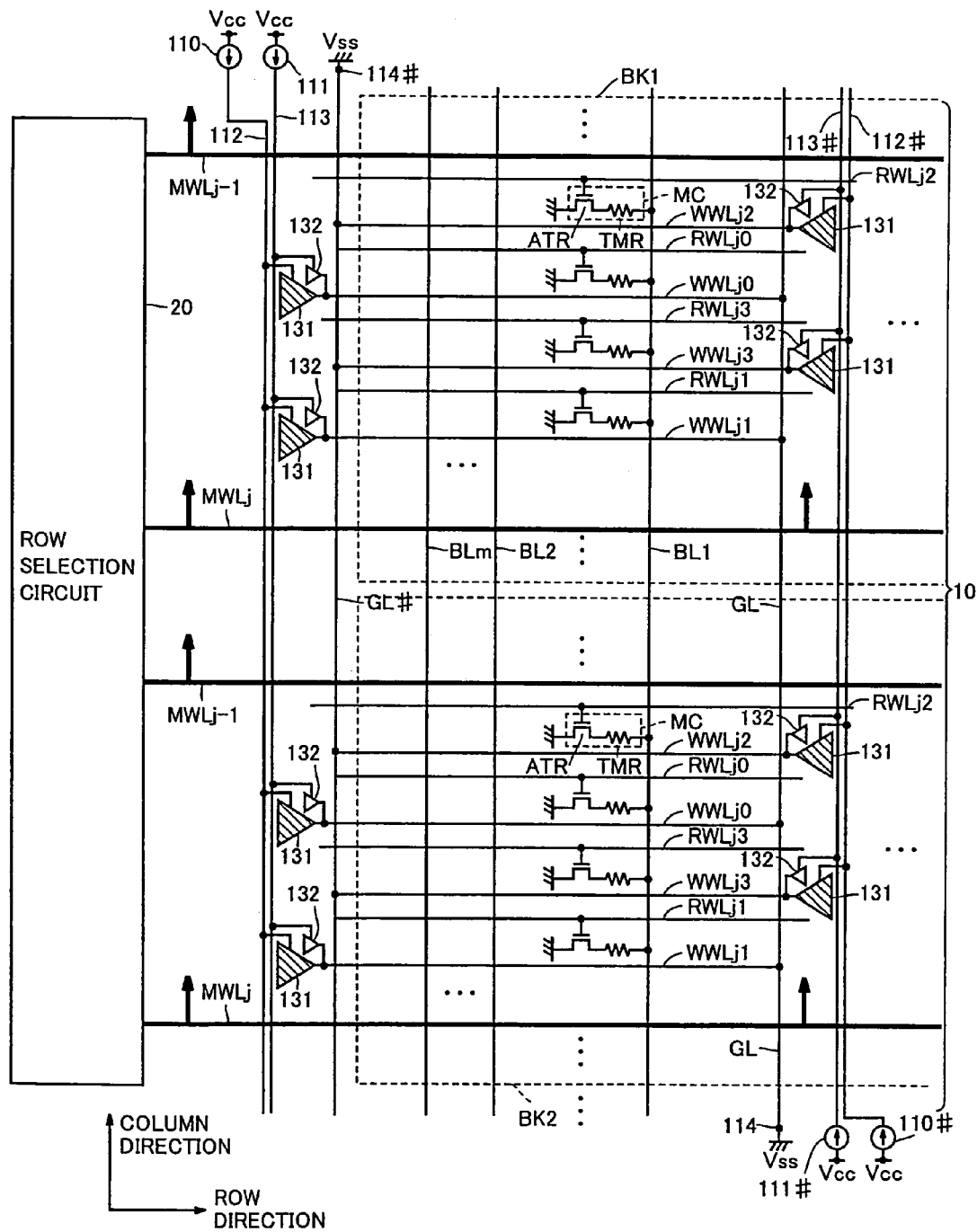
FIG. 15 is a block diagram illustrating a fifth example of the structure of circuitry for supplying a data write current and a magnetic-field canceling current according to the third embodiment.

FIG. 15 is a block diagram showing a fifth example of the structure of the circuitry for supplying a data write current and a magnetic-field canceling current according to the third embodiment.

Referring to FIG. 15, the fifth example of the third embodiment is different from the fourth example of FIG. 14 in arrangement of the write power supply circuitry. The write power supply circuitry is provided in the same manner as that of FIG. 9, and is shared by a plurality of banks located adjacent to each other in the column direction. Since the structure of the fifth example is otherwise the same as that of FIG. 14, detailed description thereof will not be repeated.

Accordingly, in the structure of FIG. 15, a data write current and a magnetic-field canceling current can be efficiently supplied to a plurality of banks while obtaining the same effects as those obtained by the structure of FIG. 9.

Figure 16:
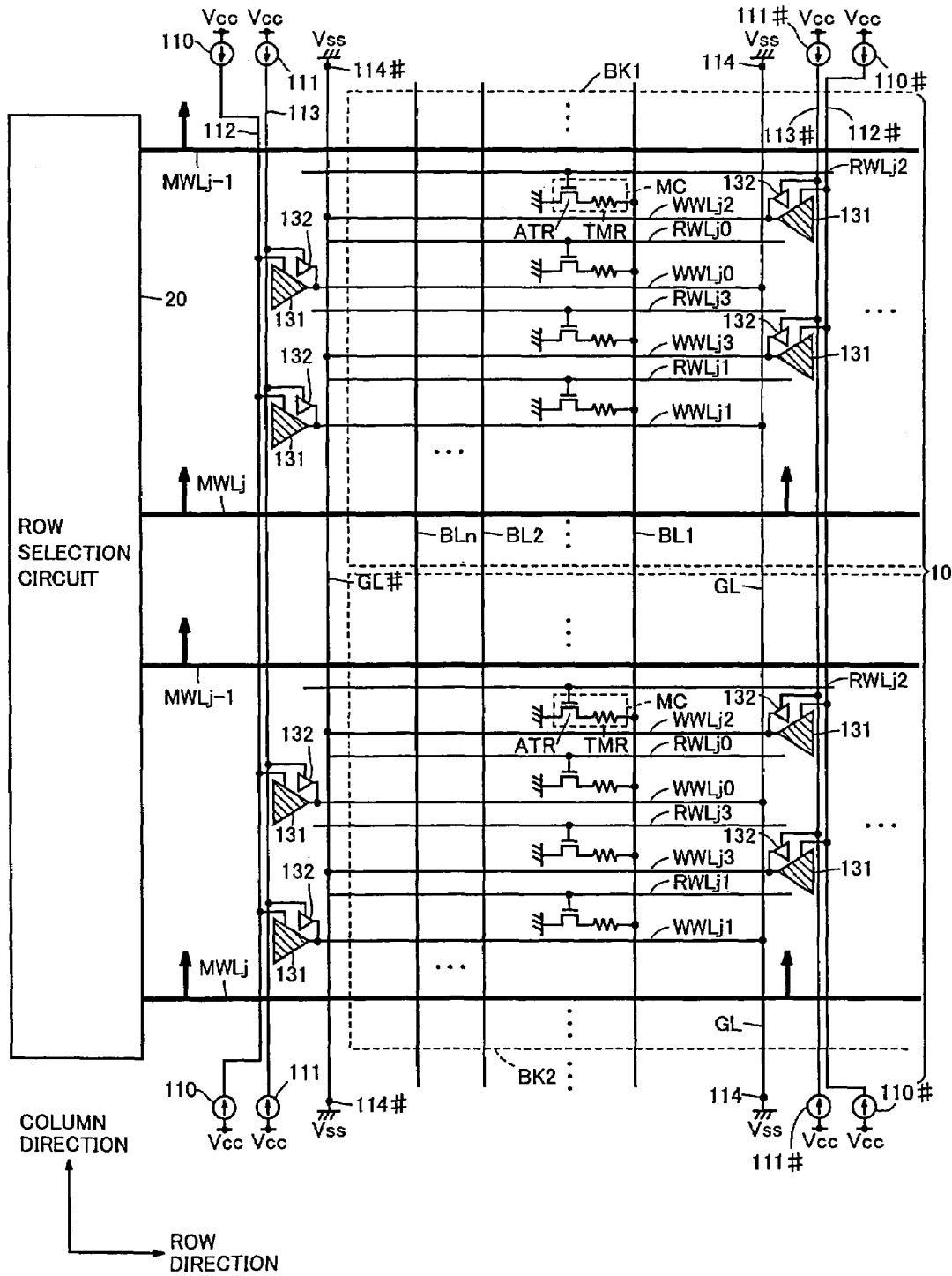
FIG. 16 is a block diagram illustrating a sixth example of the structure of circuitry for supplying a data write current and a magnetic-field canceling current according to the third embodiment.

FIG. 16 is a block diagram illustrating a sixth example of the structure of the circuitry for supplying a data write current and a magnetic-field canceling current according to the third embodiment.

Referring to FIG. 16, the sixth example of the third embodiment is different from the fourth example of FIG. 14 in arrangement of the write power supply circuitry. The write power supply circuitry is provided in the same manner as that of FIG. 10, and is shared by a plurality of banks located adjacent to each other in the column direction. Since the structure of the sixth example is otherwise the same as that of FIG. 14, detailed description thereof will not be repeated.

Accordingly, in the structure of FIG. 16, a data write current and a magnetic-field canceling current can be efficiently supplied to a plurality of banks while obtaining the same effects as those obtained by the structure of FIG. 10.

As has been described above, according to the third embodiment, circuitry for supplying a data write current is shared by a plurality of banks to which data can be written simultaneously. Moreover, the third embodiment suppresses magnetic noises applied to memory array 10 and enables each of a data write current and a magnetic-field canceling current to be supplied in a uniform amount. As a result, stable write operation can be realized.

Fourth Embodiment

In the fourth embodiment, the structure of the write drive circuit which can be efficiently provided in small area will be described.

Figure 17:
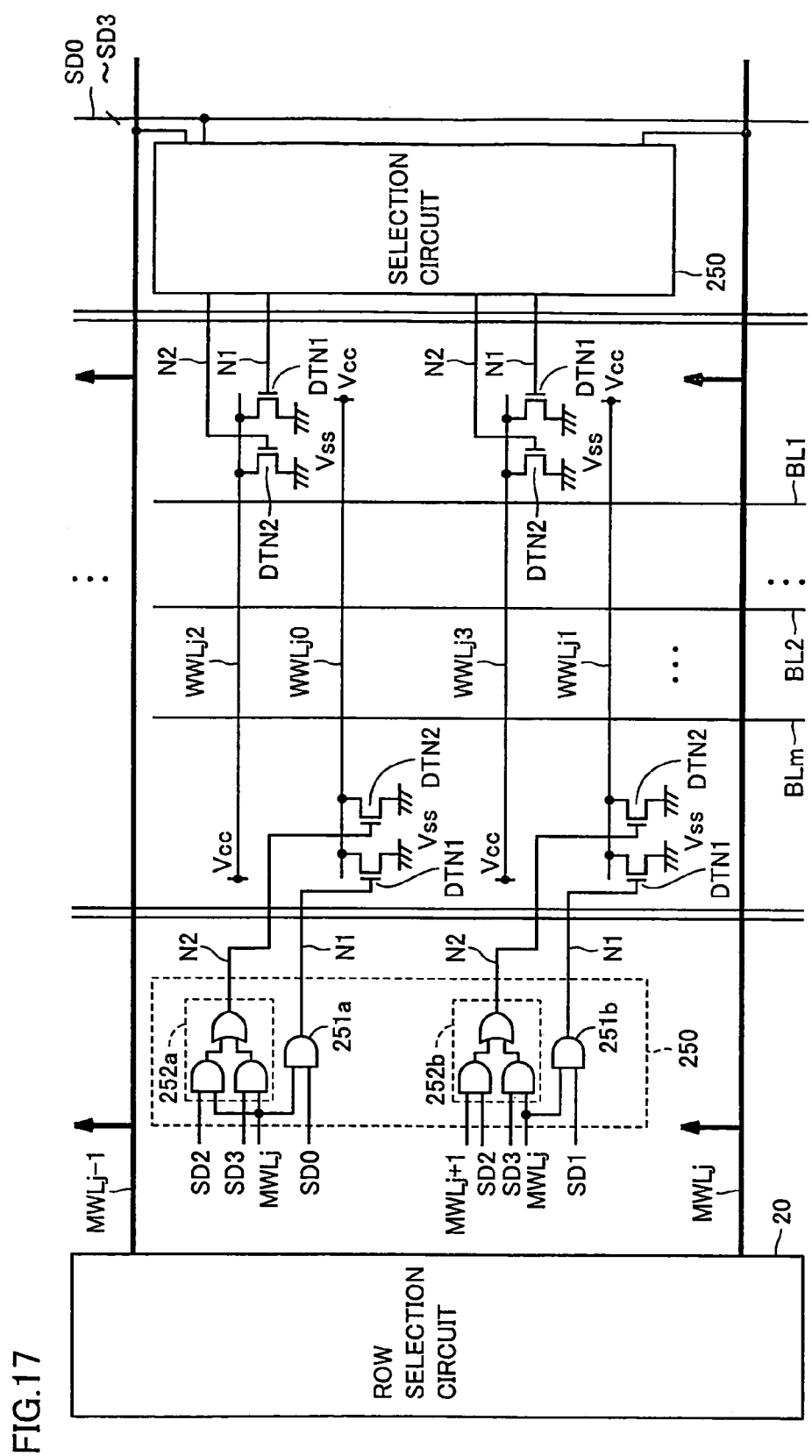
FIG. 17 is a circuit diagram showing an example of the structure of a write drive circuit according to a fourth embodiment of the present invention.

FIG. 17 shows an example of the structure of a write drive circuit according to the fourth embodiment. In the fourth embodiment, row selection is conducted in a hierarchical manner by a main word line MWL and a write word line WWL as in the case of the first embodiment.

Referring to FIG. 17, one end of each write word line WWL is connected to power supply voltage $V_{CC}$ regardless of the row selection result. The other end of each write word line WWL is connected to ground voltage $V_{SS}$ through driver transistors DTN1, DTN2. N-channel MOS transistors are used as driver transistors DTN1, DTN2. Like write drive circuit WWD of the first embodiment and the like, driver transistors DTN1, DTN2 are provided alternately in every row.

More specifically, in even rows (write word lines WWLj0, WWLj1), driver transistors DTN1, DTN2 are provided between one end of write word line WWL (the end located closer to row selection circuit 20) and ground voltage $V_{SS}$. The other end of write word line WWL (the end located away from row selection circuit 20) is connected to power supply voltage $V_{CC}$. On the other hand, in odd rows (write word lines WWLj2, WWLj3), one end of write word line WWL (the end located closer to row selection circuit 20) is connected to power supply voltage $V_{CC}$. Driver transistors DTN1, DTN2 are provided between the other end of write word line WWL (the end located away from row selection circuit 20) and ground voltage $V_{SS}$. Driver transistors DTN1, DTN2 are designed to have current driving capability corresponding to a data write current $I_{WW}$ and a magnetic-field canceling current $\Delta I_{WW}$, respectively.

Driver transistors DTN1, DTN2 have their gates connected to corresponding nodes N1, N2, respectively. The voltages of nodes N1, N2 are controlled by a corresponding selection circuit 250. FIG. 17 exemplary shows the structure of the selection circuit corresponding to write word lines WWLj0, WWLj1 of even rows.

Selection circuit 250 includes logic gates 251a, 251b and logic circuits 252a, 252b. Logic gate 251a outputs the AND operation result of the voltage level of main word line MWLj and sub decode signal SD0 to node N1. Logic circuit 252b has two AND gates and an OR gate. One of the two AND gates outputs the AND operation result of the voltage level of main word line MWLj and sub decode signal SD2. The other AND gate outputs the AND operation result of the voltage level of main word line MWLj and sub decode signal SD3. The OR gate outputs the OR operation result of the outputs of the two AND gates to node N2.

Similarly, logic gate 251b outputs the AND operation result of the voltage level of main word line MWLj and sub decode signal SD1 to node N1. Logic circuit 252b has two AND gates and an OR gate. One of the two AND gates outputs the AND operation result of the voltage level of main word line MWLj+1 and sub decode signal SD2. The other AND gate outputs the AND operation result of the voltage level of main word line MWLj and sub decode signal SD3. The OR gate outputs the OR operation result of the outputs of the two AND gates to node N2.

Accordingly, node N1 is set to H level if a corresponding row is selected. Otherwise, node N1 is set to L level. Node N2 is set to H level if an adjacent row is elected. Otherwise, node N2 is set to L level.

In the selected row, driver transistor DTN1 is turned ON, and a data write current $I_{WW}$ is supplied to write word line WWL of the selected row by driver transistor DTN1 in the direction from power supply voltage $V_{CC}$ toward ground voltage $V_{SS}$. Moreover, in adjacent rows, driver transistor DTN2 is turned ON, and a magnetic-field canceling current $\Delta I_{WW}$ is supplied to write word lines WWL of the adjacent rows by driver transistor DTN2 in the direction opposite to that of write word line WWL of the selected row.

Both nodes N1, N2 are set to L level if a corresponding row is neither a selected row nor an adjacent row. Therefore, both driver transistors DTN1, DTN2 are turned ON, whereby write word line WWL is fixed to power supply voltage $V_{CC}$.

A canceling magnetic-field is thus generated in the same manner as that of the first embodiment. This structure enables suppression of magnetic disturbance to the non-selected memory cells caused by a data write current flowing through the write word line of the selected row.

Moreover, each driver transistor is formed by an N-channel MOS transistor having greater current driving capability per unit size than a P-channel MOS transistor. This enables reduction in area of the write drive circuit.

Figure 18:
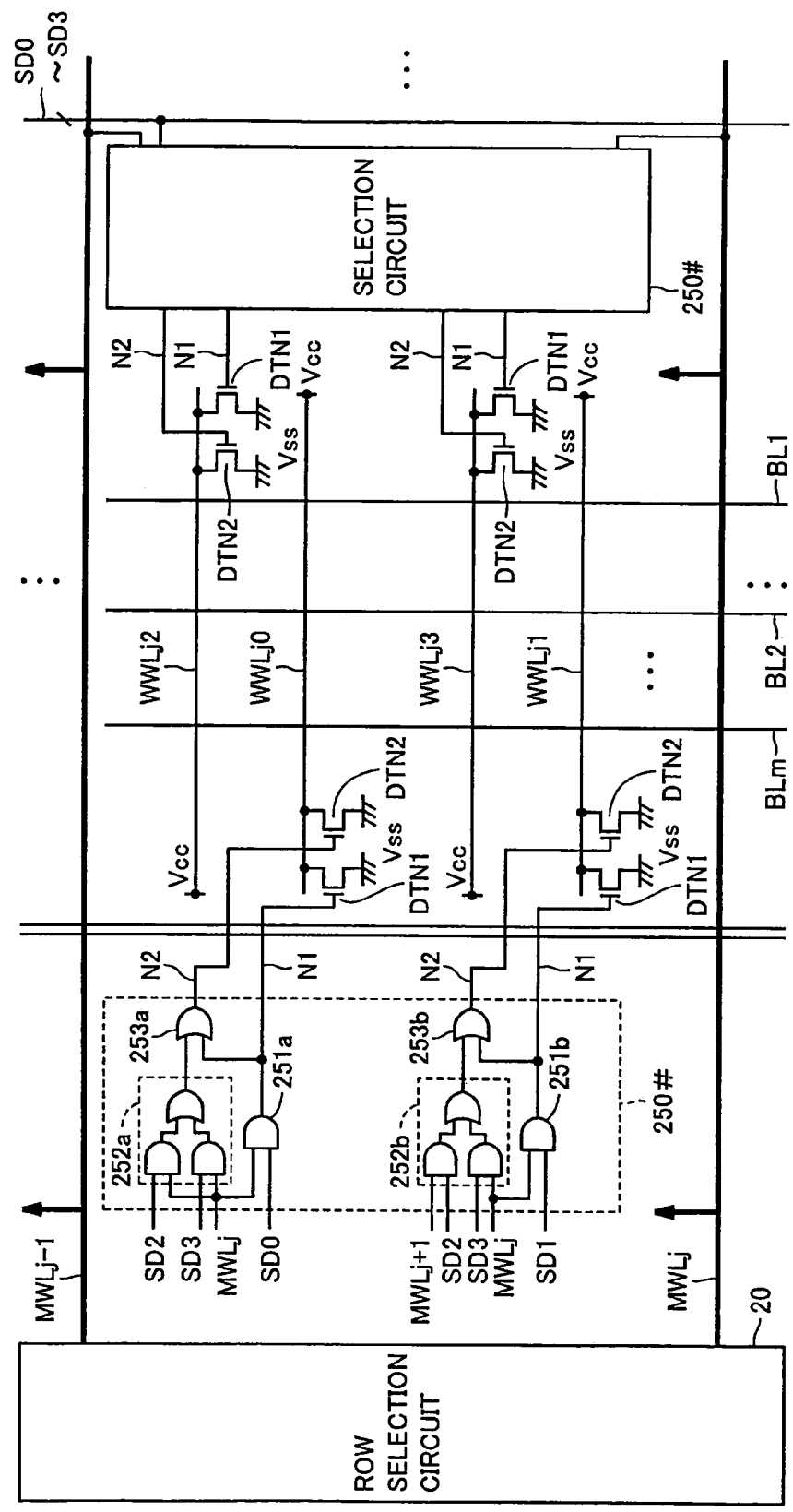
FIG. 18 is a circuit diagram showing another example of the structure of a write drive circuit according to the fourth embodiment.

FIG. 18 shows another example of the structure of the write drive circuit according to the fourth embodiment.

The write drive circuit of FIG. 18 is different from that of FIG. 17 in that the sum of currents passing through driver transistors DTN1, DTN2 is supplied as a data write current $I_{WW}$.

More specifically, in the example of FIG. 18, each selection circuit 250 of FIG. 17 is replaced with a selection circuit 250#. In addition to the elements of selection circuit 250, selection circuit 250# includes a logic gate in each memory cell row. Each logic gate outputs the OR operation result of the outputs of a corresponding logic gate (e.g., 251a, 251b) and a corresponding logic circuit (252a, 252b) to node N2. FIG. 18 exemplary shows logic gates 253a, 253b corresponding to write word lines WLj0, WWLj1.

Accordingly, node N1 is set to H level if a corresponding row is selected. On the other hand, node N2 is set to H level if a corresponding row is either a selected row or an adjacent row.

Accordingly, both driver transistors DTN1, DTN2 are turned ON if a corresponding row is selected. Only driver transistor DTN2 is turned ON if a corresponding row is an adjacent row. Both driver transistors DTN1, DTN2 are turned OFF if a corresponding row is neither a selected row nor an adjacent row.

In other words, driver transistors DTN1, DTN2 have the same current driving capability as that of driver transistors 101 (101#), 102 (102#) in write drive circuit WWD shown in FIG. 2 and the like, respectively. Accordingly, in the structure of FIG. 18, the current driving capability of driver transistor DTN1, that is, the transistor size thereof, can be reduced as compared to the structure of FIG. 17. This enables further reduction in size of the write drive circuit.

Modification of Fourth Embodiment

In the modification of the fourth embodiment, the structure of the write drive circuit suitable for a small memory array structure will be described.

Figure 19:
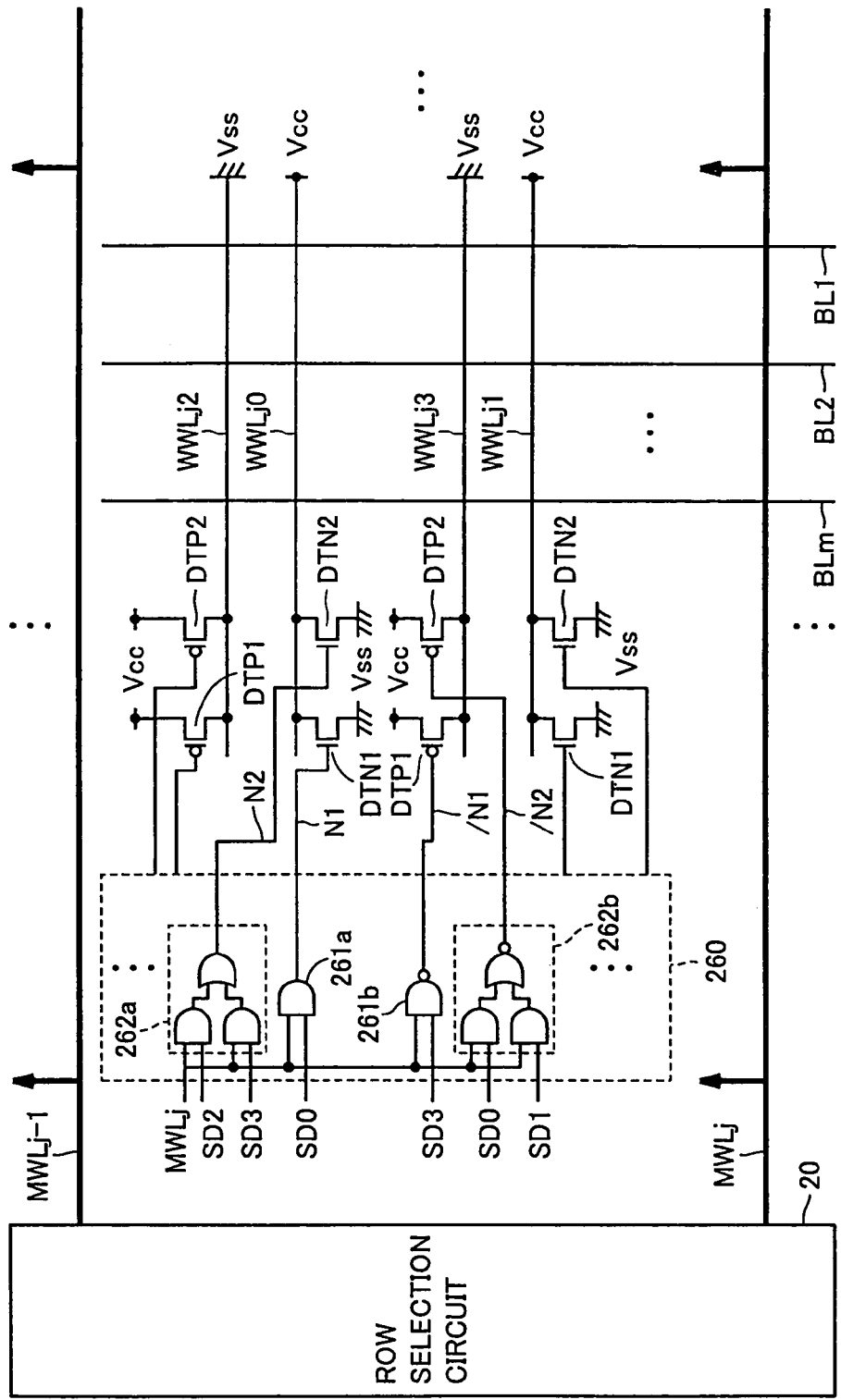
FIG. 19 is a circuit diagram showing an example of the structure of a write drive circuit according to a modification of the fourth embodiment.

FIG. 19 shows an example of the structure of a write drive circuit according to the modification of the fourth embodiment.

Referring to FIG. 19, in the modification of the fourth embodiment, either driver transistors DTN1, DTN2 or driver transistors DTP1, DTP2 are provided at one end of each write word line WWL (the end located closer to row selection circuit 20). The other end of each write word line WWL (the end located away from row selection circuit 20) is connected to either ground voltage $V_{SS}$ or power supply voltage $V_{CC}$.

For example, in even rows, one end of a write word line (e.g., WWLj0, WWLj1) is connected to ground voltage $V_{SS}$ through driver transistors DTN1, DTN2, and the other end thereof is fixedly connected to power supply voltage $V_{CC}$ regardless of the row selection result. N-channel MOS transistors are used as driver transistors DTN1, DTN2. Driver transistors DTN1, DTN2 are designed to have current driving capability corresponding to data write current $I_{WW}$ and magnetic-field canceling current $\Delta I_{WW}$, respectively.

On the other hand, in odd rows, one end of a write word line (e.g., WWLj2, WWLj3) is connected to power supply voltage $V_{CC}$ through driver transistors DTP1, DTP2, and the other end thereof is fixedly connected to ground voltage $V_{SS}$ regardless of the row selection result. P-channel MOS transistors are used as driver transistors DTP1, DTP2. Driver transistors DTP1, DTP2 are designed to have current driving capability corresponding to data write current $I_{WW}$ and magnetic-field canceling current $\Delta I_{WW}$, respectively.

Driver transistors DTN1, DTN2 have their gates connected to nodes N1, N2, respectively. Driver transistors DTP1, DTP2 have their gates connected to nodes /N1, /N2, respectively.

A selection circuit 260 controls the voltage levels of nodes N1, N2 or nodes /N1, /N2 of each memory cell row according to sub decode signals SD0 to SD3 and the voltage level of a corresponding main word line MWL.

FIG. 19 exemplary shows the circuit structure corresponding to write word lines WWLj0, WWLj3.

Selection circuit 260 includes logic gates 261a, 261b and logic circuits 262a, 262b. Logic gate 261a outputs the AND operation result of the voltage level of main word line MWLj and sub decode signal SD0 to node N1. Logic circuit 262a includes two AND gates and an OR gate. One of the AND gates outputs the AND operation result of the voltage level of main word line MWLj and sub decode signal SD2. The other AND gate outputs the AND operation result of the voltage level of main word line MWLj and sub decode signal SD3. The OR gate outputs the OR operation result of the outputs of the two AND gates to node N2.

Similarly, logic gate 261b outputs the NAND operation result of the voltage level of main word line MWLj and sub decode signal SD3 to node /N1. Logic circuit 262b includes two AND gates and a NOR gate. One of the AND gates outputs the AND operation result of the voltage level of main word line MWLj and sub decode signal SD0. The other AND gate outputs the AND operation result of the voltage level of main word line MWLj and sub decode signal SD1. The NOR gate outputs the NOR operation result of the outputs of the two AND gates to node /N2.

As a result, in each memory cell row where driver transistors DTN1, DTN2 are provided (e.g., even rows), node N1 is set to H level if a corresponding row is selected. Otherwise, node N1 is set to L level. Node N2 is set to H level if an adjacent row is selected. Otherwise, node N2 is set to L level.

On the other hand, in each memory cell row where driver transistors DTP1, DTP2 are provided (e.g., odd rows), node /N1 is set to L level if a corresponding row is selected. Otherwise, node /N1 is set to H level. Node /N2 is set to L level if a corresponding row is an adjacent row. Otherwise, node /N2 is set to H level.

Like the structure of FIG. 17, the above structure enables a data write current $I_{WW}$ to be supplied to the selected row and enables a magnetic-field canceling current $\Delta I_{WW}$ to be supplied to an adjacent row in the opposite direction to that of data write current $I_{WW}$.

The driver transistors in each memory cell row can be provided on one side of memory array 10. This eliminates the need to provide selection circuit 260 at both ends, enabling reduction in area of the circuitry associated with row selection. Especially in a small memory array structure in which it is less necessary to divide memory array 10 into a plurality of memory blocks along the column direction, the above write driver structure enables efficient arrangement of the driver transistor group.

Figure 20:
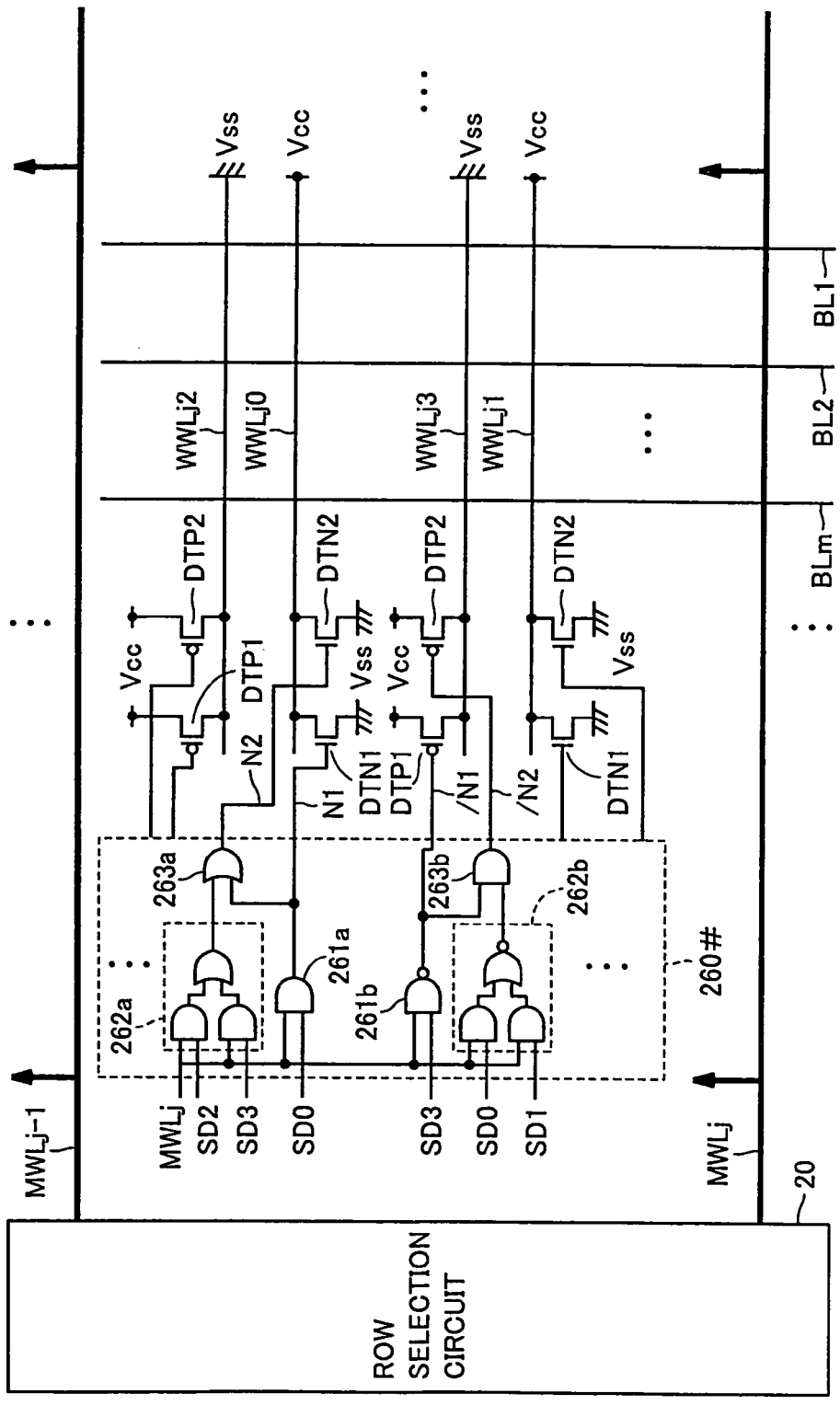
FIG. 20 is a circuit diagram showing another example of the structure of a write drive circuit according to the modification of the fourth embodiment.

FIG. 20 shows another example of the structure of the write drive circuit according to the modification of the fourth embodiment.

The write drive circuit of FIG. 20 is different from that of FIG. 19 in that the sum of currents passing through driver transistors DTN1, DTN2 or driver transistors DTP1, DTP2 is supplied as a data write current $I_{WW}$.

More specifically, in the example of FIG. 20, selection circuit 260 of FIG. 19 is replaced with a selection circuit 260#. In addition to the elements of selection circuit 260, selection circuit 260# includes a logic gate in each memory cell row. More specifically, in each memory cell row where driver transistors DTN1, DTN2 are provided, a logic gate outputs the OR operation result of the outputs of a corresponding logic gate (e.g., 261a) and a logic circuit (262a) to node N2. In each memory cell row where driver transistors DTP1, DTP2 are provided, a logic gate outputs the AND operation result of the outputs of a corresponding logic gate (e.g., 261b) and a corresponding logic circuit (e.g., 262b) to node /N2. FIG. 20 exemplary shows logic gates 263a, 263b corresponding to write word lines WWLj0, WWLj3.

In each memory cell row, node N1 is set to H level if a corresponding row is selected. On the other hand, node N2 is set to H level if a corresponding row is either a selected row or an adjacent row. Similarly, node /N1 is set to L level if a corresponding row is selected. On the other hand, node /N2 is set to L level if a corresponding row is either a selected row or an adjacent row.

Accordingly, in each memory cell row, driver transistors DTN1, DTN2 or driver transistors DTP1, DTP2 are both turned ON if a corresponding row is selected. Only driver transistor DTN2 or DTP2 is turned ON if a corresponding row is an adjacent row. Driver transistors DTN1, DTN2 or driver transistors DTP1, DTP2 are both turned OFF if a corresponding row is neither a selected row nor an adjacent row.

In other words, driver transistors DTN1, DTN2 have the same current driving capability as that of driver transistors 101 (101#), 102 (102#) in write drive circuit WWD shown in FIG. 2 and the like, respectively. The same applies to the current driving capability of driver transistors DTP1, DTP2.

Accordingly, in the structure of FIG. 20, the current driving capability of driver transistors DTN1, DTP1, that is, the transistor size thereof, can be reduced as compared to the structure of FIG. 19. This enables further reduction in size of the write drive circuit.

Fifth Embodiment

In the fifth embodiment, the uniform current path lengths as mentioned in the second embodiment and the modification thereof will be described with reference to the structure corresponding to a data write current.

Figure 21:
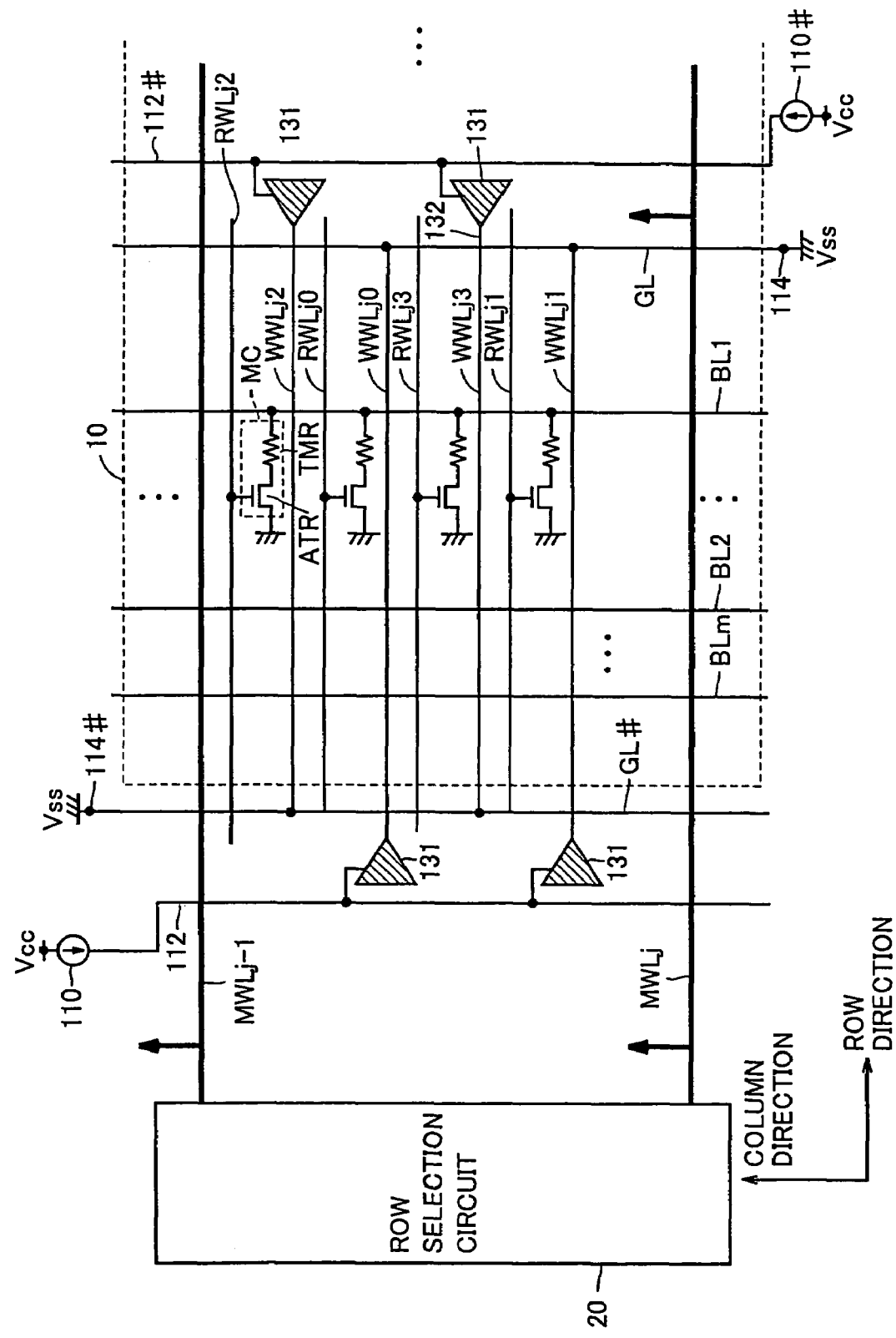
FIG. 21 is a block diagram illustrating a first example of the structure of circuitry for supplying a data write current according to a fifth embodiment of the present invention.

FIG. 21 is a block diagram illustrating a first example of the structure of circuitry for supplying a data write current according to the fifth embodiment.

Referring to FIG. 21, in the fifth embodiment as well, a write drive circuit 131 is provided alternately at one ends of write word lines WWL in every row. The other end of each write word line WWL (i.e., the end to which a corresponding write drive circuit 131 is not connected) is connected to ground node 114 or 114#. Ground lines 114, 114# supply ground voltage $V_{SS}$ through ground lines GL, GL#, respectively. In order to supply a data write current $I_{WW}$ to a write word line WWL provided in the row direction, current lines 112, 112# and ground lines GL, GL# are provided in the column direction.

A data write current $I_{WW}$ is supplied to a write drive circuit 131 of an even row by current source circuit 110 and current line 112. Data write current $I_{WW}$ which has passed through write word line WWL is guided to ground node 114 through ground line GL.

A data write current $I_{WW}$ is supplied to a write drive circuit 131 of an odd row by current source circuit 110# and current line 112#. Data write current $I_{WW}$ which has passed through write word line WWL is guided to ground node 114# through ground line GL#.

Current source circuit 110 (110#) for generating a data write current $I_{WW}$ and ground node 114 (114#) serving as a sink of a data write current $I_{WW}$ are provided in the regions located opposite to each other with memory array 10 interposed therebetween. This structure assures a constant current path length of data write current $I_{WW}$ regardless of the position of the selected memory cell row.

Moreover, current lines 112, 112# and ground lines GL, GL# are each designed to have the same electric resistance value per unit length. This enables a uniform amount of data write current $I_{WW}$ to be supplied regardless of the position of the selected memory cell row, and thus assures uniform data write characteristics in memory array 10. As a result, a write operation margin can be assured.

In FIG. 21, write drive circuit 131 is alternately provided in every row for efficient arrangement. However, write drive circuits 131 may alternatively be provided only on one side of write word lines WWL. In this case, the same effects can be obtained by providing current source circuit 110 and ground node 114 in the opposite region.

Figure 22:
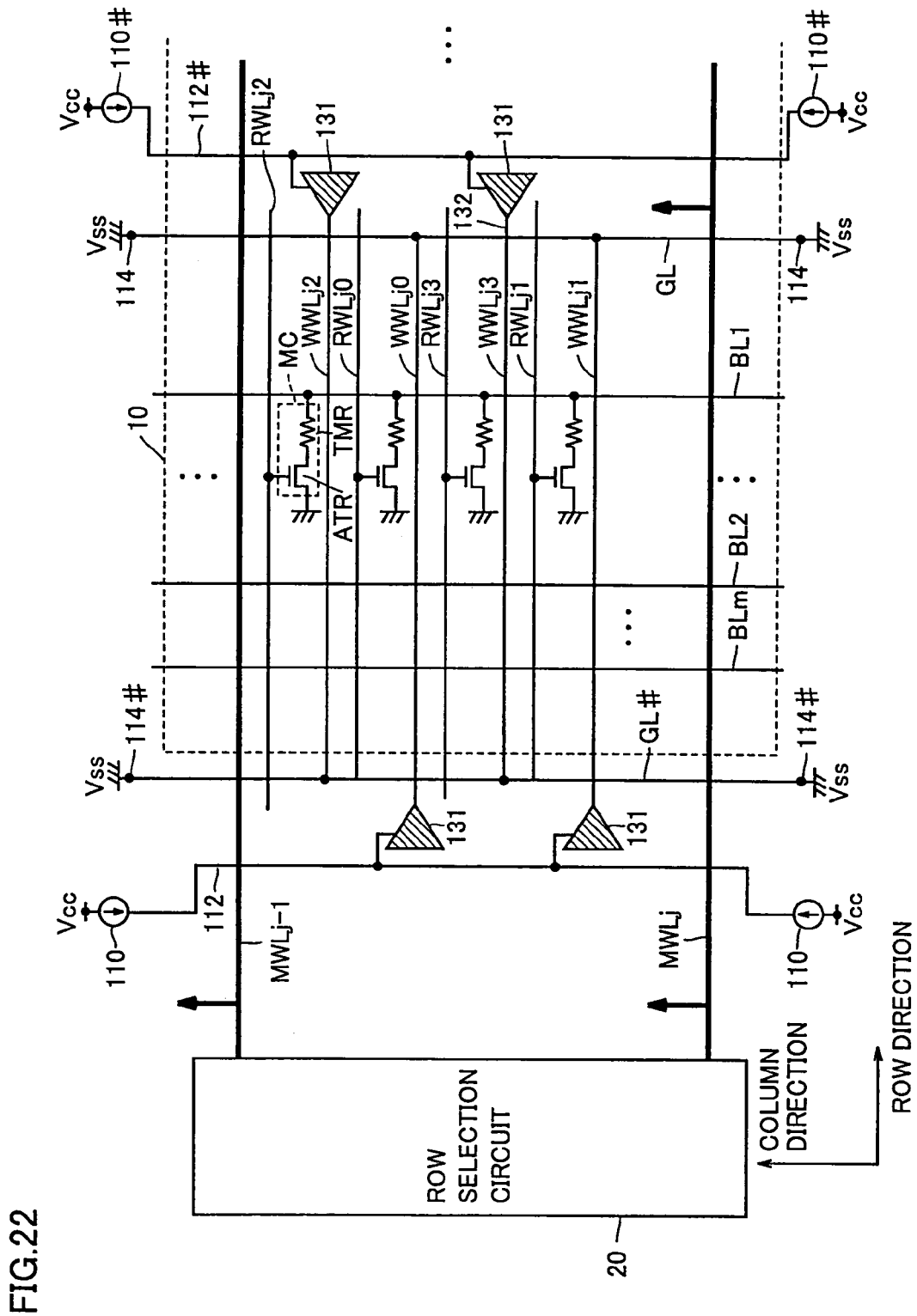
FIG. 22 is a block diagram illustrating a second example of the structure of circuitry for supplying a data write current according to the fifth embodiment.

FIG. 22 is a block diagram illustrating a second example of the structure of the circuitry for supplying a data write current according to the fifth embodiment.

The second example of FIG. 22 is different from the first example of FIG. 21 in that current source circuits 110, 110# are provided at both ends of current lines 112, 112#, respectively, and ground nodes 114, 114# are provided at both ends of ground lines GL, GL#, respectively. Since the structure of FIG. 22 is otherwise the same as that of FIG. 21, detailed description thereof will not be repeated.

With this structure, reduction in effective current path length of data write current $I_{WW}$ is achieved in addition to the effects obtained by the structure of FIG. 21. This enables further reduction in current consumption in write operation.

Modification of Fifth Embodiment

In the modification of the fifth embodiment, the structure associated with a data write current as described in the fifth embodiment is provided in a memory array divided into a plurality of banks.

Figure 23:
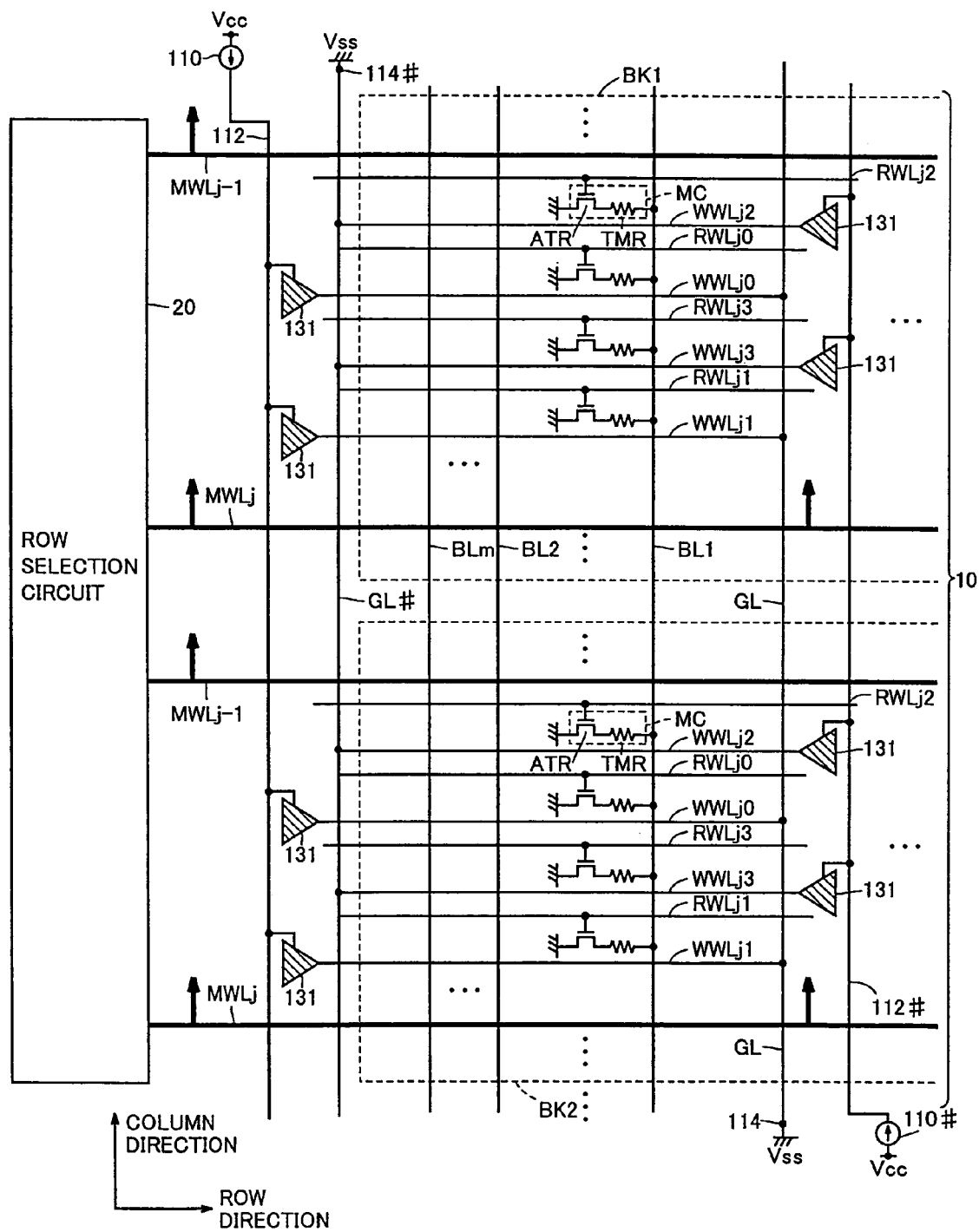
FIG. 23 is a block diagram illustrating a first example of the structure of circuitry for supplying a data write current according to a modification of the fifth embodiment.

FIG. 23 is a block diagram illustrating a first example of the structure of circuitry for supplying a data write current according to the modification of the fifth embodiment.

Referring to FIG. 23, in the modification of the fifth embodiment, memory array 10 is divided into a plurality of banks BK along the row direction as in the third embodiment. Since the structure and operation of each bank BK are the same as those described in the third embodiment, detailed description thereof will not be repeated.

In the modification of the fifth embodiment as well, the write power supply circuitry formed by current source circuits 110, 110#, current lines 112, 112#, ground lines GL, GL# and ground nodes 114, 114# is shared by a plurality of banks located adjacent to each other in the column direction. Since arrangement of the.write power supply circuitry of FIG. 23 is the same as that of FIG. 21, detailed description thereof will not be repeated.

In the structure of FIG. 23, a data write current can be supplied to a plurality of write word lines WWL by using the common write power supply circuitry. Accordingly, a data write current can be efficiently supplied to a plurality of banks while obtaining the same effects as those of the structure of FIG. 21.

Figure 24:
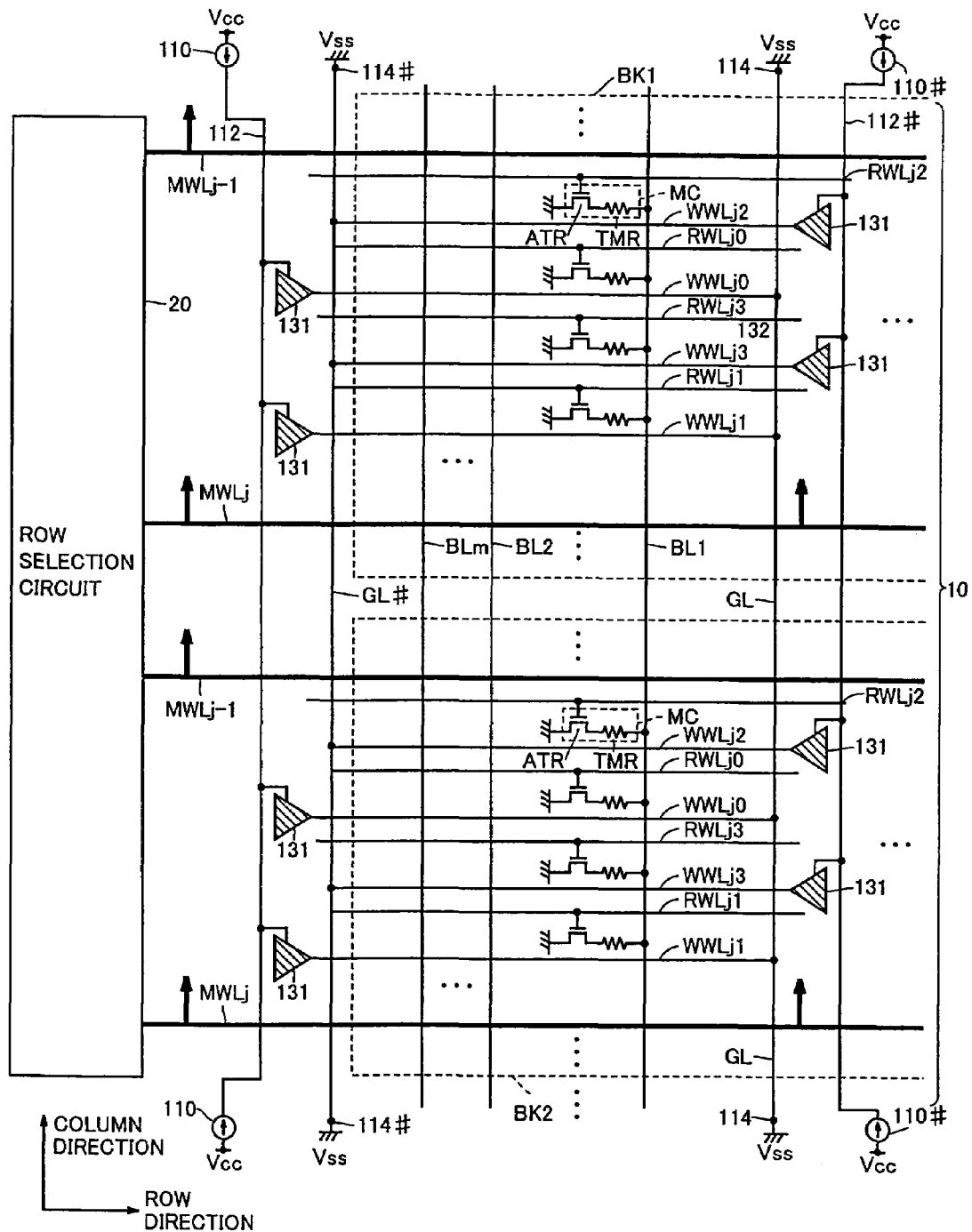
FIG. 24 is a block diagram illustrating a second example of the structure of circuitry for supplying a data write current according to the modification of the fifth embodiment.

FIG. 24 is a block diagram illustrating a second example of the structure of the circuitry for supplying a data write current according to the modification of the fifth embodiment.

Referring to FIG. 24, the second example of the modification of the fifth embodiment is different from the first example of FIG. 23 in arrangement of the write power supply circuitry. In other words, the write power supply circuitry is provided in the same manner as that of FIG. 22, and is shared by a plurality of banks located adjacent to each other in the column direction. Since the structure of the second example is otherwise the same as that of FIG. 23, detailed description thereof will not be repeated.

Accordingly, in the structure of FIG. 24, a data write current can be efficiently supplied to a plurality of banks while obtaining the same effects as those of the structure of FIG. 22.

As has been described above, the modification of the fifth embodiment assures uniform data write characteristics in memory array 10 by using the write power supply circuitry shared by a plurality of banks to which data can be simultaneously written. As a result, a write operation margin can be assured.

The structure for allowing a data write current supplied to write word lines WWL to have a uniform current path length is described in the fifth embodiment and the modification thereof. The same structure is applicable also to a current path of a data write current supplied to bit lines BL.

In this case, bit-line drive circuits BDVa, BDVb of FIG. 2 are provided at both ends of each bit line BL provided in the row direction. Current lines 112, 112# and ground lines GL, GL# in the structures of FIGS. 21 to 24 are provided in the row direction in order to guide a data write current to bit-line drive circuits BDVa, BDVb. Moreover, current source circuits 110, 110# and ground nodes 114, 14# are provided at the ends of current lines 112, 112# and ground lines GL, GL# in the same manner as that of FIGS. 21 to 24. As a result, a uniform amount of data write current can be supplied regardless of the position of the selected memory cell column.

In the first and fifth embodiments and the modifications thereof, current supply to write word lines WWL is controlled by the hierarchical structure of write word lines WWL and main word lines MWL. However, the present invention is not limited to such a structure. In other words, each write drive circuit may be controlled according to a row decode signal provided corresponding to each memory cell row rather than being controlled by a main word line and a sub decode signal. In this case as well, the same effects can be obtained by modifying the structure of the decode circuit so that the write drive circuits (driver transistors) of each row and adjacent rows are controlled in the same manner as that of the above examples.

Sixth Embodiment

In the sixth embodiment, the structure for preventing erroneous writing from being caused by magnetic noises from wirings provided outside memory array 10 (hereinafter, sometimes referred to as "peripheral wirings") will be described.

Figure 25:
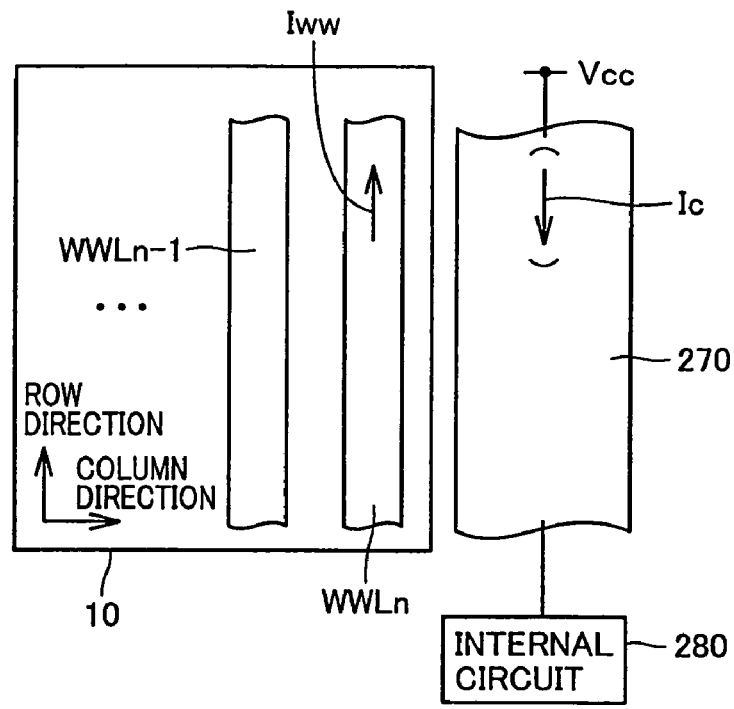
FIG. 25 is a first block diagram illustrating arrangement of peripheral wirings according to a sixth embodiment of the present invention.

FIG. 25 is a block diagram illustrating arrangement of the peripheral wirings according to the sixth embodiment.

Referring to FIG. 25, a peripheral wiring 270 is a wiring provided in the peripheral region of memory array 10 and located closest to the endmost write word line WWLn. As described before, a data write current $I_{WW}$ of a fixed direction is supplied to write word line WWLn (i.e., wiring for generating a write magnetic field along the hard-axis direction) in response to selection of a corresponding memory cell row.

Peripheral wiring 270 is provided in order to supply power supply voltage $V_{CC}$ to an internal circuit 280. An operating current $I_C$ of internal circuit 280 is supplied to peripheral wiring 270. Peripheral wiring 270 is selected so as to satisfy at least one of the following two conditions: (1) operating current $I_C$ does not flow through peripheral wiring 270 while data write current $I_{WW}$ is supplied, that is, a period of supplying data write current $I_{WW}$ does not overlap a period of supplying operating current $I_C$; and (2) if the period of supplying data write current $I_{WW}$ overlaps a period of supplying operating current $I_C$, operating current $I_C$ and data write current $I_{WW}$ are supplied in the opposite directions.

In order to satisfy the condition (1), a power supply line for internal circuit 280 associated with read operation (i.e., internal circuit 280 which operates in read operation) can be provided near memory array 10 as peripheral wiring 270.

Figure 26:
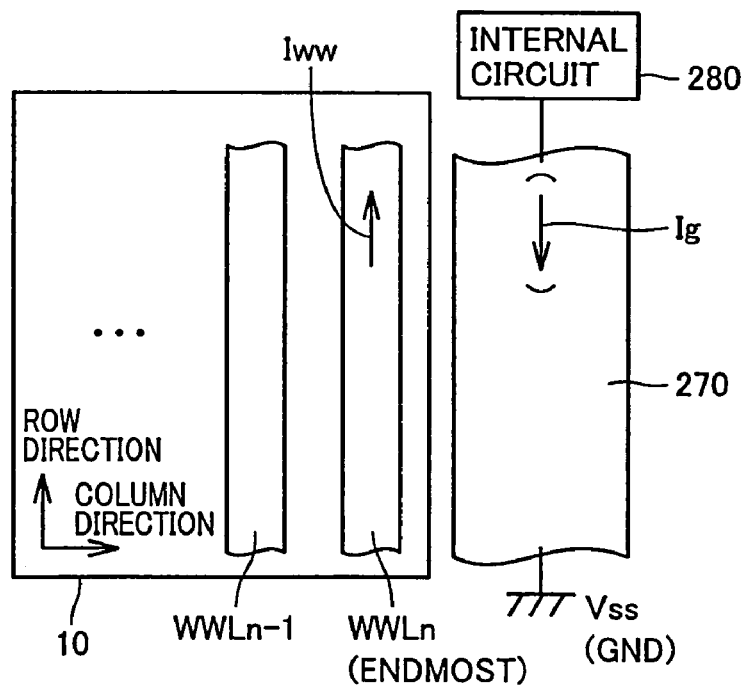
FIG. 26 is a second block diagram illustrating arrangement of peripheral wirings according to the sixth embodiment.

Alternatively, as shown in FIG. 26, a ground line for supplying ground voltage $V_{SS}$ (GND) to internal circuit 280 may be provided as peripheral wiring 270 located closest to the endmost write word line WWLn. In this case, a current Ig is supplied to peripheral wiring 270 during operation of internal circuit 280.

With this structure, magnetic noises will not be applied from peripheral wiring 270 to memory array 10 in write operation.

Figure 27:
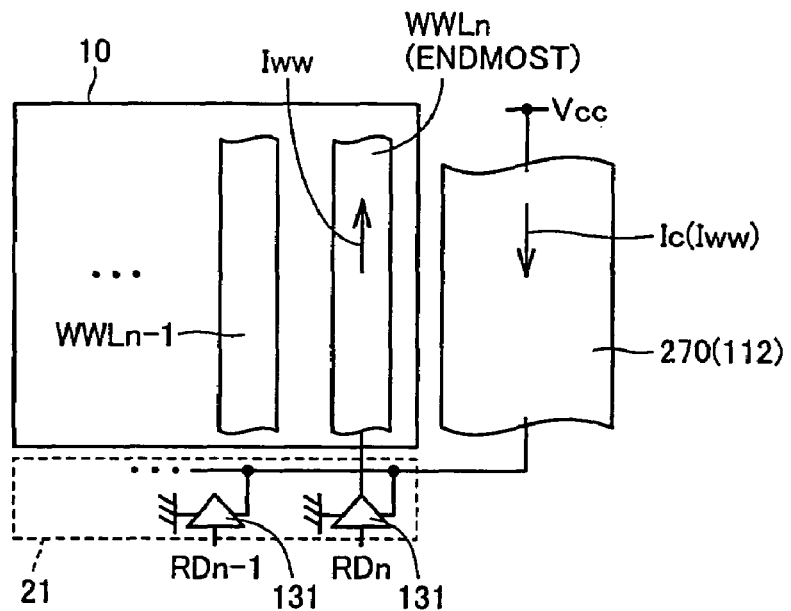
FIG. 27 is a third block diagram illustrating arrangement of peripheral wirings according to the sixth embodiment.

As shown in FIG. 27, peripheral wiring 270 may be used as current line 112 shown in FIG. 7 and the like. In this case, a current $I_C$ flowing through peripheral wiring 270 (current line 112) is equal to a data write current $I_{WW}$ supplied to write word line WWL through write drive circuit 131 provided in a write driver band 21.

Accordingly, in the case where current line 112 is provided as peripheral wiring 270 in the same direction as that of write word line WWL and both ends of current line 112 are respectively connected to power supply voltage $V_{CC}$ and write drive circuits 131, a current having the same strength can be supplied to peripheral wiring 270 (current line 112) and write word line WWLn in the opposite directions.

In this case, a magnetic field generated by data write current $I_{WW}$ flowing through write word line WWLn and a magnetic field generated by operating current $I_C$ flowing through current line 112 (peripheral wiring 270) affect each other in a destructive manner. This reduces the possibility of erroneous writing to the non-selected memory cells of the write word lines other than write word line WWLn due to magnetic noises from peripheral wiring 270.

As has been described above, the conditions of peripheral wiring 270 can be implemented by changing an element to which peripheral wiring 270 is connected (internal circuit 280) and the positional relation between peripheral wiring 270 and the element to which peripheral wiring 270 is connected.

This structure reduces the possibility of erroneous writing in memory array 10 due to magnetic noises from a current flowing through peripheral wiring 270 located adjacent to the endmost write word line WWLn.

The same peripheral wiring can be applied to a peripheral wiring provided in a region above or below memory array 10.

Figure 28:
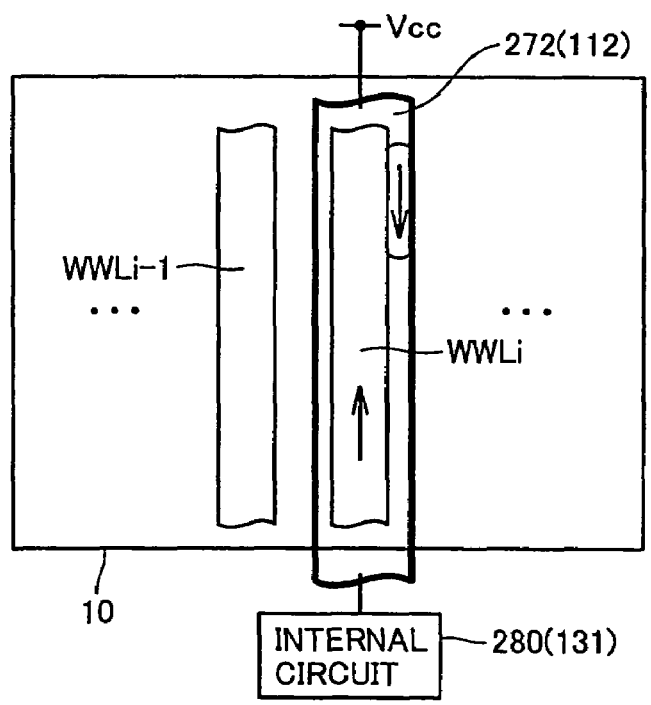
FIG. 28 is a fourth block diagram illustrating arrangement of peripheral wirings according to the sixth embodiment.
Figure 29:
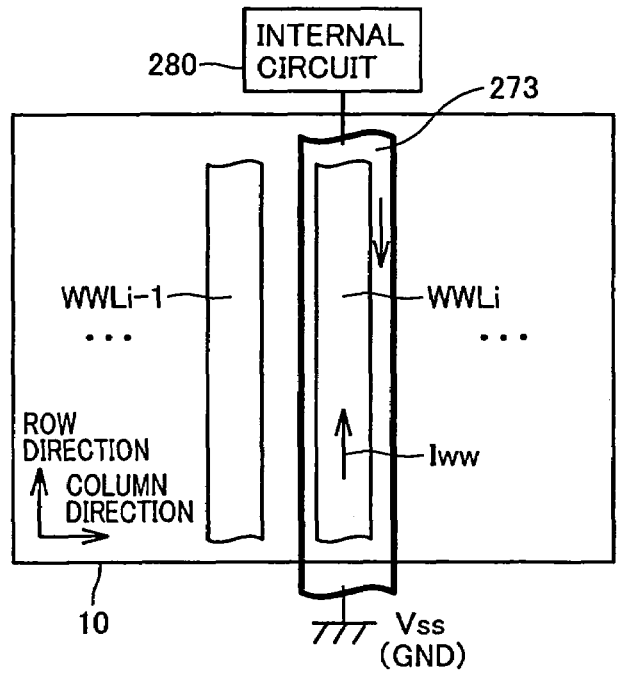
FIG. 29 is a fifth block diagram illustrating arrangement of peripheral wirings according to the sixth embodiment.

FIGS. 28 and 29 respectively show peripheral wirings 272, 273 located closest to write word line WWLi in the region above or below memory array 10 (where i is a natural number). Peripheral wiring 272 of FIG. 28 supplies power supply voltage $V_{CC}$ to internal circuit 280. Peripheral wiring 273 of FIG. 29 supplies ground voltage $V_{SS}$ to internal circuit 280.

In these structures, the same effects as those obtained by peripheral wiring 270 of FIGS. 25 to 27 can be obtained by selecting as internal circuit 280 a circuit which does not operate in write operation or a write drive circuit 131 for supplying a data write current to write word line WWLi, as described above.

Modification of Sixth Embodiment

In the modification of the sixth embodiment, arrangement of peripheral wirings will be described. In the modification of the sixth embodiment, a peripheral wiring is located near bit line BL to which a current of a different direction is supplied according to the write data level.

Figure 30:
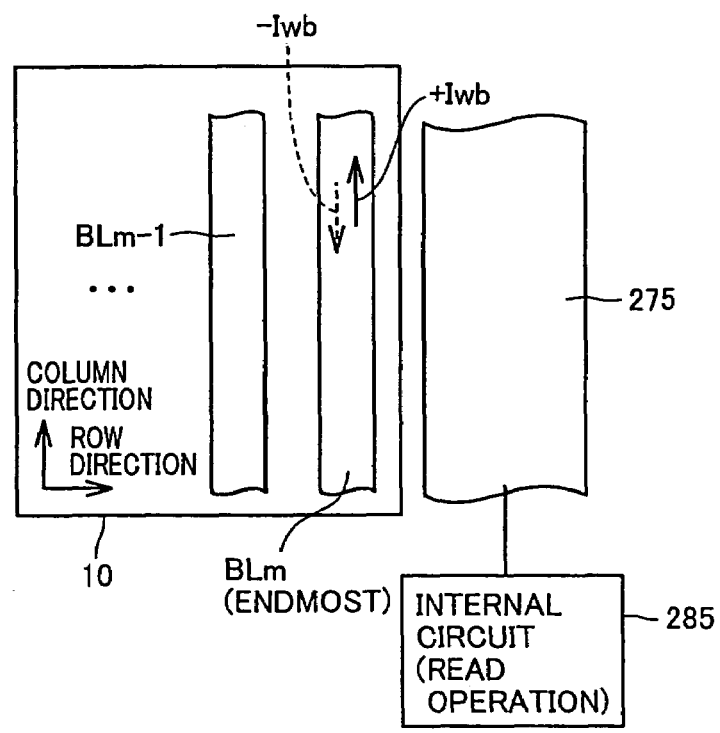
FIG. 30 is a first block diagram illustrating arrangement of peripheral wirings according to a modification of the sixth embodiment.

FIG. 30 is a first block diagram showing an example of arrangement of peripheral wirings according to the modification of the sixth embodiment.

Referring to FIG. 30, a peripheral wiring 275 is a wiring provided in the peripheral region of memory array 10 and located closest to the endmost bit line BLm. As described before, in response to selection of a corresponding memory cell column, either a data write current +Iwb or −Iwb is supplied to bit line BLm (i.e., wiring for generating a data write magnetic field along the easy-axis direction) according to the write data level.

Peripheral wiring 275 is provided so-as to satisfy one of the conditions (1) and (2) for peripheral wiring 270 described in FIG. 25.

As shown in FIG. 30, by using a circuit associated with read operation (i.e., a circuit which does not operate in write operation) as an internal circuit 285, magnetic noises from peripheral wiring 275 located closest to memory array 10 can be prevented from being applied to memory array 10 in write operation.

Alternatively, a current line for supplying an operating current to bit-line drive circuits BDVa, BDVb of FIG. 2 may be used as a peripheral wiring located closest to the endmost bit line BLm.

Figure 31:
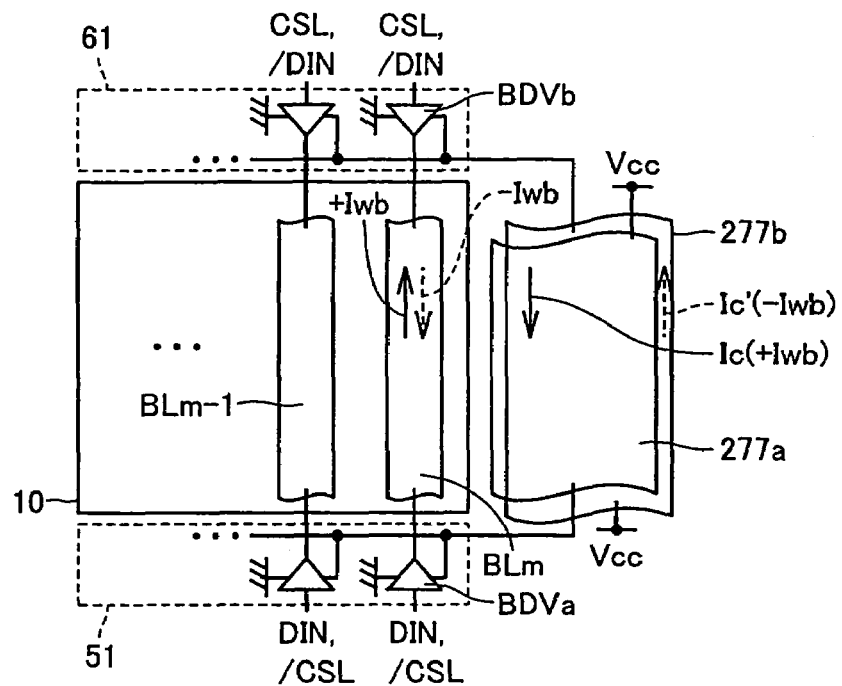
FIG. 31 is a second block diagram illustrating arrangement of peripheral wirings according to the modification of the sixth embodiment.

Referring to FIG. 31, bit-line drive circuits BDVa, BDVb are provided at both ends of each bit line in the manner described m FIG. 2. In the peripheral region of memory array 10, current lines 277a, 277b are provided as peripheral wirings located closest to the endmost bit line BLm. Current lines 277a, 277b are provided in the same direction as that of bit lines BL. One end of current line 277a is connected to power supply voltage V$_{CC}$, and the other end thereof is connected to each bit-line drive circuit BDVa. Similarly, one end of current line 277b is connected to power supply voltage V$_{CC}$, and the other end thereof is connected to each bit-line drive circuit BDVb.

As a result, data write currents +Iwb, −Iwb are supplied to current lines 277a, 277b and the bit line of the selected column in a folded manner by bit-line drive circuits BDVa, BDVb. For example, if data write current +Iwb is supplied to the endmost bit line BLm, operating current I$_C$ is supplied to current line 277a in the opposite direction. If data write current −Iwb is supplied to the endmost bit line BLm, operating current I$_C$' is supplied to current line 277b in the opposite direction.

The above structure enables a current passing through the endmost bit line BLm and a current passing through the peripheral wiring located closest to the endmost bit line BLm to have opposite directions in the peripheral region of memory array 10. As a result, the above condition (2) is satisfied. Accordingly, adverse effects of magnetic noises applied from a peripheral wiring to memory array 10 can be suppressed in write operation.

Regarding the peripheral wirings provided in the same direction as that of bit lines BL, the same layout rules as those of FIGS. 30 and 31 can be applied to the peripheral wirings provided in a region above or below memory array 10.

Figure 32:
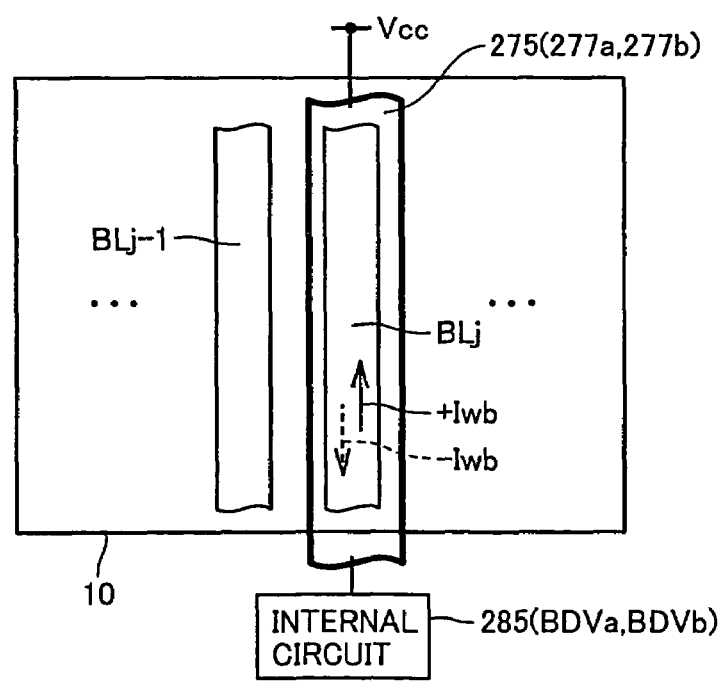
FIG. 32 is a third block diagram illustrating arrangement of peripheral wirings according to the modification of the sixth embodiment.
Figure 33:
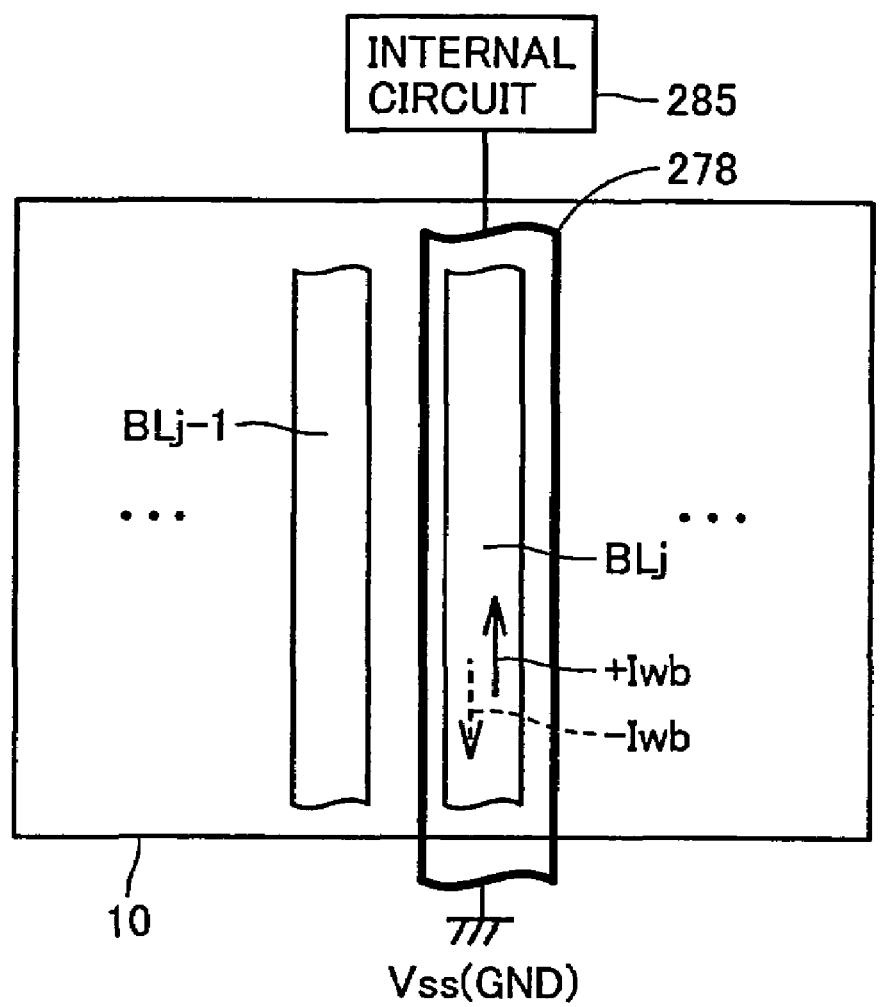
FIG. 33 is a fourth block diagram illustrating arrangement of peripheral wirings according to the modification of the sixth embodiment.
Figure 34:
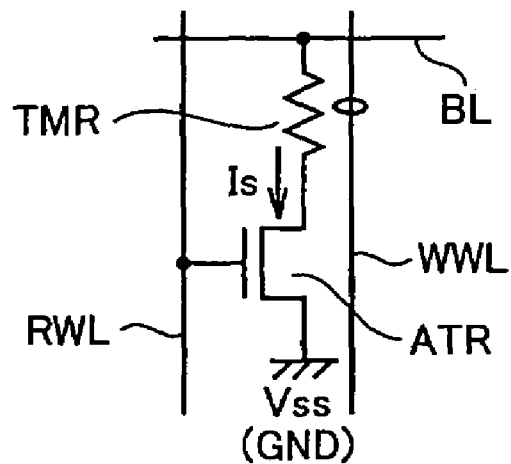
FIG. 34 schematically shows the structure of an MTJ memory cell.
Figure 35:
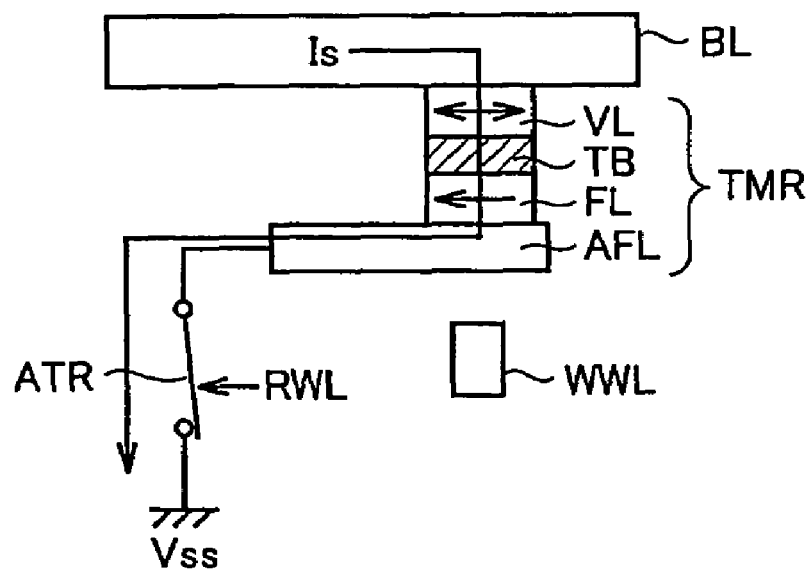
FIG. 35 is a conceptual diagram illustrating read operation from an MTJ memory cell.
Figure 36:
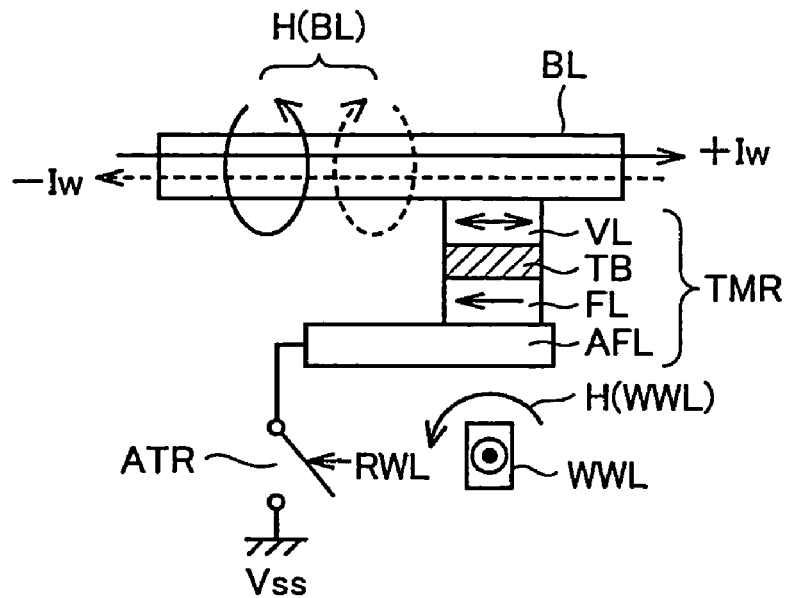
FIG. 36 is a conceptual diagram illustrating write operation to an MTJ memory cell.

FIGS. 32 and 33 respectively show peripheral wirings 275, 278 located closest to a bit line BLj in a region above or below memory array 10 (where j is a natural number). Peripheral wiring 275 of FIG. 32 supplies power supply voltage V$_{CC}$ to internal circuit 285, and peripheral wiring 278 of FIG. 33 supplies ground voltage to internal circuit 285.

In these structures, the same effects as those obtained by the peripheral wirings of FIGS. 30, 31 can be obtained by providing as internal circuit 280 a circuit which does not operate in write operation or bit-line drive circuits BDVa, BDVb, as described above.

Although the present invention has been described and illustrated in detail, it is dearly understood that the same is by way of illustration and example only and is not to be taken by way of limitation, the sprit and scope of the present invention being limited only by the terms of the appended claims.

What is claimed is:

1. A thin film magnetic memory device, comprising:
   a memory array having a plurality of magnetic memory cells arranged in a matrix, each of said magnetic memory cells having a magnetic element which is magnetized in a direction corresponding storage data;
   a plurality of write current lines for selectively receiving a data write current in order to selectively apply a data write magnetic field to at least one of said plurality of memory cells;
   a plurality of write drive circuits provided corresponding to said plurality of write current lines, each for supplying a data write current to corresponding one of said write current lines according to an address selection result;
   a power supply line provided in a direction crossing said plurality of write current lines, for transmitting said data write current supplied from a current supply circuit to said plurality of write drive circuits; and
   a ground line provided in a direction crossing said plurality of write current lines, for guiding said data write current which has passed through at least one of said plurality of write current lines to a ground node, wherein
   each of said power supply line and said ground line has a same wiring resistance per unit length, and
   said power supply line, said ground line, said current supply circuit, and said ground node are arranged so that said data write current on said power supply line, the write current line corresponding to a selected memory cell of said plurality of memory cells and said ground line has an approximately uniform current path length regardless of said address selection result.

2. The thin film magnetic memory device according to claim 1, wherein said current supply circuit is provided corresponding to each end of said power supply line, and said ground node is provided corresponding to each end of said ground lines.

3. The thin film magnetic memory device according to claim 1, wherein
   said memory array is divided into a plurality of banks having different said write current lines,
   write operation to at least two of said plurality of banks can be conducted in parallel, and
   said power supply line and said ground line are shared by said plurality of banks.

4. A thin film magnetic memory device, comprising:
   a memory array having a plurality of magnetic memory cells arranged in a matrix, each of said magnetic memory cells having a magnetic element which is magnetized in a direction corresponding storage data;
a plurality of write selection lines provided corresponding to memory cell rows, a data write current being supplied to a write selection line corresponding to a selected row of said memory cell rows;
a plurality of data lines provided corresponding to memory cell columns, a current being supplied to the data line corresponding to a selected column of said memory cell columns in a direction corresponding to write data; and
a plurality of write drive circuits provided corresponding to said plurality of write selection lines, and provided alternately at one ends of said plurality of write selection lines in every row, wherein
each of said write drive circuits includes a plurality of N-type field effect transistors connected between said one end of corresponding one of said write selection lines and a first voltage, and turned ON or OFF according to a row selection result,
the other ends of said plurality of write selection lines are connected to a second voltage different from said first voltage,
in the write drive circuit corresponding to said selected row, at least one of said plurality of N-type field effect transistors is turned ON so that a sum of current driving capabilities of said at least one N-type field effect transistor corresponds to said data write current, and
in the write drive circuit corresponding to an adjacent row of said selected row, at least a part of said plurality of N-type field effect transistors is turned ON so that a sum of current driving capabilities of said at least a part of N-type field effect transistor is less than said data write current.

5. The thin film magnetic memory device according to claim 4, wherein
said plurality of N-type field effect transistors includes
a first N-type transistor which is turned ON if corresponding one of said memory cell rows is said selected row, and
a second N-type transistor which is turned ON if said corresponding one of said memory cell rows is said adjacent row, and
current driving capability of said first N-type transistor corresponds to said data write current.

6. The thin film magnetic memory device according to claim 4, wherein
said plurality of N-type field effect transistors includes
a first N-type transistor which is turned ON if corresponding one of said memory cell rows is said selected row, and
a second N-type transistor which is turned ON if said corresponding one of said memory cell rows is said selected row or said adjacent row, and
a sum of current driving capabilities of said first and second N-type transistors corresponds to said data write current.

7. A thin film magnetic memory, comprising:
a memory array having a plurality of magnetic memory cells arranged in a matrix, each of said magnetic memory cells having a magnetic element which is magnetized in a direction corresponding storage data;
a plurality of write selection lines provided corresponding to memory cell rows, a data write current being supplied to the write selection line corresponding to a selected row of said memory cell rows;
a plurality of data lines provided corresponding to memory cell columns, a current being supplied to a data line corresponding to a selected column of said memory cell columns in a direction corresponding to write data; and
a plurality of write drive circuits respectively provided at one ends of said plurality of write selection lines, wherein
the other ends of said plurality of write selection lines are alternately connected to first and second voltages in every row,
each of said write drive circuits whose corresponding write selection lines are connected to said first voltage includes a plurality of P-type field effect transistors connected between said one end of the corresponding write selection line and said second voltage and turned ON or OFF according to a row selection result,
each of said write drive circuits whose corresponding write selection lines are connected to said second voltage includes a plurality of N-type field effect transistors connected between said one end of the corresponding write selection line and said first voltage and turned ON or OFF according to said row selection result,
in the write drive circuit corresponding to said selected row, at least one of said plurality of N-type field effect transistors or at least one of said plurality of P-type field effect transistors is turned ON so that a sum of current driving capabilities of said at least one N-type field effect transistor or said at least one P-type field effect transistor corresponds to said data write current, and
in the write drive circuit corresponding to an adjacent row of said selected row, at least a part of said plurality of N-type field effect transistors or at least a part of said plurality of P-type field effect transistors is turned ON so that a sum of current driving capabilities of said at least a part of N-type field effect transistor or said at least a part of P-type field effect transistor is less than said data write current.

8. The thin film magnetic memory device according to claim 7, wherein
said plurality of N-type field effect transistors includes
a first N-type transistor which is turned ON if corresponding one of said memory cell rows is said selected row, and
a second N-type transistor which is turned ON if said corresponding one of said memory cell rows is said adjacent row,
said plurality of P-type field effect transistors includes
a first P-type transistor which is turned ON if corresponding one of said memory cell rows is said selected row, and
a second P-type transistor which is turned ON if said corresponding one of said memory cell rows is said adjacent row, and
current driving capability of each of said first N-type transistor and said first P-type transistor corresponds to said data write current.

9. The thin film magnetic memory device according to claim 7, wherein
said plurality of N-type field effect transistors includes
a first N-type transistor which is turned ON if corresponding one of said memory cell rows is said selected row, and
a second N-type transistor which is turned ON if said corresponding one of said memory cell rows is said selected row or said adjacent row, said plurality of P-tape field effect transistors includes
a first P-type transistor which is turned ON if corresponding one of said memory cell rows is said selected row, and
a second P-type transistor which is turned ON if said corresponding one of said memory cell rows is said selected row or said adjacent row, and
each of a sum of current driving capabilities of said first and second N-type transistors and a sum of current driving capabilities of said first and second P-type transistors corresponds to said data write current.

10. A thin film magnetic memory device, comprising:
a memory array having a plurality of magnetic memory cells arranged in a matrix, each of said magnetic memory cells having a magnetic element which is magnetized in a direction corresponding storage data;
a plurality of write current lines for selectively receiving a data write current in order to selectively apply a data write magnetic field to at least one of said plurality of memory cells; and
a peripheral wiring provided outside said memory array in a same direction as that of said plurality of write current lines, wherein
a current flowing through said peripheral wiring and a current flowing through one of said plurality of write current lines, which is located closest to said peripheral wiring have opposite directions.

11. The thin film magnetic memory device according to claim 10, further comprising:
a plurality of write current drive circuits provided corresponding to said plurality of write current lines, wherein
said peripheral wiring is connected to that one of said plurality of write current drive circuits which corresponds to the closest write current line, for allowing said data write current to pass therethrough.

12. The thin film magnetic memory device according to claim 10, wherein said plurality of write current lines receive said data write current of a prescribed direction and apply the magnetic field along a hard axis to said at least one of said plurality of memory cells.

13. The thin film magnetic memory device according to claim 10, wherein said plurality of write current lines receive said data write current of a direction corresponding to write data and apply the magnetic field along an easy axis to said at least one of said plurality of memory cells.

14. The thin film magnetic memory device according to claim 10, wherein said peripheral wiring is provided in a peripheral region of said memory array.

15. The thin film magnetic memory device according to claim 10, wherein said peripheral wiring is provided in a region above or below said memory array.

16. A thin film magnetic memory device, comprising:
a memory array having a plurality of magnetic memory cells arranged in a matrix, each of said magnetic memory cells having a magnetic element which is magnetized in a direction corresponding storage data;
a plurality of write current lines for selectively receiving a data write current in order to selectively apply a data write magnetic field to at least one of said plurality of memory cells; and
a peripheral wiring provided outside said memory array in a same direction as that of said plurality of write current lines, wherein
an element to which said peripheral wiring is connected is determined so that a period of supplying said data write current does not overlap a period of supplying a current on said peripheral wiring.

17. The thin film magnetic memory device according to claim 16, wherein said plurality of write current lines receive said data write current of a prescribed direction and apply the magnetic field along a hard axis to said at least one of said plurality of memory cells.

18. The thin film magnetic memory device according to claim 16, wherein said plurality of write current lines receive said data write current of a direction corresponding to write data and apply the magnetic field along an easy axis to said at least one of said plurality of memory cells.

19. The thin film magnetic memory device according to claim 16, wherein said peripheral wiring is provided in a peripheral region of said memory array.

20. The thin film magnetic memory device according to claim 16, wherein said peripheral wiring is provided in a region above or below said memory array.

* * * * *